(12) United States Patent
Agata et al.

(10) Patent No.: US 11,342,186 B2
(45) Date of Patent: May 24, 2022

(54) SEMICONDUCTOR DEVICE AND MANUFACTURING METHOD THEREOF

(71) Applicant: FUJI ELECTRIC CO., LTD., Kanagawa (JP)

(72) Inventors: Yasunori Agata, Matsumoto (JP); Takashi Yoshimura, Matsumoto (JP); Hiroshi Takishita, Matsumoto (JP); Misaki Meguro, Matsumoto (JP); Naoko Kodama, Matsumoto (JP); Yoshihiro Ikura, Matsumoto (JP); Seiji Noguchi, Matsumoto (JP); Yuichi Harada, Matsumoto (JP); Yosuke Sakurai, Azumino (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 17/033,925

(22) Filed: Sep. 28, 2020

(65) Prior Publication Data
US 2021/0082702 A1 Mar. 18, 2021

Related U.S. Application Data

(63) Continuation of application No. PCT/JP2019/040241, filed on Oct. 11, 2019.

(30) Foreign Application Priority Data

Oct. 18, 2018 (JP) .............................. JP2018-196766
Dec. 28, 2018 (JP) .............................. JP2018-248523
Sep. 2, 2019 (JP) .............................. JP2019-159499

(51) Int. Cl.
*H01L 29/10* (2006.01)
*H01L 29/66* (2006.01)
(Continued)

(52) U.S. Cl.
CPC .......... *H01L 21/221* (2013.01); *H01L 21/268* (2013.01); *H01L 21/26526* (2013.01);
(Continued)

(58) Field of Classification Search
CPC ............... H01L 21/268; H01L 27/0664; H01L 29/0623; H01L 29/1095; H01L 29/32;
(Continued)

(56) References Cited

U.S. PATENT DOCUMENTS 6,482,681 B1 11/2002 Francis
10,043,865 B2 8/2018 Nemoto
(Continued)

FOREIGN PATENT DOCUMENTS

JP 2007266233 A 10/2007
JP 2010028109 A 2/2010
(Continued)

OTHER PUBLICATIONS

International Search Report and (ISA/237) Written Opinion of the International Search Authority for International Patent Application No. PCT/JP2019/040241, mailed by the Japan Patent Office dated Nov. 26, 2019.

(Continued)

*Primary Examiner* — David Vu

(57) ABSTRACT

A semiconductor device wherein a hydrogen concentration distribution has a first hydrogen concentration peak and a second hydrogen concentration peak and a donor concentration distribution has a first donor concentration peak and a second donor concentration peak in a depth direction, wherein the first hydrogen concentration peak and the first donor concentration peak are placed at a first depth and the second hydrogen concentration peak and the second donor concentration peak are placed at a second depth deeper than the first depth relative to the lower surface is provided.

26 Claims, 43 Drawing Sheets

(51) Int. Cl.

| | |
|---|---|
| *H01L 29/739* | (2006.01) |
| *H01L 29/06* | (2006.01) |
| *H01L 21/22* | (2006.01) |
| *H01L 21/265* | (2006.01) |
| *H01L 21/268* | (2006.01) |
| *H01L 27/06* | (2006.01) |
| *H01L 29/32* | (2006.01) |
| *H01L 29/40* | (2006.01) |
| *H01L 29/861* | (2006.01) |

(52) U.S. Cl.
CPC ...... *H01L 27/0664* (2013.01); *H01L 29/0623* (2013.01); *H01L 29/1095* (2013.01); *H01L 29/32* (2013.01); *H01L 29/404* (2013.01); *H01L 29/66348* (2013.01); *H01L 29/7397* (2013.01); *H01L 29/8613* (2013.01)

(58) Field of Classification Search
CPC ............. H01L 29/404; H01L 29/66348; H01L 29/7397; H01L 29/8613; H01L 29/36; H01L 29/407; H01L 29/0619; H01L 29/0638; H01L 29/0834; H01L 29/0696; H01L 21/26506
See application file for complete search history.

(56) References Cited

U.S. PATENT DOCUMENTS

| | | | |
|---|---|---|---|
| 10,468,254 B2 | 11/2019 | Takishita | |
| 10,629,441 B2 | 4/2020 | Kodama | |
| 2007/0231973 A1 | 10/2007 | Ruething | |
| 2009/0310265 A1 | 12/2009 | Fukuoka | |
| 2013/0075783 A1* | 3/2013 | Yamazaki | ............... H01L 29/36 257/139 |
| 2013/0249058 A1 | 9/2013 | Neidhart | |
| 2015/0050754 A1 | 2/2015 | Ploss | |
| 2015/0214347 A1 | 7/2015 | Falck | |
| 2015/0270130 A1 | 9/2015 | Schulze | |
| 2015/0270132 A1 | 9/2015 | Laven | |
| 2015/0311279 A1 | 10/2015 | Onozawa | |
| 2015/0357229 A1 | 12/2015 | Schulze | |
| 2015/0371858 A1 | 12/2015 | Laven | |
| 2016/0141399 A1 | 5/2016 | Jelinek | |
| 2016/0172438 A1 | 6/2016 | Jelinek | |
| 2016/0311202 A1 | 10/2016 | Aoki | |
| 2017/0271447 A1 | 9/2017 | Tamura | |
| 2018/0005831 A1 | 1/2018 | Schulze | |
| 2018/0012762 A1 | 1/2018 | Mukai | |
| 2018/0122895 A1 | 5/2018 | Jelinek | |
| 2019/0027561 A1 | 1/2019 | Ohi | |
| 2019/0165151 A1 | 5/2019 | Spulber | |

FOREIGN PATENT DOCUMENTS

| | | |
|---|---|---|
| JP | 2013074181 A | 4/2013 |
| JP | 2014107278 A | 6/2014 |
| JP | 2016204227 A | 12/2016 |
| WO | 2011052787 A1 | 5/2011 |
| WO | 2014208404 A1 | 12/2014 |
| WO | 2016204227 A1 | 12/2016 |
| WO | 2017047276 A1 | 3/2017 |
| WO | 2017047285 A1 | 3/2017 |
| WO | 2018074434 A1 | 4/2018 |
| WO | 2018105299 A1 | 6/2018 |

OTHER PUBLICATIONS

J. G. Laven, et al., "Activation and Dissociation of Proton-Induced Donor Profiles in Silicon", ECS Journal of Solid State Science and Technology, 2 (9), P389-P394 (2013).

* cited by examiner

SEMICONDUCTOR DEVICE AND MANUFACTURING METHOD THEREOF

The contents of the following Japanese patent applications are incorporated herein by reference:
NO. 2018-196766 filed in JP on Oct. 18, 2018,
NO. 2018-248523 filed in JP on Dec. 28, 2018,
NO. 2019-159499 filed in JP on Sep. 2, 2019, and
NO. PCT/JP2019/040241 filed on Oct. 11, 2019

BACKGROUND

1. Technical Field

The present invention relates to a semiconductor device and a manufacturing method thereof.

2. Related Art

Conventionally, it is known that implanting and diffusing hydrogen into a semiconductor substrate causes crystal defects present in a diffusion region and the hydrogen to be bonded to be a donor (for example, see Patent document 1).
Patent document 1: JP 2016-204227
Preferably, a range of a donor region and its donor concentration caused by bonding of the crystal defects and hydrogen can be controlled accurately.

General Disclosure

In order to solve the issue described above, according to one aspect of the present invention, a semiconductor device comprising a semiconductor substrate including an upper surface and a lower surface is provided. A hydrogen concentration distribution may have a first hydrogen concentration peak and a second hydrogen concentration peak in a depth direction of the semiconductor substrate connecting the upper surface and the lower surface. In the depth direction, a donor concentration distribution may have a first donor concentration peak and a second donor concentration peak. The first hydrogen concentration peak and the first donor concentration peak may be placed at a first depth. A second hydrogen concentration peak and a second donor concentration peak may be placed at a second depth deeper than the first depth relative to the lower surface. Each concentration peak may comprise an upward slope in which a concentration value increases from the lower surface in the direction of the upper surface. A value in which a gradient of the upward slope of the second donor concentration peak is standardized by a gradient of the upward slope of the second hydrogen concentration peak may be smaller than a value in which a gradient of the upward slope of the first donor concentration peak is standardized by a gradient of the upward slope of the first hydrogen concentration peak.

Each concentration peak may comprise a downward slope in which a concentration value decreases from the lower surface in the direction of the upper surface. At the second hydrogen concentration peak, a gradient of the upward slope may be smaller than a gradient of the downward slope. At the second donor concentration peak, a gradient of the upward slope may be smaller than a gradient of the downward slope.

The donor concentration distribution between the first depth and the second depth may comprise a flat region in which a donor concentration is substantially constant. A length of the flat region in the depth direction may be 10% or more of a thickness of the semiconductor substrate in the depth direction.

The donor concentration distribution between the first depth and the second depth may comprise a flat region in which a donor concentration is substantially constant. A length of the flat region in the depth direction may be 10 μm or more.

A minimum value of the donor concentration in the flat region may be larger than a donor concentration of the semiconductor substrate.

A minimum value of a donor concentration between the first depth and the second depth may be larger than a donor concentration of the semiconductor substrate.

A concentration value of the second hydrogen concentration peak may be smaller than a concentration value of the first hydrogen concentration peak.

The semiconductor device may comprise an N type drift region provided on the semiconductor substrate. The semiconductor device may comprise an emitter region provided in contact with the upper surface in the semiconductor substrate, wherein the emitter region has a higher donor concentration than the drift region. The semiconductor device may comprise a P type base region provided between the emitter region and the drift region. The semiconductor device may comprise a P type collector region provided in contact with the lower surface in the semiconductor substrate. The semiconductor device may comprise an N type buffer region provided between the collector region and the drift region, wherein the buffer region has one or more donor concentration peaks whose donor concentration is higher than the donor concentration in the drift region. The first donor concentration peak may be the donor concentration peak in the buffer region.

The semiconductor device may comprise an accumulation region provided between the base region and the drift region, wherein the accumulation region has one or more donor concentration peaks whose donor concentration is higher than the drift region. The second donor concentration peak may be the donor concentration peak in the accumulation region.

The accumulation region may have the donor concentration peak of a donor other than hydrogen in addition to the second donor concentration peak.

The second donor concentration peak may be placed between the buffer region and the accumulation region.

The semiconductor device may comprise a gate trench section provided on the upper surface of the semiconductor substrate. The second donor concentration peak may be placed between a bottom of the gate trench section and the upper surface of the semiconductor substrate.

The semiconductor device may comprise an active section provided in the semiconductor substrate. The semiconductor device may comprise an edge termination structure section provided such that it encloses the active section in a top view of the semiconductor substrate. The semiconductor substrate may comprise a passage region in which hydrogen implanted to a position of the second hydrogen concentration peak passed through. The passage region provided in the edge termination structure section may be shorter in the depth direction than the passage region provided in the active section, or the passage region may not be provided in the edge termination structure section.

The semiconductor device may comprise a transistor section and a diode section provided on the semiconductor substrate. The passage region provided in the diode section may be shorter in the depth direction than the passage region provided in the transistor section, or the passage region may not be provided in the diode section.

The passage region provided in the transistor section may be shorter in the depth direction than the passage region provided in the diode section, or the passage region may not be provided in the transistor section.

The first depth may be included within a range of 5 μm or less from the lower surface in the depth direction.

A donor concentration at the first hydrogen concentration peak may be between $1\times10^{15}/cm^3$ and $1\times10^{17}/cm^3$.

According to a second aspect of the present invention, a semiconductor device comprising a semiconductor substrate including an upper surface and a lower surface is provided. A hydrogen concentration distribution in a depth direction of the semiconductor substrate connecting the upper surface and the lower surface may have a first hydrogen concentration peak placed within a range of 5 μm or less from the lower surface in the depth direction and a second hydrogen concentration peak placed closer to the upper surface than the first hydrogen concentration peak.

The semiconductor substrate may have an impurity concentration peak between the lower surface and the first hydrogen concentration peak and the impurity may be argon or fluorine.

According to a third aspect of the present invention, a method of manufacturing the semiconductor device of the first aspect is provided. The method may comprise firstly implanting hydrogen to the first depth from the lower surface of the semiconductor substrate. The method may comprise secondly implanting hydrogen to the second depth from the lower surface of the semiconductor substrate to form a passage region in which hydrogen passes through. The method may comprise diffusing the hydrogen implanted to the first depth into the passage region by heat treating the semiconductor substrate. A dose of hydrogen at the firstly implanting may be determined such that in the semiconductor substrate heat treated at the diffusing, a minimum value of a donor concentration in the passage region is larger than a donor concentration of the semiconductor substrate before the hydrogen is implanted.

At the firstly implanting, at least a minimum dose of hydrogen which is determined by a diffusion coefficient of hydrogen in the semiconductor substrate and the second depth may be implanted.

The semiconductor substrate is a silicon substrate, wherein assuming the second depth from the lower surface being x (cm), a dose of hydrogen Q (/cm²) at the firstly implanting may meet the following equation.

$$Q \geq 2.6\times10^{10}\times e^{0.12x}$$

At the firstly implanting, hydrogen may be implanted to the first depth by plasma doping.

The lower surface of the semiconductor substrate may be ground after the plasma doping.

The lower surface of the semiconductor substrate may be laser annealed after the plasma doping.

The summary clause of the invention above described does not necessarily describe all necessary features of the embodiments of the present invention. The present invention may also be a sub-combination of the features described above.

DESCRIPTION OF EXEMPLARY EMBODIMENTS

Figure 1:
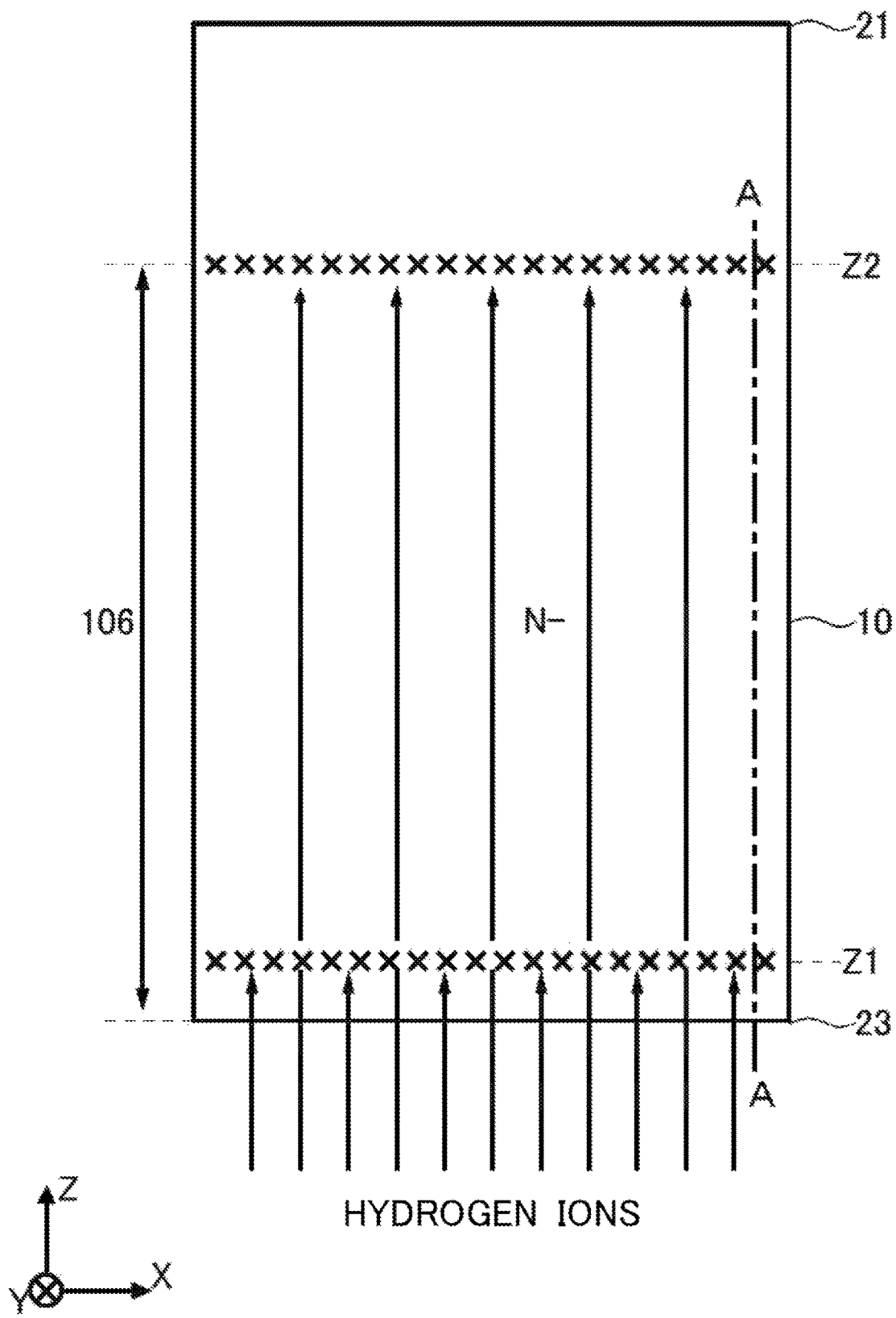
FIG. 1 is a cross sectional view of an example of a semiconductor device 100.

Hereinafter, the present invention will be described through embodiments of the invention, but the following embodiments are not intended to limit the invention of the claims. Also, all combinations of features described in the embodiments are not necessarily essential to solutions of the invention.

As used herein, one side in a direction parallel to the depth direction of a semiconductor substrate is referred to as "upper" and the other side is referred to as "lower". Of two main surfaces of a substrate, a layer or other members, one surface is referred to as an upper surface, and the other surface is referred to as a lower surface. An "upper" and "lower" direction is not limited to the direction of gravity, or a direction in which the semiconductor device is mounted.

As used herein, in some cases, technical matters may be described using orthogonal coordinate axes of X-axis, Y-axis and Z-axis. The orthogonal coordinate axes are intended to merely specify relative positions of components and are not intended to limit to a specific direction. For example, the Z axis is not intended to be limited to indicate a height direction with respect to the ground. Note that a +Z axis direction and a −Z axis direction are directions opposite to each other. In a case where the Z axis direction is described without a description of positive and negative signs, the direction means a direction parallel to the +Z axis and the −Z axis.

As used herein, referring to "same" or "equal" may include an error due to variations in manufacturing or the like. The error is, for example, within 10%.

As used herein, a chemical concentration refers to an atomic density of impurity measured regardless of an activated state. The chemical concentration can be measured by, for example, Secondary Ion Mass Spectrometry (SIMS) method. Herein, in some cases, a concentration difference between a donor and an acceptor may be a higher concentration of the two, the donor or the acceptor. The concentration difference can be measured by Voltage-Capacity measurement method (CV method). Also, a carrier concentration measured by Spread Resistance (SR) measurement method may be a concentration of a donor or an acceptor. Furthermore, in a case where a concentration distribution of a donor or an acceptor has a peak, the peak value may be a concentration of a donor or acceptor in the region. For example, when a concentration of a donor or an acceptor in a region where the donor or the acceptor exits is substantially uniform, the average value of a concentration of a donor or an acceptor in the region may be a donor or acceptor concentration.

As used herein, a doping concentration may refer to a concentration of an impurity transformed to be a donor or an acceptor. Herein, in some cases, a difference of concentration of a donor and an acceptor (i.e., a net doping concentration) may be a doping concentration. Also, in some cases, a peak value of a doping concentration distribution in a doped region may be a doping concentration in the doped region.

As used herein, for a concentration unit per unit volume, atoms/cm$^3$ or ions/cm$^3$ or/cm$^3$ is used. This unit is used for a concentration of a donor or an acceptor in a semiconductor substrate, or a chemical concentration. For a concentration unit per unit area, atoms/cm$^2$ or ions/cm$^2$ or/cm$^2$ is used. This unit is used for an amount (dose) of implantation of atoms or ions to be implanted to a substrate. Representation of atoms and ions can be omitted.

Unless otherwise stated, SI unit system is used as unit system herein. Although unit of length is represented using centimeters, calculations may be done after it being converted to meters (m).

FIG. 1 is a cross sectional view of an example of a semiconductor device 100. The semiconductor device 100 comprises a semiconductor substrate 10. The semiconductor substrate 10 is a substrate made of a semiconductor material. As one example, the semiconductor substrate 10 is a silicon substrate. The semiconductor substrate 10 has a donor concentration determined by impurities and the like implanted at the time of manufacturing. In this example, a conductivity type of the semiconductor substrate 10 is N-type. In some cases, a donor concentration in the semiconductor substrate 10 may be referred to as a substrate concentration herein.

The semiconductor substrate 10 comprises an upper surface 21 and a lower surface 23. The upper surface 21 and the lower surface 23 are two main surfaces of the semiconductor substrate 10. Axes which are orthogonal to each other in a plane parallel to the upper surface 21 and the lower surface 23 are the x axis and the y axis, and an axis which is vertical to the upper surface 21 and the lower surface 23 is the z axis herein. Although semiconductor elements such as IGBTs or FWDs are formed in the semiconductor substrate 10, these element structures are omitted in FIG. 1.

The semiconductor substrate 10 is implanted with hydrogen ions from a side of the lower surface 23. In this example, hydrogen ions are a proton. Hydrogen ions are implanted to at least two depths Z1 and Z2 in the depth direction (along the z axis) of the semiconductor substrate 10. In this example, out of the two depths, the one closer to the lower surface 23 is a first depth Z1 and the other deeper than the first depth Z1 from the lower surface 23 is a second depth Z2. In FIG. 1, although implanted hydrogens are schematically indicated by Xs, hydrogens are distributed around the implantation positions Z1, Z2.

The first depth Z1 may be placed closer to the lower surface 23 of the semiconductor substrate 10 in the depth direction. For example, relative to the lower surface 23, the first depth Z1 may be placed within the range of half or less of a thickness of the semiconductor substrate 10, or may be placed within the range of a quarter or less of the thickness of the semiconductor substrate 10. The second depth Z2 may be placed closer to the upper surface 21 of the semiconductor substrate 10 in the depth direction. For example, relative to the upper surface 21, the second depth Z2 may be placed within the range of half or less of the thickness of the semiconductor substrate 10, or may be placed within the range of a quarter or less of the thickness of the semiconductor substrate 10. However, the first depth Z1 and the second depth Z2 are not limited to these ranges.

Hydrogen ions which are implanted to the second depth Z2 pass through a passage region 106 from the lower surface 23 to the second depth Z2. Vacancy defects such as a vacancy (V) and a divacancy (VV) are generated in the passage region 106 due to the passing through of hydrogen ions. As used herein, a vacancy shall include a divacancy unless otherwise stated. A vacancy density in the passage region 106 can be tuned by a dose of hydrogen ions implanted to the second depth Z2, etc.

Hydrogen implanted to the first depth Z1 and the second depth Z2 is diffused into the passage region 106 by heat treating the semiconductor substrate 10 after hydrogen ions are implanted. The vacancies (V) and oxygen (O) and hydrogen (H) present in the passage region 106 are bonded to form VOH defects. The VOH defects function as a donor for supplying an electron. This can make a donor concentration in the passage region 106 higher than a donor concentration Db (or resistivity, a base doping concentration) at the time of manufacturing a semiconductor ingot which is a base of the semiconductor substrate 10. Accordingly, a donor concentration of the semiconductor substrate 10 can be easily tuned depending on characteristics which elements formed on the semiconductor substrate 10 should have. It should be noted that unless otherwise stated, both VOH defects which have a distribution similar to a chemical concentration distribution of hydrogen and VOH defects which are similar to a distribution of the vacancy defects in the passage region 106 are referred to as a hydrogen donor or hydrogen as a donor.

It should be noted that a dopant for setting a base doping concentration Db is a dopant added at the time of manufacturing semiconductor ingots. As one example, when the semiconductor ingot is silicon, examples of N type may include phosphorous, antimony or arsenic and examples of P type may include boron, aluminum or the like. In a case of compound semiconductor or oxide semiconductor other than silicon, it may be the respective dopants. Moreover, a method of manufacturing semiconductor ingots may be any of Floating Zone (FZ) method, Czochralski (CZ) method and Magnetic field applied Czochralski (MCZ) method.

Usually, the semiconductor substrate 10 having a base doping concentration Db corresponding to characteristics of the elements to be formed on the semiconductor substrate 10, among other things, rated voltage or breakdown voltage, should be prepared. On the contrary, according to the semiconductor device 100 shown in FIG. 1, a donor concentration of the semiconductor substrate 10 and in the range of the passage region 106 at the time of completion of the semiconductor device 100 can be made partially higher than the base doping concentration Db by controlling a dose of hydrogen ions and an implantation depth. As such, elements of a predetermined rated voltage or breakdown voltage characteristics can be formed even when using the semiconductor substrate 10 having a different base doping concentration. Moreover, although a variability of a donor concentration at the time of manufacturing the semiconductor substrate 10 is relatively high, a dose of hydrogen ions can be controlled with relatively high accuracy. Thus, a concentration of vacancies (V) generated by hydrogen ion implantation can be controlled with high accuracy thereby enabling to control a donor concentration in the passage region 106 with high accuracy.

Figure 2:
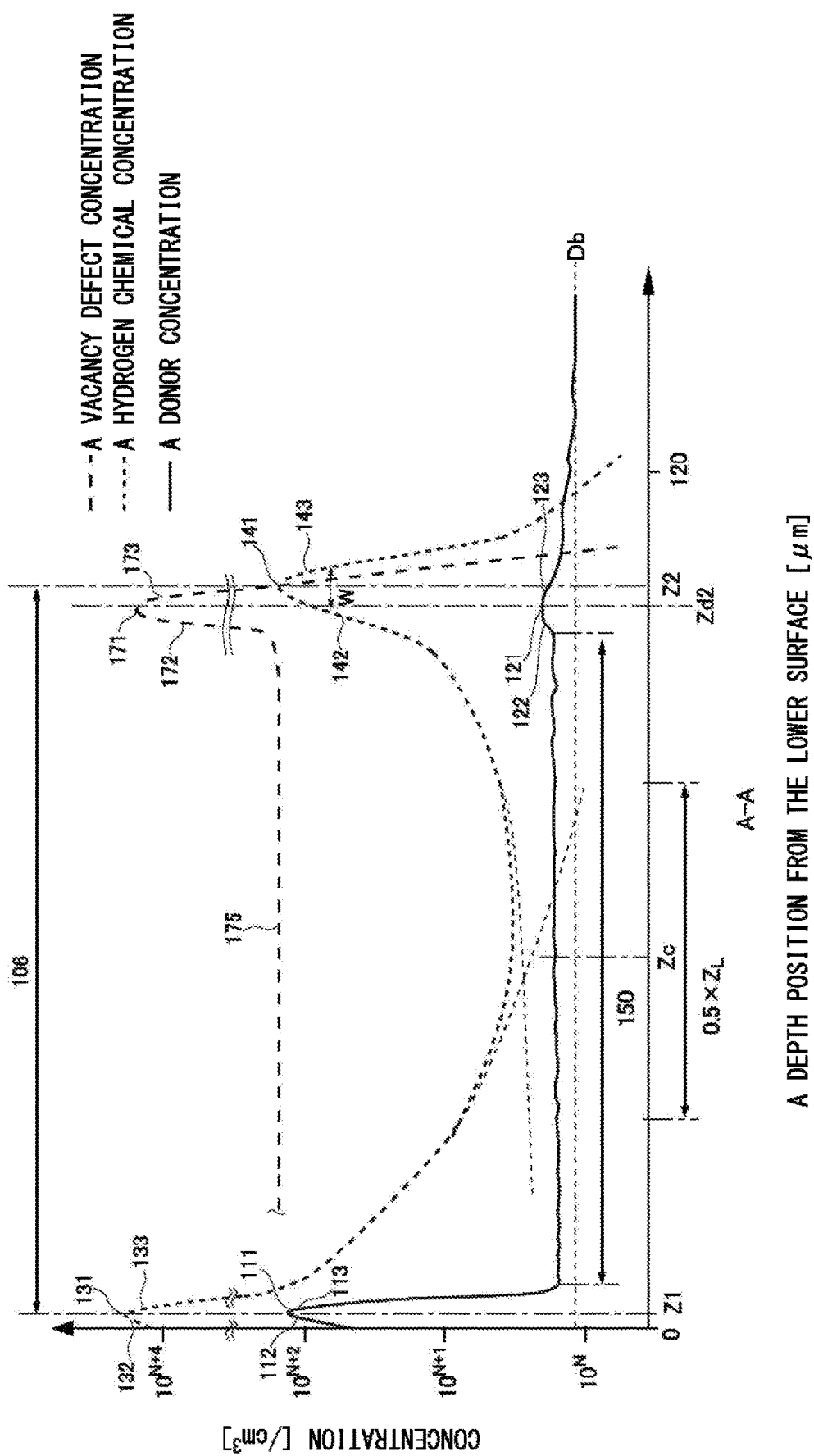
FIG. 2 shows a hydrogen concentration distribution, a donor concentration distribution and a vacancy defect concentration distribution 175 in the depth direction at A-A line of FIG. 1.

FIG. 2 shows a hydrogen concentration distribution, a donor concentration distribution and a vacancy defect concentration distribution 175 in the depth direction at A-A line of FIG. 1. The horizontal axis of FIG. 2 indicates a depth position from the lower surface 23 and the vertical axis indicates a hydrogen concentration per unit volume, a donor concentration per unit volume and a vacancy defect concentration per unit volume in logarithmic axis. It should be noted that the vacancy defect concentration distribution 175 is a distribution immediately after hydrogen ions are ion-implanted to obtain a second hydrogen concentration distribution which will be discussed below. At the time of completion of the semiconductor device 100, vacancies are reduced or eliminated compared to the time of immediately after ion implantation and show a different concentration distribution than that of FIG. 2. The hydrogen concentration in FIG. 2 is a chemical concentration which is measured by, for example, SIMS method. The donor concentration in FIG. 2 is an electrically activated doping concentration which is measured by, for example, CV method or SR method. In FIG. 2, dashed lines indicate the hydrogen concentration distribution and the vacancy defect concentration distribution 175 and a solid line indicates the donor concentration distribution.

The hydrogen concentration distribution has a first hydrogen concentration peak 131 and a second hydrogen concentration peak 141. The first hydrogen concentration peak 131 shows a local maximum value at the first depth Z1. The second hydrogen concentration peak 141 shows a local maximum value at the second depth Z2.

The donor concentration distribution has a first donor concentration peak 111 and a second donor concentration peak 121. The first donor concentration peak 111 shows a local maximum value at the first depth Z1. The second donor concentration peak 121 shows a local maximum value at the second depth Z2. However, a position at which the first donor concentration peak 111 shows the local maximum value may not exactly match the first depth Z1. For example, if a position at which the first donor concentration peak 111 shows the local maximum value is included within a full width at half maximum of the first hydrogen concentration peak 131 relative to the first depth Z1, it may be understood that the first donor concentration peak 111 is placed substantially at the first depth Z1. Similarly, if a position at which the second donor concentration peak 121 shows the local maximum value is included within a full width at half maximum of the second hydrogen concentration peak 141 relative to the second depth Z2, it may be understood that the second donor concentration peak 121 is placed substantially at the second depth Z2.

The vacancy defect concentration distribution 175 has a first vacancy concentration peak corresponding to the first hydrogen concentration peak 131 and a second vacancy concentration peak (a vacancy concentration peak 171) corresponding to the second hydrogen concentration peak 141. However, note that the first vacancy concentration peak is omitted for its illustration. The vacancy concentration peak 171 shows a local maximum value at the depth Zd2.

Each concentration peak has an upward slope in which a concentration value increases and a downward slope in which a concentration value decreases from the lower surface 23 in the direction of the upper surface 21 of the semiconductor substrate 10. In this example, the first hydrogen concentration peak 131 has an upward slope 132 and a downward slope 133. The second hydrogen concentration peak 141 has an upward slope 142 and a downward slope 143. The first donor concentration peak 111 has an upward slope 112 and a downward slope 113. The second donor concentration peak 121 has an upward slope 122 and a downward slope 123. The vacancy concentration peak 171 has an upward slope 172 and a downward slope 173.

Donors of the semiconductor substrate 10 include a donor already present in the semiconductor substrate 10 prior to the hydrogen ion implantation, i.e., the base doping concentration (concentration Db), an activated donor by the hydrogen implanted, and the VOH defects as described above. A ratio in which hydrogen is activated as a donor is, for example, about 1%. In a region within the passage region 106 some distance away from the first depth Z1 and the second depth Z2, a ratio of the VOH defect donors corresponding to the vacancy defect concentration is higher than that of the VOH defect donors corresponding to the hydrogen chemical concentration and the donor concentration is rate controlled by the vacancy defect concentration. The VOH defects corresponding to the hydrogen chemical concentration refer to VOH defects in which the hydrogen chemical concentration is dominant than the vacancy defect concentration. The VOH defects corresponding to the vacancy defect concentration refer to VOH defects in which the vacancy defect concentration is dominant than the hydrogen chemical concentration.

Here, the VOH defects in which the hydrogen chemical concentration distribution is dominant means as follows. In a case where vacancies, oxygen and hydrogen form a cluster to form a VOH defect, it indicates that the hydrogen chemical concentration is amply higher than the vacancy defect concentration so that the donor concentration distribution by the VOH defects is similar to the hydrogen chemical concentration distribution. As one example, at a certain depth and a depth near to it, when the hydrogen chemical concentration is higher than the vacancy defect concentration, it can be said that this results in the donor concentration distribution of the VOH defects in which the hydrogen chemical concentration distribution is dominant.

On the other hand, for the VOH defects in which the vacancy defect concentration distribution 175 is dominant, it indicates that the vacancy defect concentration is amply higher than the hydrogen chemical concentration so that the donor concentration distribution by the VOH defects is similar to the vacancy defect concentration distribution. As one example, at a certain depth and a depth near to it, when the vacancy defect concentration is higher than the hydrogen chemical concentration, it can be said that this results in the donor concentration distribution of the VOH defects in which the vacancy defect concentration distribution 175 is dominant.

It is considered that in the passage region 106, except for the vicinity of the first depth Z1 and the second depth Z2, vacancies (V, VV, etc.) generated by the hydrogen passing through are distributed substantially at a uniform concentration in the depth direction as shown in FIG. 2. It is also considered that oxygen (O) implanted at the time of, for example, manufacturing the semiconductor substrate 10, is uniformly distributed in the depth direction. Moreover, in the passage region 106, hydrogen at the first hydrogen concentration peak 131 and hydrogen at the second hydrogen concentration peak 141 diffuse from both sides of the depth direction so that there is a sufficient amount of hydrogen. These form a flat donor distribution as the VOH defects.

It is considered that near at the second hydrogen concentration peak 141, the vacancy defects formed by hydrogen ion implantation, in particular, dangling bonds are terminated by the hydrogen implanted. Accordingly, in some cases, the second depth Zd2 of the vacancy concentration peak 171 may be positioned slightly closer to the implantation surface of ion implantation or the first hydrogen concentration peak 131 than the second depth Z2 of the second hydrogen concentration peak 141. It holds true for the first vacancy concentration peak, but the position gap is very small compared to that between Z2 and Zd2, thus its illustration is omitted.

As such, in the passage region 106 except for the vicinity of the first depth Z1 and the second depth Z2, there is a flat region 150 in which the VOH defects to function as a donor are distributed substantially uniformly. The donor concentration distribution in the flat region 150 is substantially constant in the depth direction. "The donor concentration is substantially constant in the depth direction" may refer to a state, for example, where regions in which a difference between the maximum value and the minimum value of the donor concentration is 50% or less of the maximum value of the donor concentration are consecutive in the depth direction. The difference may be 30% or less, or 10% or less of the maximum value of the donor concentration in the regions.

Alternatively, relative to the average concentration of the donor concentration distribution in a predetermined range in the depth direction, a value of the donor concentration distribution may be within ±50%, ±30%, or ±10% of the average concentration of the donor concentration distribution. As one example, a predetermined range in the depth direction may be as follows. That is, assuming a length from the first depth Z1 to the second depth Z2 being $Z_L$, the range may be a section of a length of $0.5\ Z_L$ between two points, each of which is apart by $0.25\ Z_L$ from the center Zc between Z1 and Z2 toward either the first depth Z1 or the second depth Z2. Depending on a length of the flat region 150, a length in the predetermined range may be $0.75\ Z_L$, $0.3\ Z_L$, or $0.9Z_L$.

A range in which the flat region 150 is provided can be controlled by a position of the second hydrogen concentration peak 141. The flat region 150 is provided between the first hydrogen concentration peak 131 and the second hydrogen concentration peak 141. In addition, the donor concentration in the flat region 150 can be controlled by a dose of hydrogen ions at the second hydrogen concentration peak 141. Increasing the dose of hydrogen ions results in increased vacancies (V) to be generated in the passage region 106 and as a result, the donor concentration increases.

Alternatively, when implanting hydrogen ions to a position deeper than the first hydrogen concentration peak 131, acceleration energy of hydrogen ions may be increased to as high as for hydrogen to penetrate (pass through) the semiconductor substrate 10. That is, the second hydrogen concentration peak 141 may be made not to remain in the semiconductor substrate 10. In this way, the vacancy defect concentration can also be increased. On the other hand, when acceleration energy is excessive, the substrate is too much damaged at ion implantation such that in some cases, it cannot ensure the flatness in the vacancy defect distribution in the passage region 106. Accordingly, the second hydrogen concentration peak 141 may be positioned inside the semiconductor substrate 10.

Because the second hydrogen concentration peak 141 is provided at a position deeper than the first hydrogen concentration peak 131, the peak tends to spread more widely than the first hydrogen concentration peak 131. Accordingly, the second donor concentration peak 121 also tends to spread more widely than the first donor concentration peak 111. That is, the second donor concentration peak 121 tends to be a gentler peak than the first donor concentration peak 111.

Moreover, in this example, a concentration value of the first hydrogen concentration peak 131 is larger than a concentration value of the second hydrogen concentration peak 141. A concentration value of the first hydrogen concentration peak 131 may be 10 times or more a concentration value of the second hydrogen concentration peak 141, or may be 100 times or more a concentration value of the second hydrogen concentration peak 141. In other examples, a concentration value of the first hydrogen concentration peak 131 may be smaller than or equal to a concentration value of the second hydrogen concentration peak 141.

In this example, since a concentration value of the first hydrogen concentration peak 131 is large, an amount of hydrogen activated as a donor at the first hydrogen concentration peak 131 is relatively large. That is, a ratio of the VOH defect donors in which the hydrogen chemical concentration distribution is dominant than the vacancy defect concentration distribution 175 becomes high. In this case, a shape of the first donor concentration peak 111 is similar to that of the first hydrogen concentration peak 131.

On the other hand, a concentration value of the second hydrogen concentration peak 141 is relatively small, and an amount of hydrogen activated as a donor at the second hydrogen concentration peak 141 is relatively small. That is, a ratio of the VOH defect donors in which the vacancy defect concentration distribution 175 is dominant becomes relatively higher than that of the VOH defect donors in which the hydrogen chemical concentration distribution is dominant. In this case, similarity between a shape of the second donor concentration peak 121 and that of the second hydrogen concentration peak 141 becomes smaller than similarity between a shape of the first donor concentration peak 111 and that of the first hydrogen concentration peak 131. Since it is considered that almost entirely over the passage region 106, the VOH defects are distributed substantially uniformly, the second donor concentration peak 121 becomes a further gentler shape. A peak shape similarity may be an indication that it indicates the smaller value as a difference of gradients of the corresponding slopes between the hydrogen concentration peak and the donor concentration peak is larger.

According to such an arrangement, the flat region 150 can be provided between the first depth Z1 and the second depth Z2. Because hydrogen diffuses from both sides of the depth direction to the passage region 106, it enables the flat region 150 to be easily formed long in the depth direction. A length of the flat region 150 in the depth direction may be 10% or more, 30% or more, or 50% or more of a thickness of the semiconductor substrate 10 in the depth direction. Also, the length of the flat region 150 in the depth direction may be 10 µm or more, 30 µm or more, 50 µm or more, or 100 µm or more.

A minimum value of the donor concentration in the flat region 150 may be larger than the base doping concentration Db of the semiconductor substrate 10. That is, over the entire flat region 150, the donor concentration in the flat region 150 may be higher than the base doping concentration Db. A difference between the donor concentration in the flat region 150 and the base doping concentration Db of the semiconductor substrate 10 can be tuned by, for example, a dose of hydrogen at the second hydrogen concentration peak 141.

A minimum value of the donor concentration between the first depth Z1 and the second depth Z2 may be larger than the base doping concentration of the semiconductor substrate 10. N type regions may be consecutively provided between the first hydrogen concentration peak 131 and the second hydrogen concentration peak 141. Also, a minimum value of the donor concentration between the second depth Z2 and the lower surface 23 of the semiconductor substrate 10 may be larger than the donor concentration of the semiconductor substrate 10.

Figure 3A:
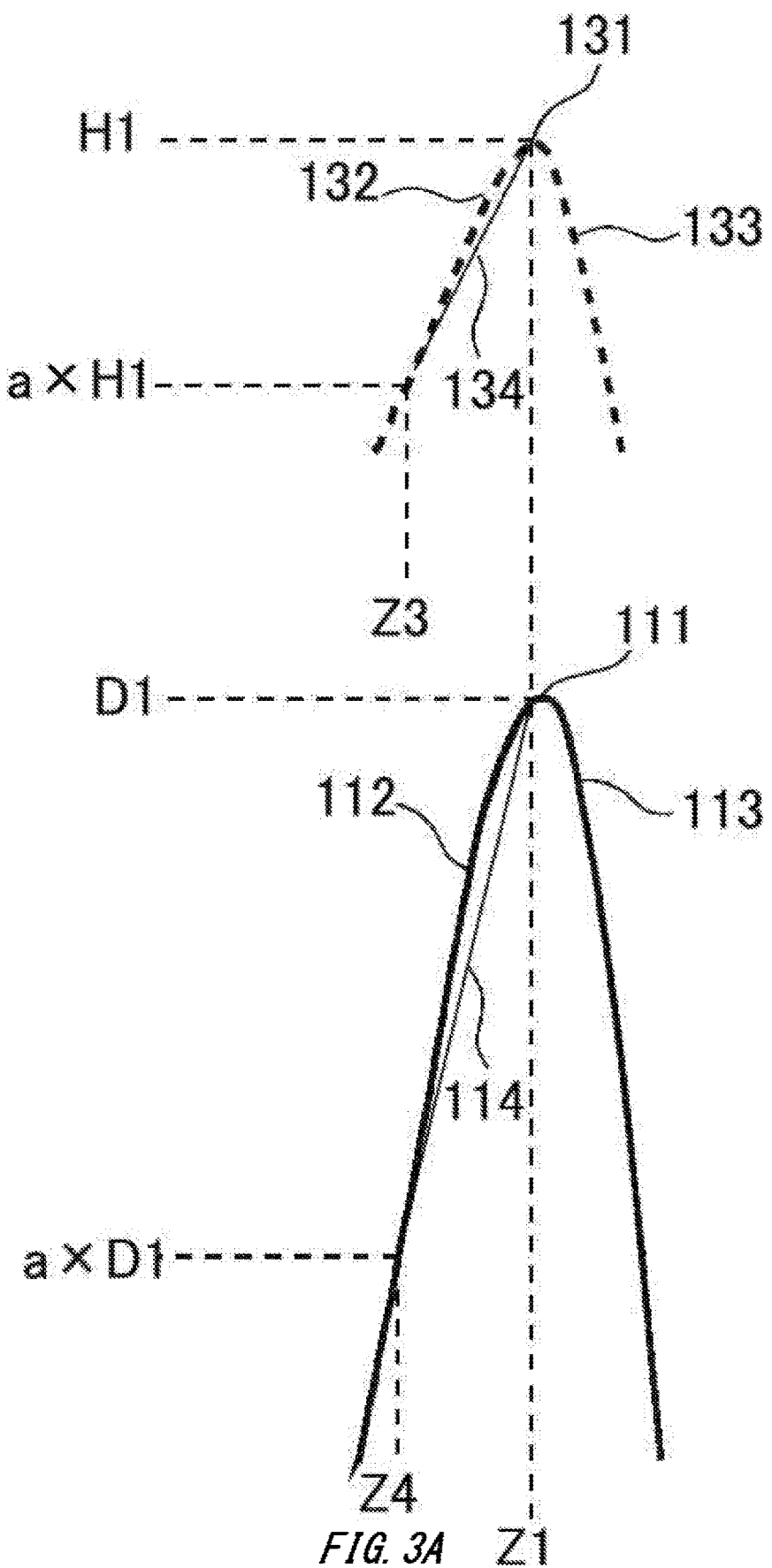
FIG. 3A is a diagram explaining a relation between a first hydrogen concentration peak 131 and a first donor concentration peak 111.

FIG. 3A is a diagram explaining a relation between a first hydrogen concentration peak 131 and a first donor concentration peak 111. In this example, a gradient 114 of the upward slope 112 of the first donor concentration peak 111 is standardized by using a gradient 134 of the upward slope 132 of the first hydrogen concentration peak 131. As an example, standardization is a process in which the gradient 114 is divided by the gradient 134.

A gradient of an upward slope may be a gradient between a position at which the concentration shows a local maximum value and a position at which the concentration is a predetermined ratio relative to the local maximum value. The predetermined ratio may be 80%, 50%, 10% or 1%, or other ratios may be used. Also, at the first hydrogen concentration peak 131 and the first donor concentration peak 111, a gradient of the concentration distribution between the first depth Z1 and the lower surface 23 of the semiconductor substrate 10 may be used. In the example shown in FIG. 3A, the gradient 134 of the first hydrogen concentration peak 131 is given by (H1−aH1)/(Z1−Z3) and the gradient 114 of the first donor concentration peak 111 is given by (D1−aD1)/(Z1−Z4). H1 is a hydrogen concentration at the first depth Z1, D1 is a donor concentration at the first depth Z1, a is a predetermined ratio, Z3 is a depth in which the hydrogen concentration is aH1 in the upward slope 132 of the first hydrogen concentration peak 131, and Z4 is a depth in which the donor concentration is aD1 in the upward slope 112 of the first donor concentration peak 111. For example, standardizing the gradient 114 by the gradient 134 is (D1−aD1)(Z1−Z3)/{(H1−aH1)(Z1−Z4)}. α is defined as a gradient in which the gradient 114 is standardized by the gradient 134.

Figure 3B:
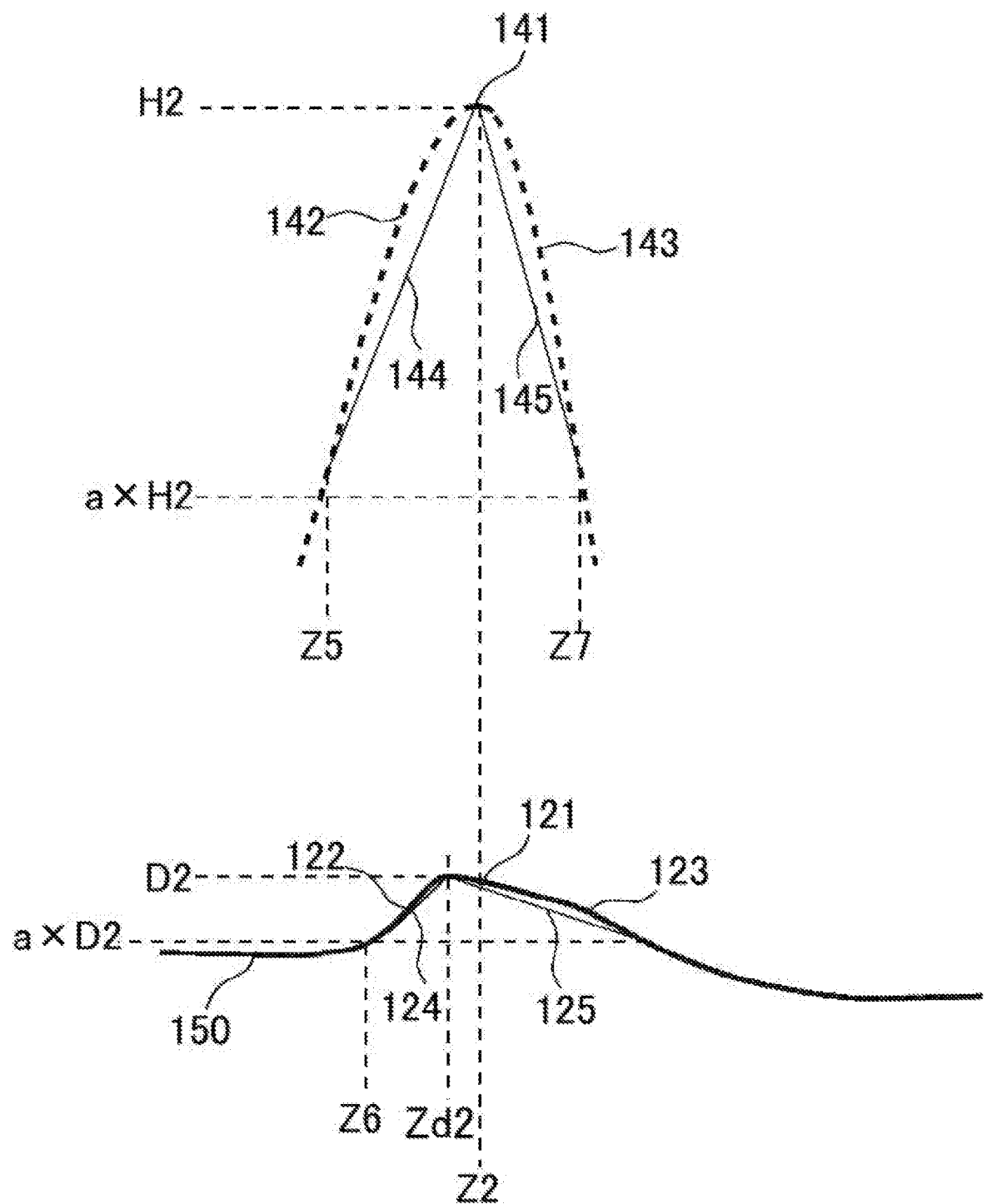
FIG. 3B is a diagram explaining a relation between a second hydrogen concentration peak 141 and a second donor concentration peak 121.

FIG. 3B is diagram explaining a relation between a second hydrogen concentration peak 141 and a second donor concentration peak 121. In this example, a gradient 124 of the upward slope 122 of the second donor concentration peak 121 is standardized by using a gradient 144 of the upward slope 142 of the second hydrogen concentration peak 141.

In the example shown in FIG. 3B, the gradient 144 of the second hydrogen concentration peak 141 is given by (H2−aH2)/(Z2−Z5) and the gradient 124 of the second donor concentration peak 121 is given by (D2−aD2)/(Zd2−Z6). H2 is a hydrogen concentration at the second depth Z2, D2 is a donor concentration at the second depth Z2, a is a predetermined ratio, Z5 is a depth in which the hydrogen concentration is aH2 in the upward slope 142 of the second hydrogen concentration peak 141, and Z6 is a depth in which the donor concentration is aD2 in the upward slope 122 of the second donor concentration peak 121. A ratio "a" used for standardizing the gradient of the second donor concentration peak 121 may be the same as or different from a ratio "a" used for standardizing the gradient of the first donor concentration peak 111. For example, standardizing the gradient 124 by the gradient 144 is (D2−aD2)(Z2−Z5)/{(Zd2−Z6)(H2−aH2)}. β is defined as a gradient in which the gradient 124 is standardized by the gradient 144.

The standardized gradient β of the upward slope 122 of the second donor concentration peak 121 is smaller than the standardized gradient α of the upward slope 112 of the first donor concentration peak 111. In other words, the second donor concentration peak 121 is a gentler peak than the first donor concentration peak 111 relative to the hydrogen concentration peak. Implanting hydrogen ions so as to form such a second donor concentration peak 121 allows the flat region 150 to be formed. In addition, forming the second donor concentration peak 121 to be gentle allows changes in the donor concentration at an edge of the flat region 150 to be gradual. The standardized gradient β of the upward slope 122 of the second donor concentration peak 121 may be one time or less, 0.1 time or less, or 0.01 time or less of the standardized gradient α of the upward slope 112 of the first donor concentration peak 111.

Moreover, the gradient 144 of the upward slope 142 of the second hydrogen concentration peak 141 may be smaller than the gradient 145 of the downward slope 143. In some cases, because a concentration distribution of hydrogen ions implanted from the lower surface 23 to a deep position may trail its gentle skirt at a side of the lower surface 23, it could determine whether the hydrogen of the second hydrogen concentration peak 141 was implanted from a side of the lower surface 23 by comparing the gradient 144 of the upward slope 142 with the gradient 145 of the downward slope 143. The gradient 145 is given by (H2−aH2)/(Z7−Z2). The gradient 125 is given by (D2−aD2)/(Z7−Zd2). Note that although the gradient 124 of the upward slope 122 of the second donor concentration peak 121 is larger than the gradient 125 of the downward slope 123 in FIG. 3B, as in the second hydrogen concentration peak 141, the gradient 124 of the upward slope 122 of the second donor concentration peak 121 may be smaller than the gradient 125 of the downward slope 123.

Figure 3C:
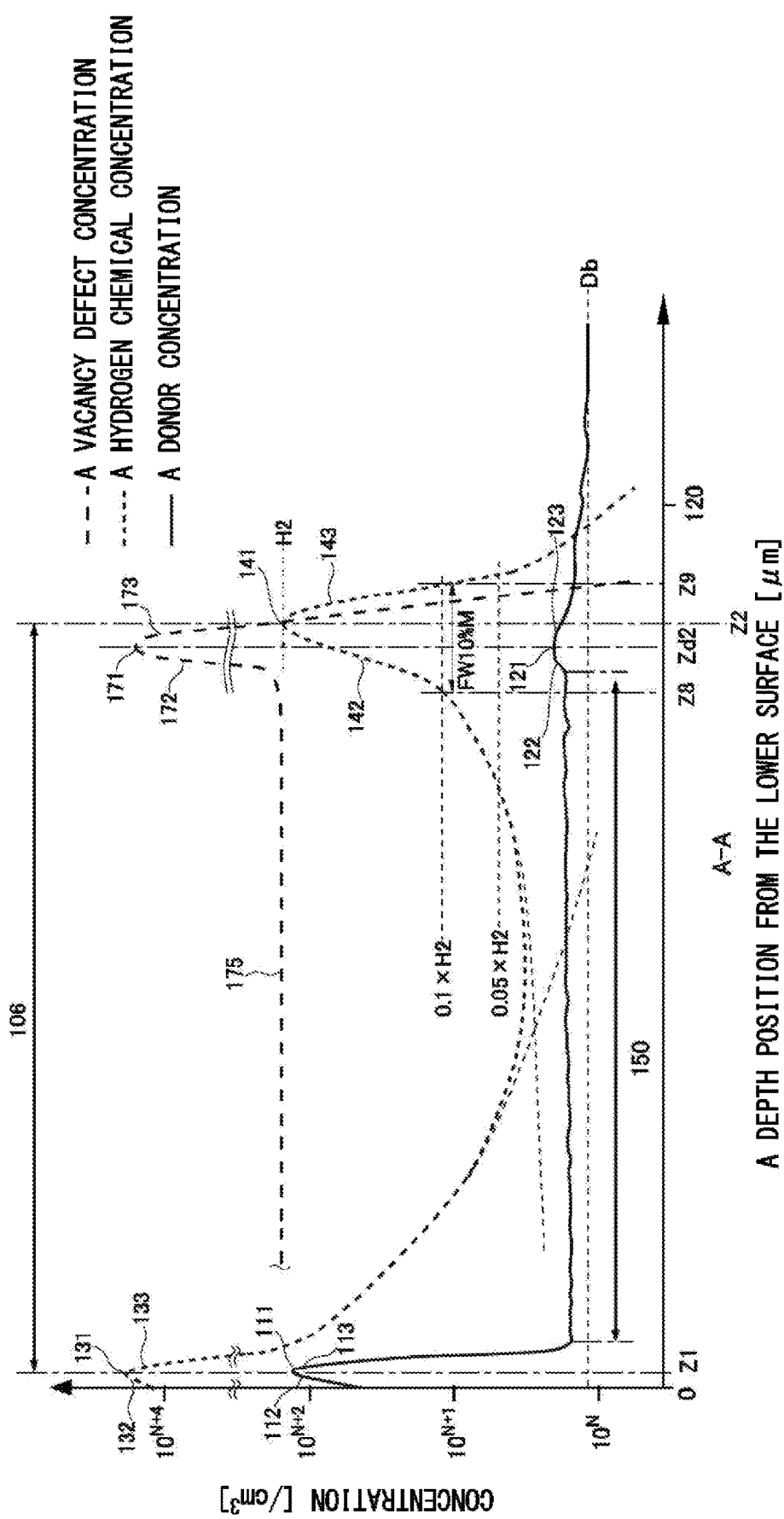
FIG. 3C is a diagram explaining a gradient of an upward slope 142.

FIG. 3C is a diagram explaining a gradient of an upward slope 142. The gradient of the upward slope 142 may be considered as follows. As shown in FIG. 3C, at the second hydrogen concentration peak 141, a width (a 10% full width) between two positions Z8 and Z9 at which 10% (0.1×H2) of the peak concentration H2 falls is FW10% M. Out of the points across the peak position Z2 at which the hydrogen concentration is 0.1×H2, the two positions Z8, Z9 are the closest two positions to the peak position Z2. One of the two positions Z8 and Z9 closer to the first hydrogen concentration peak is Z8. The gradient of the donor concentration at the position Z8 is substantially flat. The gradient of the hydrogen concentration at the position Z8 is more than 100 times of the gradient of the donor concentration at the position Z8. For example, the gradient of the hydrogen concentration at the position Z8 may be 100 times or more, or 1000 times or more the gradient of the donor concentration at the position Z8.

Figure 4A:
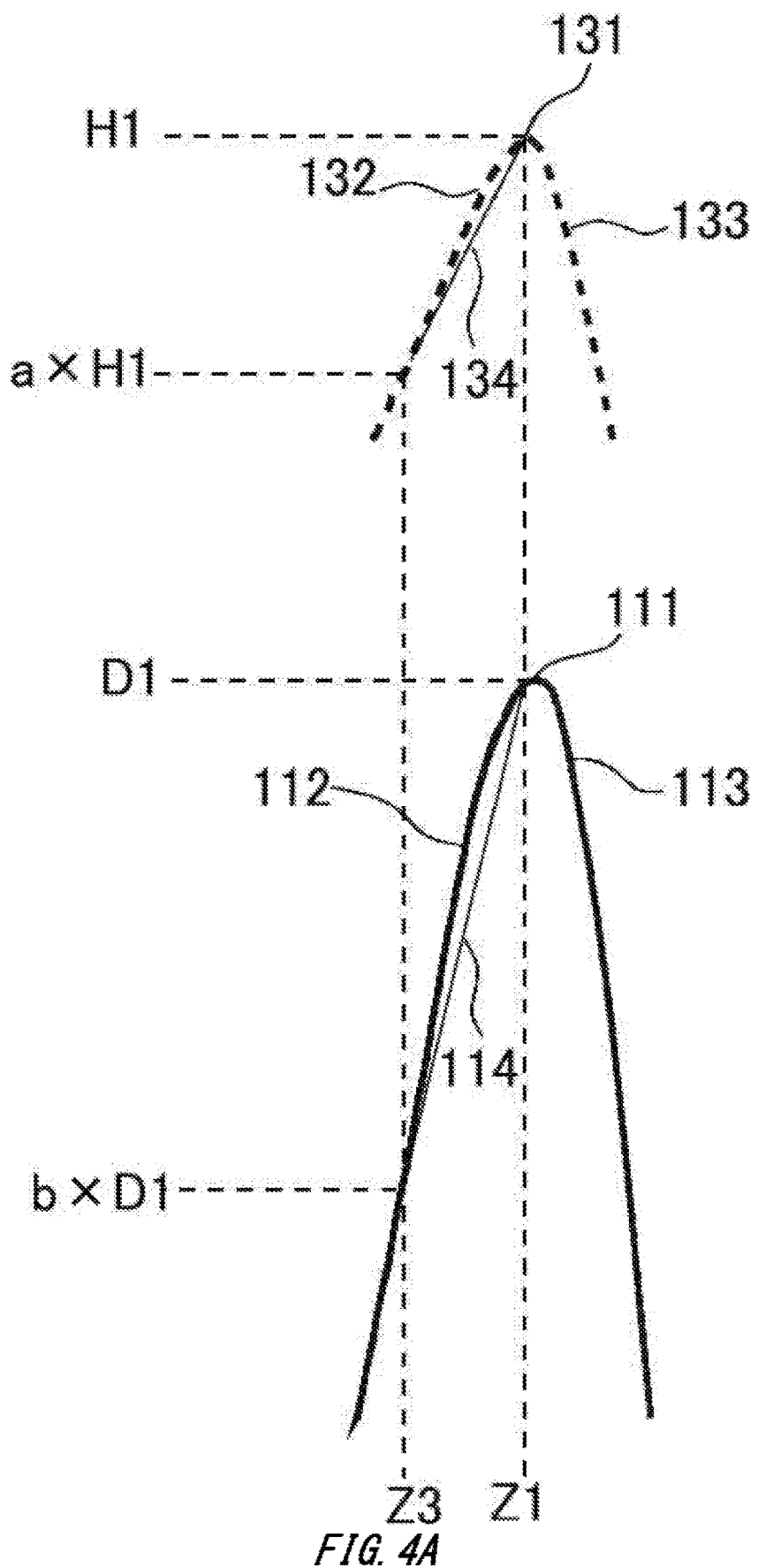
FIG. 4A is a diagram explaining one other definition of standardization of a gradient of an upward slope 112.

FIG. 4A is a diagram explaining one other definition of standardization of a gradient of an upward slope 112. For example, the following indication γ is introduced for standardizing the gradient of the upward slope 112. Although in the example of FIG. 3A, the position Z3 and the position Z4 are different, in this example, they are the same position (Z3=Z4). Here, the position Z3 is a predetermined position. The position Z3 may be a position in which the hydrogen concentration distribution and the donor concentration distribution are in the upward slope 132 and the upward slope 112, respectively in proximity to the lower surface relative to the position Z1. At the position Z3, the hydrogen concentration is a×H1, and the donor concentration is b×D1. "a" is a ratio of the hydrogen concentration at the position Z3 to the concentration H1 of the first hydrogen concentration peak 131 at the position Z1. "b" is a ratio of the donor concentration at the position Z3 to the concentration D1 of the first donor concentration peak 111 at the position Z1. Here, a gradient of a ratio of the hydrogen concentration between the section Z3 and the section Z1 and a gradient of a ratio of the donor concentration between the section Z3 and the section Z1, and a gradient ratio γ in which they are standardized are introduced. The gradient of the ratio of the hydrogen concentration between the section Z3 and the section Z1 is defined as (H1/aH1)/(Z1−Z3). Similarly, the gradient of the ratio of the donor concentration between the section Z3 and the section Z1 is defined as (D1/bD1)/(Z1−Z3). The gradient ratio γ in which the gradient of the ratio of the donor concentration between the section Z3 and the section Z1 is standardized by the gradient of the ratio of the hydrogen concentration between the section Z3 and the section Z1 is defined as {(D1/bD1/(Z1−Z3)}/{(H1/aH1)/(Z1−Z3)}. The standardized gradient ratio γ becomes a simple ratio a/b by calculating the foregoing equation.

Figure 4B:
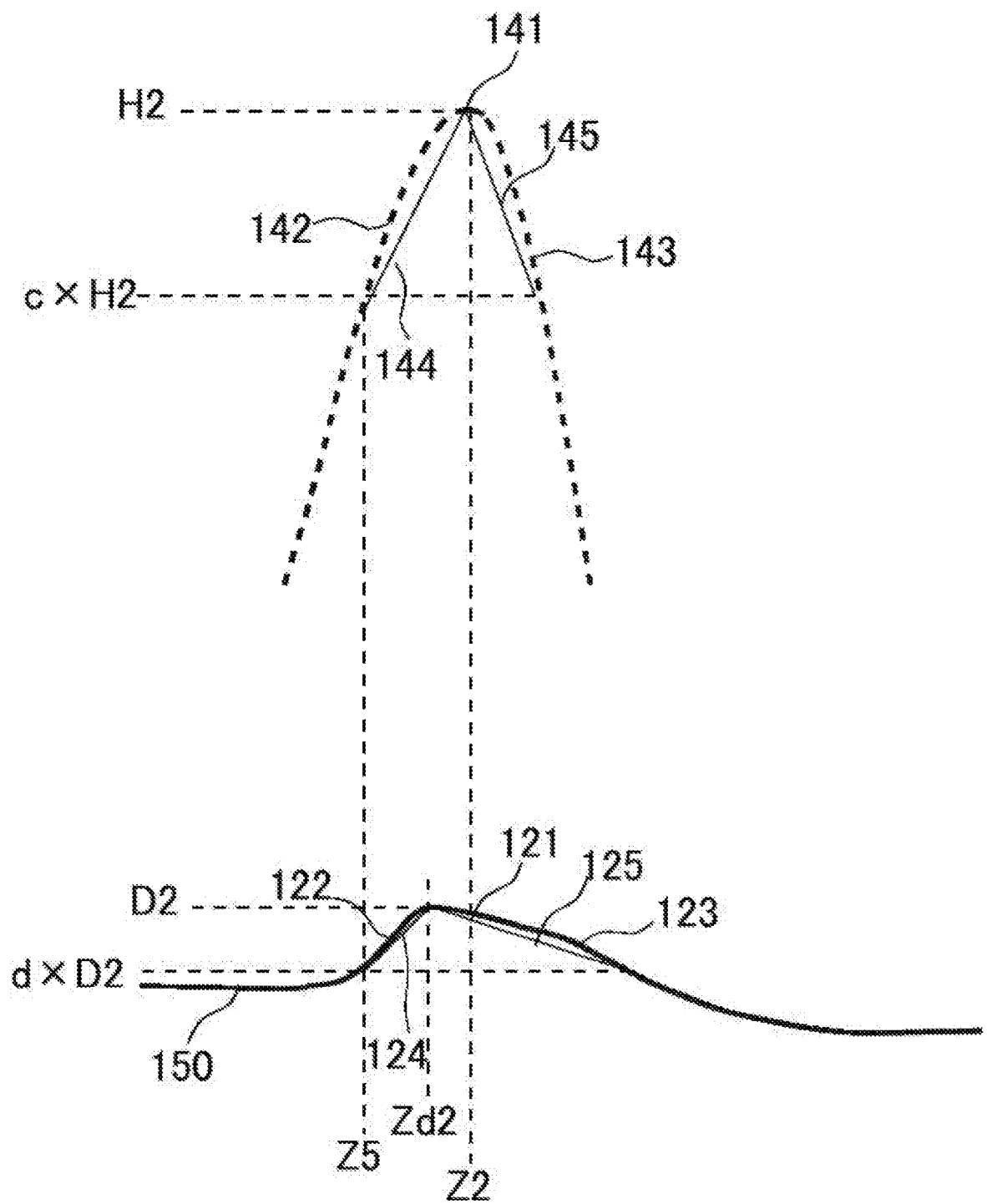
FIG. 4B is a diagram explaining one other definition of standardization of a gradient an upward slope 122.

FIG. 4B is a diagram explaining one other definition of standardization of a gradient of an upward slope 122. For standardization of the gradient of the upward slope 122, for example, an indication E similar to the indication y is introduced. Although in the example of FIG. 3B, the position Z5 and the position Z6 are different, in this example, they are the same position (Z5=Z6). Here, the position Z5 is a predetermined position. The position Z5 may be a position in which the hydrogen concentration distribution and the donor concentration distribution are in the upward slope 142 and the upward slope 122, respectively in proximity to the lower surface relative to the position Z2. At the position Z5, the hydrogen concentration is c×H2, and the donor concentration is d×D2. "c" is a ratio of the hydrogen concentration at the position Z5 to the concentration H2 of the second hydrogen concentration peak 141 at the position Z2. "d" is a ratio of the donor concentration at the position Z5 to the concentration D2 of the second donor concentration peak 121 at the position Z1. Here, a gradient of a ratio of the hydrogen concentration between the section Z5 and the section Z2 and a gradient of a ratio of the donor concentration between the section Z5 and the section Z2, and a gradient ratio E in which they are standardized are introduced. The gradient of the ratio of the hydrogen concentration between the section Z5 and the section Z2 is defined as (H2/cH2)/(Z2−Z5). Similarly, the gradient of the ratio of the donor concentration between the section Z5 and the section Z2 is defined as (D2/dD2)/(Zd2−Z5). The gradient ratio E in which the gradient of the ratio of the donor concentration between the section Z5 and the section Z2 is standardized by the gradient of the ratio of the hydrogen concentration between the section Z5 and the section Z2 is defined as {(D2/dD2/(Z2−Z5)}/{(H2/cH2)/(Zd2−Z5)}. The standardized gradient ratio ε becomes a simple ratio (c/d){(Zd2−Z5)/(Z2−Z5)} by calculating the foregoing equation. Further, if Zd2 is sufficiently close to Z2, then the gradient ratio E may be approximate to c/d. As one example, if |Zd2−Z2| is 10% or less of Z2−Z5, then the gradient ratio E may be approximate to c/d.

For the first hydrogen concentration peak 131 and the first donor concentration peak 111, the hydrogen concentration distribution and the donor concentration distribution often become similar in shape. As used herein, becoming similar in shape means that when, for example, the depth is a horizontal axis and a common logarithm of the concentration is a vertical axis, the donor concentration distribution shows a distribution reflecting the hydrogen concentration distribution. That is, the donor concentration distribution becomes a distribution reflecting the hydrogen concentration distribution by implanting hydrogen ions and performing further thermal annealing in a predetermined section between Z3 and Z1. As one example, if H1 of the first hydrogen concentration peak 131 is $1 \times 10^{17}$ atoms/cm$^3$ and the hydrogen concentration aH1 at the position Z3 is $2 \times 10^{16}$ atoms/cm$^3$, then a is 0.2. On the other hand, if D1 of the first donor concentration peak 111 is $1 \times 10^{16}$ atoms/cm$^3$ and the donor concentration bD1 at the position Z3 is $2 \times 10^{15}$ atoms/cm$^3$, then b is 0.2. Thus, the standardized gradient ratio γ is 1 from a/b. In other words, the ratio a of the hydrogen concentration distribution and the ratio b of the donor concentration distribution are substantially the same value at the depth position Z1 close to the lower surface and it can be said that they are similar in shape.

On the other hand, for the second hydrogen concentration peak 141 and the second donor concentration peak 121, the hydrogen concentration distribution and the donor concentration distribution may not become similar in shape. That is, in a predetermined section of Z5 to Z2, the donor concentration distribution may not reflect the hydrogen concentration distribution. As one example, if H2 of the second hydrogen concentration peak 141 is $1 \times 10^{16}$ atoms/cm$^3$ and the hydrogen concentration cH2 at the position Z5 is $1 \times 10^{15}$ atoms/cm$^3$, then c is 0.1. On the other hand, if D2 of the second donor concentration peak 121 is $3 \times 10^{14}$ atoms/cm$^3$ and the donor concentration dD2 at the position Z5 is $1.5 \times 10^{14}$ atoms/cm$^3$, then d is 0.5. Thus, the standardized gradient ratio ε is 0.2 from c/d. In other words, the ratio c of the hydrogen concentration distribution is a value of 0.2 times the ratio d of the donor concentration distribution at the depth position Z2 which is sufficiently deep from the lower surface and it can be said that they show shapes away from the similarity.

Comparing the standardized gradient ratio γ to the standardized gradient ratio ε, γ may become substantially 1 when the peak position of the hydrogen concentration distribution is close to the lower surface, and ε may become a value sufficiently smaller than 1 when the peak position of the hydrogen concentration distribution is sufficiently deep from lower surface. That is, the standardized gradient ratio ε may be smaller than the standardized gradient ratio α. Furthermore, the gradient ratio ε may be 0.9 or less, 0.5 or less, or 0.2 or less. Alternatively, the gradient ratio ε may be 0.1 or less, or 0.01 or less.

Furthermore, as another example of the second donor concentration peak 121, in some cases, due to reduced mobility of a carrier, a donor concentration calculated by spreading resistance, i.e., a carrier concentration at the depth position Z2 may be reduced than a carrier concentration before or after at the depth position Z2. In such a case, a gradient of the upward slope 122 becomes a declining gradient, so a sign for d is negative. That is, d is a negative number of absolute value of 1 or larger. As a result, E becomes a negative number. That is, the standardized gradient ratio ε may be smaller than the standardized gradient ratio α. Furthermore, the gradient ratio ε may be 0.9 or less, 0 or less, or −1 or less. Alternatively, the gradient ratio ε may be −10 or less, or −100 or less.

Note that an actual position of the second hydrogen concentration peak 141 and an actual position of the second donor concentration peak 121 may be different. Moreover, for the first and second hydrogen concentration peaks and the first and second donor concentration peaks, a position of the respective hydrogen concentration peaks and a position of the respective donor concentration peaks may not exactly be matched. In such a case where a hydrogen concentration peak position and a donor concentration peak position do not match, a position of the hydrogen concentration peak may be Z1 and a concentration of the donor concentration at the Z1 may be a peak position for convenience. In this way, a calculation according to the definition above is possible.

In the description above, an important point is that the second hydrogen concentration peak 141 comprises a local maximum value. In other words, it is important that the hydrogen concentration distribution comprises a local maximum value at the depth Z2. That the second hydrogen concentration peak 141 comprises a local maximum value makes comparison of the standardized gradient ratios as discussed above possible.

Figure 5:
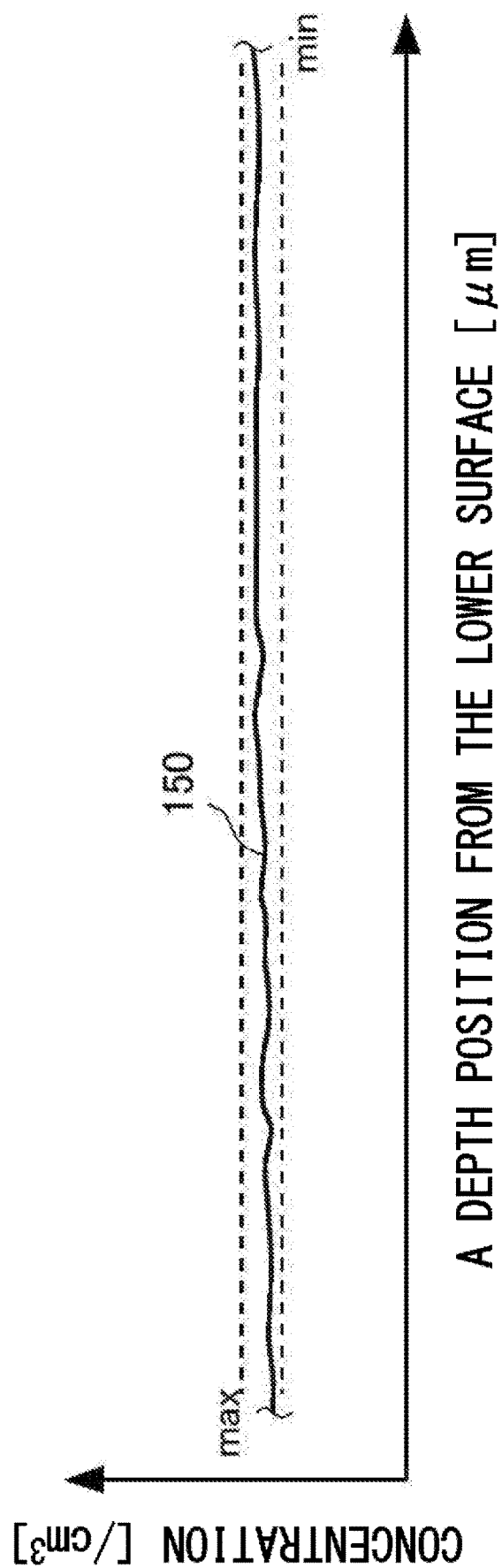
FIG. 5 is a diagram explaining a flat region 150.

FIG. 5 is a diagram explaining a flat region 150. As described above, the donor concentration distribution in the flat region 150 is substantially constant in the depth direction. The flat region 150 is a portion in which a region where a donor concentration is between a predetermined maximum value "max" and a predetermined minimum value "min" is consecutive in the depth direction. For the maximum value "max", a maximum value of the donor concentration in the region may be used. The minimum value "min" may be a value of 50%, 70% or 90% of the maximum value "max".

Alternatively, as discussed above, relative to the average concentration of the donor concentration distribution in a predetermined range in the depth direction, a value of the donor concentration distribution may be within ±50%, ±30% or ±10% of the average concentration of the donor concentration distribution. The predetermined range in the depth direction may be the same as the foregoing.

Figure 6:
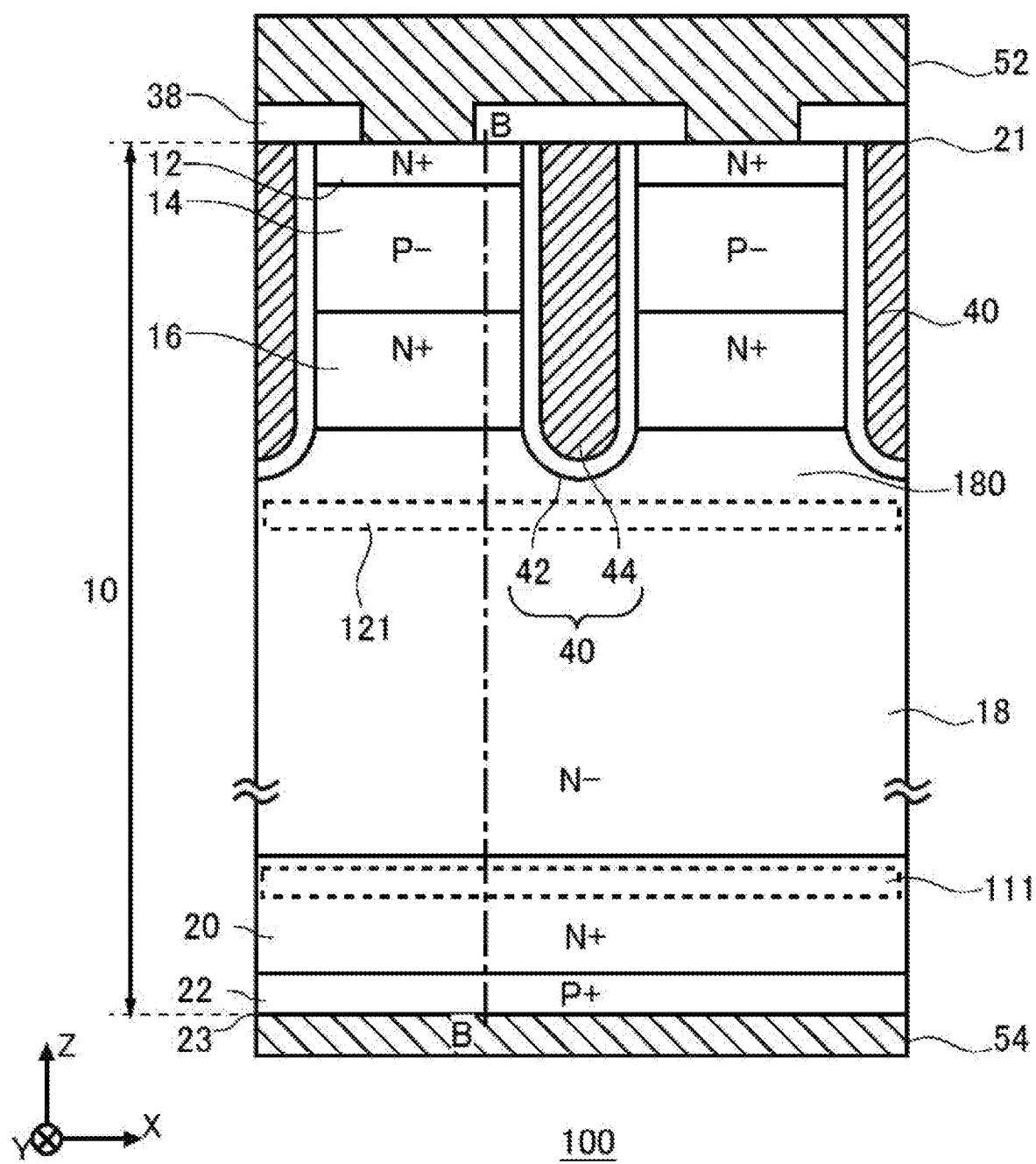
FIG. 6 is a diagram illustrating an example of arrangement of a semiconductor device 100.

FIG. 6 is a diagram illustrating an example of arrangement of a semiconductor device 100. The semiconductor device 100 of this example functions as an IGBT. The semiconductor device 100 of this example comprises a semiconductor substrate 10, an interlayer dielectric film 38, an emitter electrode 52 and a collector electrode 54. The interlayer dielectric film 38 is formed such that it covers at least a portion of the upper surface 21 of the semiconductor substrate 10. Through-holes such as contact holes are formed on the interlayer dielectric film 38. The contact holes expose the upper surface 21 of the semiconductor substrate 10. The interlayer dielectric film 38 may be silicate glass such as PSG, BPSG and the like and may be an oxide film or nitride film and the like.

The emitter electrode 52 is formed on the upper surface of the semiconductor substrate 10 and an upper surface of the interlayer dielectric film 38. The emitter electrode 52 is also formed inside of the contact hole and in contact with the upper surface 21 of the semiconductor substrate 10 exposed by the contact hole.

The collector electrode 54 is formed on the lower surface 23 of the semiconductor substrate 10. The collector electrode 54 may be in contact with the entire lower surface 23 of the semiconductor substrate 10. The emitter electrode 52 and the collector electrode 54 are formed of a metal material such as aluminum.

In the semiconductor substrate 10 of this example, an N-type drift region 18, an N+type emitter region 12, a P-type base region 14, an N+type accumulation region 16, an N+type buffer region 20 and a P+type collector region 22 are provided.

The emitter region 12 is provided in contact with the upper surface 21 of the semiconductor substrate 10 and has a donor concentration higher than the drift region 18. The emitter region 12 includes an N type impurity, for example, phosphorous.

The base region 14 is provided between the emitter region 12 and the drift region 18. The base region 14 includes a P type impurity, for example, boron. In an extending direction (along the y axis of FIG. 6) of the trench section, P type contact regions (not shown) to be placed alternately with the emitter regions 12 are comprised. The contact regions may be formed on the upper surface 21 of the base region and may be formed more deeply than the emitter regions 12. The contact regions suppress latch up of an IGBT at turn-off.

The accumulation region 16 is provided between the base region 14 and the drift region 18 and has one or more donor concentration peaks whose donor concentration is higher than the drift region 18. The accumulation region 16 may include an N type impurity such as phosphorous, or may include hydrogen.

The collector region 22 is provided in contact with the lower surface 23 of the semiconductor substrate 10. An acceptor concentration in the collector region 22 may be higher than an acceptor concentration in the base regions 14. The collector region 22 may include the same P type impurity as the one in the base regions 14 and may include a different P type impurity.

The buffer region 20 is provided between the collector region 22 and the drift region 18 and has one or more donor concentration peaks whose donor concentration is higher than the drift region 18. The buffer region 20 includes an N type impurity such as hydrogen. The buffer region 20 may function as a field stop layer to prevent a depletion layer spread from a side of a lower surface of the base region 14 from reaching the collector region 22.

A gate trench section 40 passes through the upper surface 21 of the semiconductor substrate 10, the emitter region 12, the base region 14 and the accumulation region 16 to the drift region 18. The accumulation region 16 of this example is placed above a lower end of the gate trench section 40. The accumulation region 16 may be provided such that it covers the entire lower surface of the base region 14. Providing the accumulation region 16 having a higher concentration than the drift region 18 between the drift region 18 and the base region 14 allows to enhance carrier injection enhancement effect (Injection-Enhancement effect, IE effect) thus reducing ON voltage at the IGBT.

The gate trench section 40 comprises a gate trench, a gate dielectric film 42, and a gate conductive section 44 formed closer to the upper surface of the semiconductor substrate 10. The gate dielectric film 42 is formed such that it covers the inner wall of the gate trench. The gate dielectric film 42 may be formed by oxidizing or nitriding the semiconductor of the inner wall of the gate trench. The gate conductive section 44 is formed deeper inside the gate trench than the gate dielectric film 42. That is, the gate dielectric film 42 insulates the gate conductive section 44 and the semiconductor substrate 10. The gate conductive section 44 is formed of a conductive material such as polysilicon.

The gate conductive section 44 includes a region opposite to the base region 14 intervening the gate dielectric film 42. Although the gate trench section 40 of this cross section is covered with the interlayer dielectric film 38 in the upper surface of the semiconductor substrate 10, the gate conductive section 44 is connected with a gate electrode in other cross sections. When a predetermined gate voltage is applied to the gate conductive section 44, a channel of electron inversion layer is formed on an outer layer of the base region 14 interfacing the gate trench section 40.

The first donor concentration peak 111 may be provided in the buffer region 20. The second donor concentration peak 121 may be provided in an N type region above the buffer region 20. The second donor concentration peak 121 may be provided between the buffer region 20 and the accumulation region 16. The second donor concentration peak 121 of this example is provided in the drift region 18. The second donor concentration peak 121 may be placed below the lower end of the gate trench section 40, may be placed in contact with the lower end of the gate trench section 40, or may be placed above the lower end of the gate trench section 40.

Figure 7:
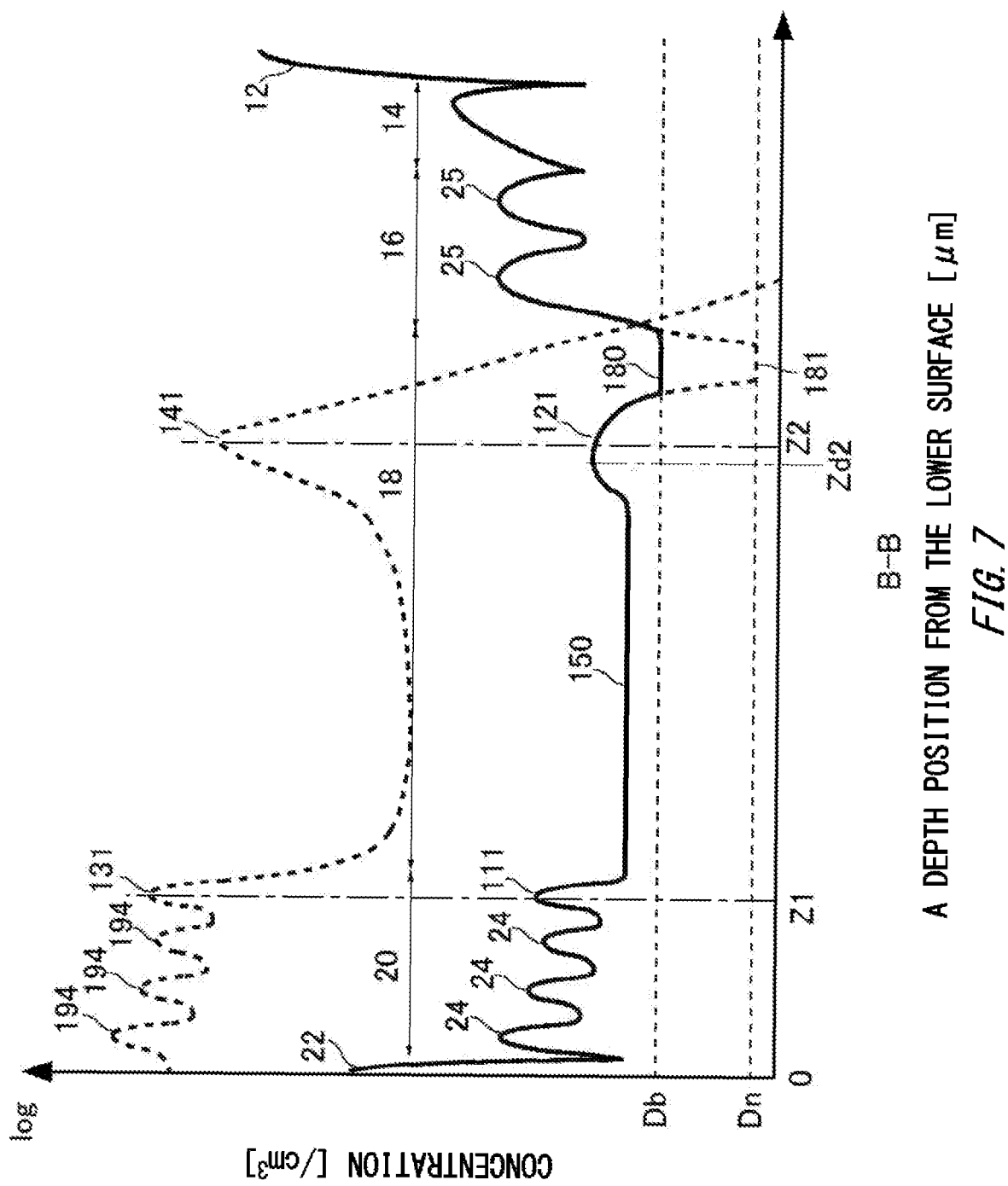
FIG. 7 is a diagram showing an example of a carrier concentration distribution in the depth direction along B-B line of FIG. 6.

FIG. 7 is a diagram showing an example of a carrier concentration distribution in the depth direction along B-B line of FIG. 6. In FIG. 7, part of a hydrogen concentration distribution is shown together. The vertical axis of FIG. 7 is a logarithmic axis.

A carrier concentration distribution in the buffer region 20 of this example has multiple peaks 24 provided at different positions in the depth direction. The peaks 24 are donor concentration peaks. The peaks 24 may include hydrogen as an impurity. Providing multiple peaks 24 can more suppress the depletion layer from reaching the collector region 22. The first donor concentration peak 111 may function as the peaks 24 in the buffer region 20.

As one example, among the multiple peaks 24 in the buffer region 20, the first donor concentration peak 111 may function as a peak farthest away from the lower surface 23 of the semiconductor substrate 10. The flat region 150 is placed between the first donor concentration peak 111 which is included in the buffer region 20 and the second donor concentration peak 121.

Among the multiple peaks 24 in the buffer region 20, the first donor concentration peak 111 may have a donor concentration higher than the peak 24 which is the next farthest away from the lower surface 23. Increasing a concentration of the first donor concentration peak 111 allows easier formation of the flat region 150 even though the first donor concentration peak 111 and the second donor concentration peak 121 are distanced apart. A hydrogen chemical concentration distribution may have one or more hydrogen concentration peaks 194 between the first depth Z1 and the lower surface 23. The hydrogen concentration peaks 194 may be placed in the buffer region 20 as discussed with respect to FIG. 6, etc. The hydrogen concentration peaks 194 may be placed at the same depth position as the peaks 24.

The accumulation region 16 of this example includes multiple peaks 25. The peaks 25 are donor concentration peaks. The second donor concentration peak 121 is placed closer to the lower surface 23 than the accumulation region 16. A region of the base doping concentration Db (a base doped region 180) of the substrate may be provided between the second donor concentration peak 121 and the accumulation region 16. In other examples, a donor concentration between the second donor concentration peak 121 and the accumulation region 16 may be higher than the base doping concentration Db of the semiconductor substrate.

Also, the semiconductor device 100 may use a non-doped substrate for the semiconductor substrate 10 in which dopants such as phosphorous (P) are not doped entirely in a semiconductor ingot at the time of manufacturing the ingot. In this case, a base doping concentration Dn of the semiconductor substrate 10 is lower than the base doping concentration Db. In the example in FIG. 7, a region in which a doping concentration is the base doping concentration Dn is a non-doped region 181. The base doping concentration Dn of the non-doped region 181 is, for example, in the range from $1 \times 10^{10}$ atoms/cm$^3$ to $5 \times 10^{12}$ atoms/cm$^3$. The base doping concentration Dn may be at least $1 \times 10^{11}$ atoms/cm$^3$. The base doping concentration Dn may be at most $5 \times 10^{12}$ atoms/cm$^3$. Note that each concentration may be a value at room temperatures herein. As one example, for the value at room temperatures, a value at 300K (Kelvin) (approximate 26.9 degrees Celsius) may be used.

Figure 8:
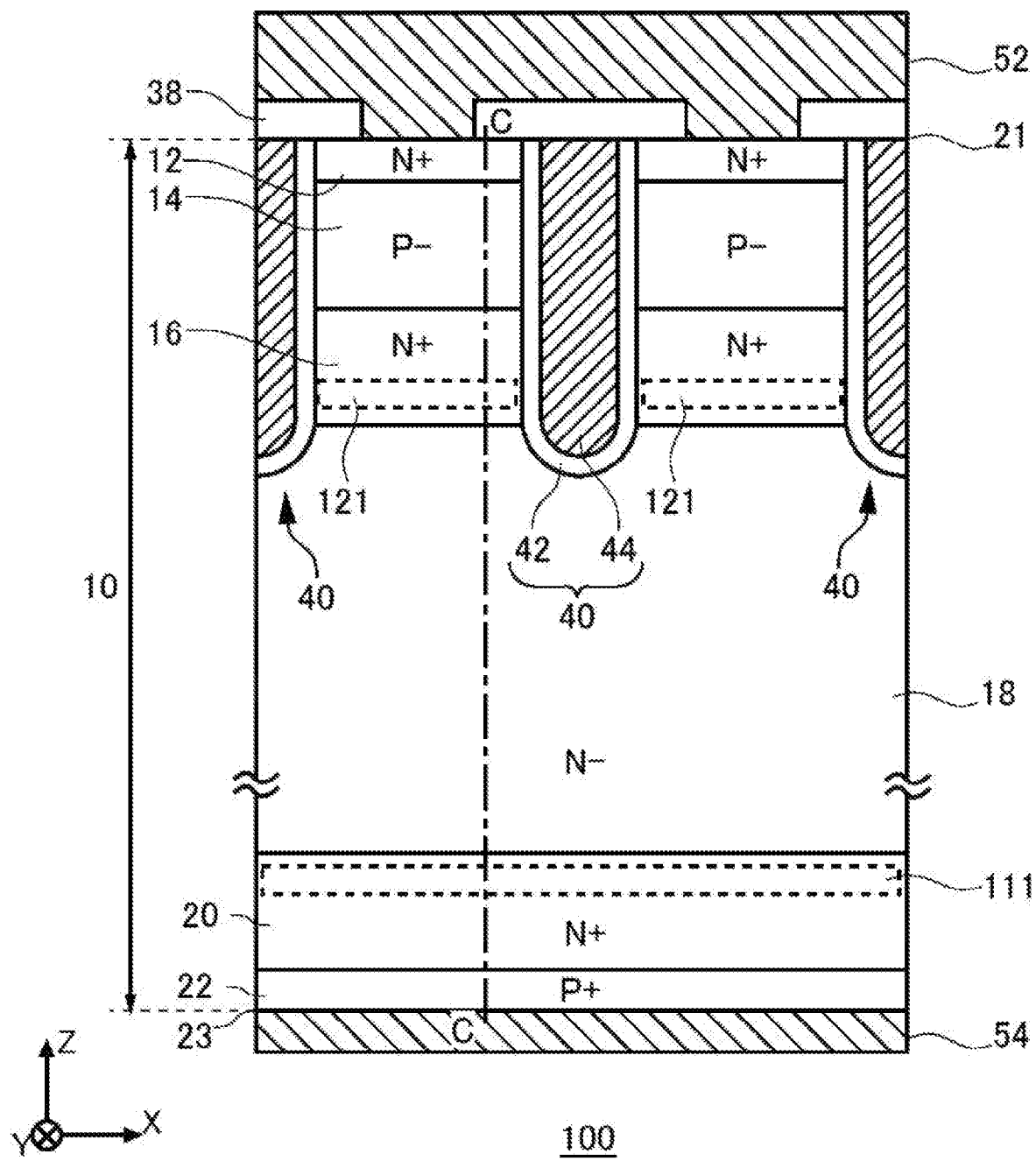
FIG. 8 is a diagram illustrating other examples of arrangement of a semiconductor device 100.

FIG. 8 is a diagram illustrating other examples of arrangement of a semiconductor device 100. The semiconductor device 100 of this example is different from the semiconductor device 100 described in FIGS. 6 and 7 in that the second donor concentration peak 121 (and the second hydrogen concentration peak 141) is placed in the accumulation region 16. The other arrangement may be the same as the ones of the semiconductor device 100 described in FIGS. 6 and 7.

Figure 9:
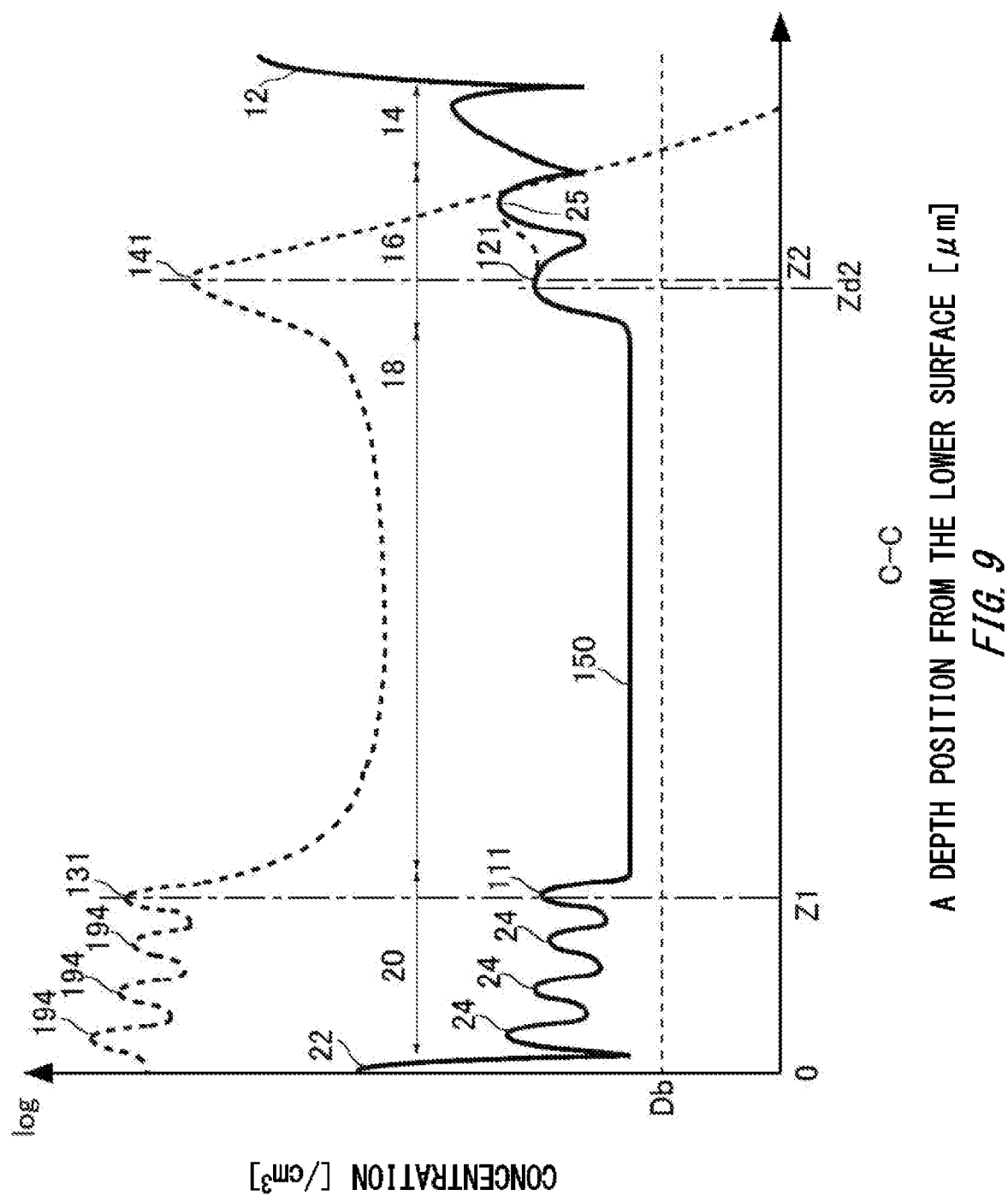
FIG. 9 is a diagram showing an example of a carrier concentration distribution in the depth direction along C-C line of FIG. 8.

FIG. 9 is a diagram showing an example of a carrier concentration distribution in the depth direction along C-C line of FIG. 8. In FIG. 9, part of a hydrogen concentration distribution is shown together. The vertical axis of FIG. 9 is a logarithmic axis.

A carrier concentration distribution in the accumulation region 16 of this example has multiple peaks provided at different positions in the depth direction. The peaks are donor concentration peaks. The peaks in the accumulation region 16 may include hydrogen or phosphorous as an impurity. Providing multiple peaks in the accumulation region 16 can suppress displacement current to the gate trench section in a structure in which the gate trench section and a dummy trench section are placed next to each other (see WO 2018/030440, for example). The dummy trench section comprises a similar structure to the gate trench section and is a trench section to which emitter potential is applied.

The second donor concentration peak 121 of this example functions as any of the donor concentration peaks in the accumulation region 16. As one example, among the multiple peaks in the accumulation region 16, the second donor concentration peak 121 may function as a peak farthest away from the upper surface 21 of the semiconductor substrate 10. The flat region 150 of this example is placed between the first donor concentration peak 111 which is included in the buffer region 20 and the second donor concentration peak 121 which is included in the accumulation region 16.

A donor concentration of the second donor concentration peak 121 may be lower than, same as or higher than a donor concentration of the other peaks 25 in the buffer region 20. When the buffer region 20 has three or more peaks, donor concentrations of the peaks 25 other than the second donor concentration peak 121 may be the same. A donor concentration of the second donor concentration peak 121 may be determined depending on a donor concentration which the flat region 150 should have.

A carrier concentration in the drift region 18 of this example may be higher than the base doping concentration Db of the substrate entirely over the depth direction. Such a structure can tune accurately the whole carrier concentration in the drift region 18.

The peaks 25 other than the second donor concentration peak 121 may be a peak by a donor other than hydrogen. For example, the peaks 25 are a peak in which phosphorous functions as a donor. VOH defects hardly occur due to use of phosphorous as a donor and this can easily control a donor concentration at the peaks 25 and the vicinity with the phosphorous concentration. Furthermore, a width of the second donor concentration peak 121 in the depth direction may be made wider than a width of the peaks 25 in the depth direction. In this way, displacement current to the gate trench section can further be suppressed. Moreover, as shown in FIG. 9, there may be a valley of a donor concentration distribution between the second donor concentration peak 121 and the peak 25 in the accumulation region 16. Alternatively, as shown in dotted lines between the two peaks in FIG. 9, the donor concentration distribution in the accumulation region 16 may be a kink rather than a valley.

Figure 10:
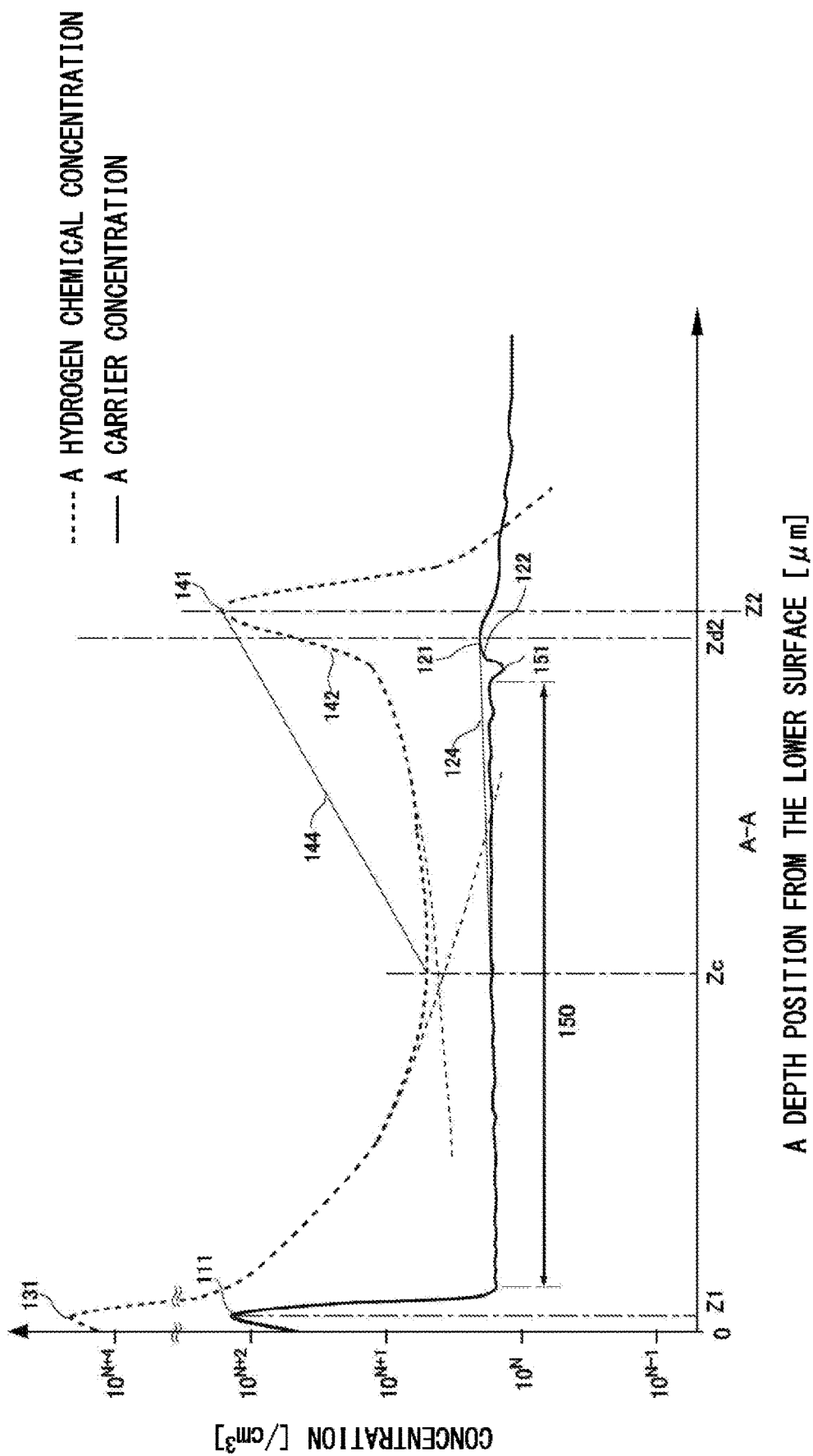
FIG. 10 shows a hydrogen concentration distribution and a carrier concentration distribution in the depth direction along A-A line of FIG. 1.

FIG. 10 shows a hydrogen concentration distribution and a carrier concentration distribution in the depth direction along A-A line of FIG. 1. The carrier concentration was measured by the SR method. More defects easily occur near a range (Z2) of the second hydrogen concentration peak 141 than the passage region 106. In some cases, remaining defects which were not bonded with hydrogen may cause a valley 151 in the carrier concentration distribution near at the second depth Z2.

In some cases, when the valley 151 exists, a calculated gradient of the upward slope 122 of the second donor concentration peak 121 may be steep. As such, preferably, a gradient of the upward slope 122 is calculated excluding an effect of the valley 151. For example, respective gradients of the upward slopes of the second donor concentration peak 121 and the second hydrogen concentration peak 141 may be calculated by using the respective concentrations at the second depth Z2 and a depth Zc. The depth Zc may be positioned closer to the lower surface 23 than the valley 151. The depth Zc of this example is placed at the middle depth of the flat region 150 in the depth direction. As another example, Zc may be a position in which a hydrogen concentration distribution becomes a local minimum between the first hydrogen concentration peak 131 and the second hydrogen concentration peak 141. In this way, a gradient of the upward slope 122 of the second donor concentration peak 121 can be standardized excluding the effect of the valley 151. For standardization, as described above, a gradient of a concentration difference may be used, or a gradient of a concentration ratio may be used.

Figure 11:
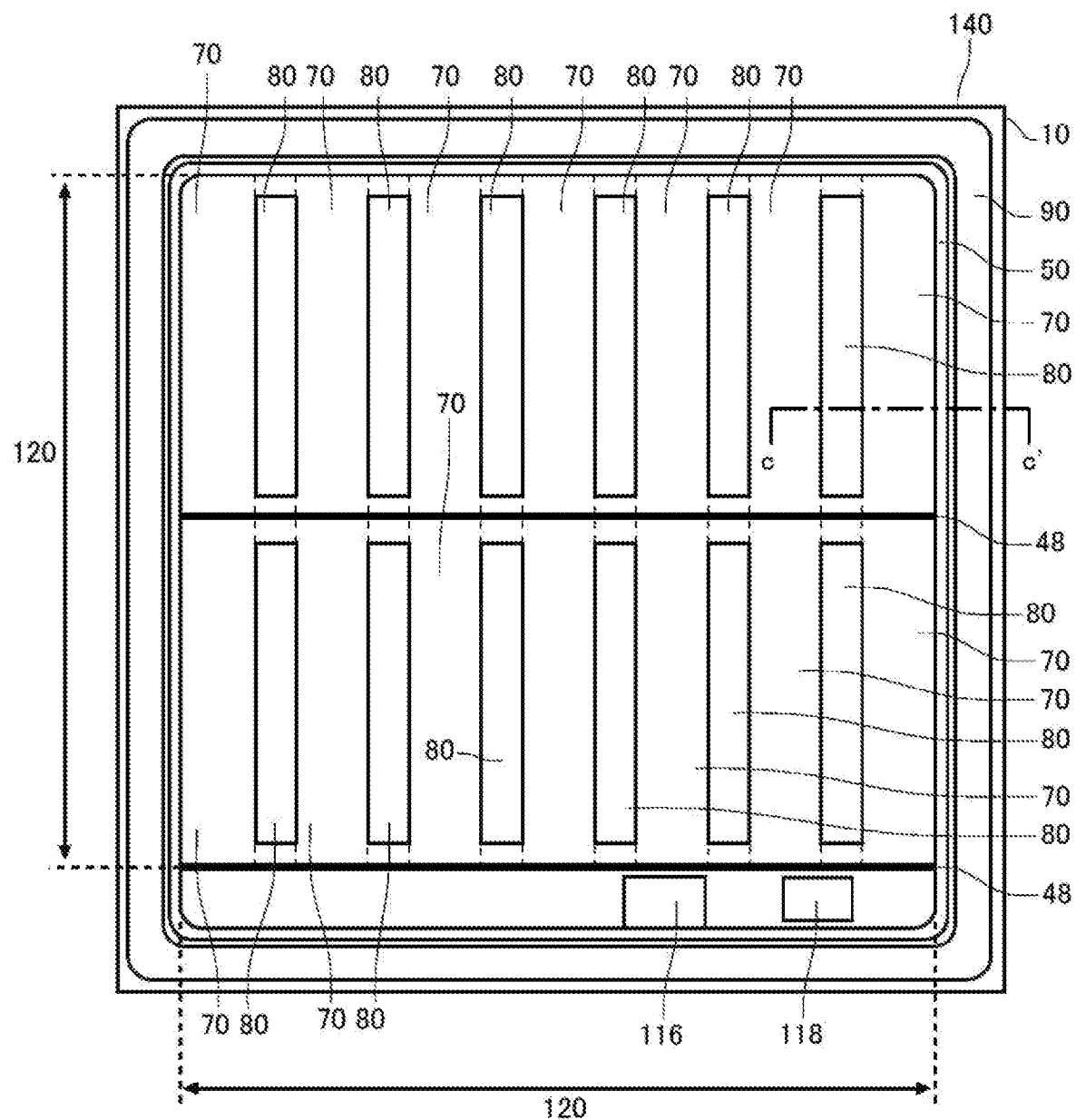
FIG. 11 shows an exemplary placement of respective elements on an upper surface 21 of a semiconductor substrate 10.

FIG. 11 shows an exemplary arrangement of respective elements on an upper surface 21 of a semiconductor substrate 10. In FIG. 11, an outer edge of the semiconductor substrate 10 is referred to as an outer edge 140.

The semiconductor device 100 comprises an active section 120 and an edge termination structure section 90. The active section 120 is an area in which main current flows between the upper surface 21 and the lower surface 23 of the semiconductor substrate 10 when the semiconductor device 100 is controlled ON. In other words, the active section is an area in which current flows inside the semiconductor substrate 10 in the depth direction from the upper surface 21 to the lower surface 23 or from the lower surface 23 to the upper surface 21 of the semiconductor substrate 10.

In the active section 120 of this example, transistor sections 70 and diode sections 80 are provided. The transistor sections 70 and the diode sections 80 may be arranged side by side in the x axis direction. In the example of FIG. 11, the transistor sections 70 and the diode sections 80 are alternately arranged in the x axis direction. At both ends of the active section 120 in the x axis direction, the transistor sections 70 may be provided. The emitter electrode 52 may cover the transistor sections 70 and the diode sections 80. The active section 120 may refer to an area which is covered by the emitter electrode 52.

The transistor section 70 of this example comprises an IGBT (Insulated Gate Bipolar Transistor) discussed in FIGS. 6 to 10. The diode section 80 of this example comprises an FWD (Freewheeling Diode). For each of the diode sections 80, an N+type cathode region 82 is provided in an area which is in contact with the lower surface 23 of the semiconductor substrate 10. In FIG. 11, the diode sections 80 indicated by solid lines are areas in which the cathode regions 82 are provided on the lower surface 23 of the semiconductor substrate 10. In the semiconductor device 100 of this example, in the areas which are in contact with the lower surface 23 of the semiconductor substrate 10 excluding the areas of cathode regions 82, collector regions 22 are provided.

The diode sections 80 are areas to which the cathode regions 82 are projected in the z-axis direction. The transistor sections 70 are areas in which the collector regions 22 are provided on the lower surface 23 of the semiconductor substrate 10 and a structural unit including the emitter region 12 on the upper surface 21 of the semiconductor substrate 10 is periodically provided. A boundary between the diode section 80 and the transistor section 70 in the y axis direction is a boundary between the cathode region 82 and the collector region 22. A portion extended from the area to which the cathode region 82 is projected to an end of the active section 120 or a gate runner 48 in the y axis direction (a portion indicated in dashed lines where the diode section 80 is extended in FIG. 11) may also be included in the diode section 80. The emitter region 12 is not provided in the extended portion.

The semiconductor device 100 of this example further comprises a gate metal layer 50 and a gate runner 48. Also, the semiconductor device 100 may comprise respective pads such as a gate pad 116 and an emitter pad 118. The gate pad 116 is electrically connected with the gate metal layer 50 and the gate runner 48. The emitter pad 118 is electrically connected with the emitter electrode 52.

The gate metal layer 50 may be provided such that it encloses the active section 120 in a top view. The gate pad 116 and the emitter pad 118 may be placed within the area enclosed by the gate metal layer 50. The gate metal layer 50 may be formed of a metal material such as aluminum or aluminum silicon alloy. The gate metal layer 50 is insulated from the semiconductor substrate 10 by the interlayer dielectric film 38. In FIG. 11, the interlayer dielectric film 38 is omitted. Moreover, the gate metal layer 50 is provided separately from the emitter electrode 52. The gate metal layer 50 conveys gate voltage applied to the gate pad 116 to the transistor section 70. A gate conductive section 44 of the transistor section 70 is directly connected to the gate metal layer 50 or indirectly connected to the gate metal layer 50 via other conductive members.

The gate runner 48 connects the gate metal layer 50 to the gate conductive section 44. The gate runner 48 may be formed of a semiconductor material such as polysilicon doped with impurities. A portion of the gate runner 48 may be provided above the active section 120. The gate runner 48 shown in FIG. 11 is provided such that it runs across the active section 120 in the x axis direction. In this way, reduction and latency of gate voltage can be suppressed even in the inside of the active section 120 away from the gate metal layer 50. A portion of the gate runner 48 may be placed such that it encloses the active section 120 along the gate metal layer 50. The gate runner 48 may be connected with the gate conductive section 44 at an end of the active section 120.

The edge termination structure section 90 is provided between the active section 120 and the outer edge 140 of the semiconductor substrate 10 in the upper surface 21 of the semiconductor substrate 10. In this example, the gate metal layer 50 is placed between the edge termination structure section 90 and the active section 120. The edge termination structure section 90 may be placed annularly such that it encloses the active section 120 in the upper surface 21 of the semiconductor substrate 10. The edge termination structure section 90 of this example is placed along the outer edge 140 of the semiconductor substrate 10. The edge termination structure section 90 relaxes electric field concentration at a side of the upper surface 21 of the semiconductor substrate 10. The edge termination structure section 90 comprises, for example, a guard ring, a field plate, a RESURF and a combination structure of them.

Figure 12:
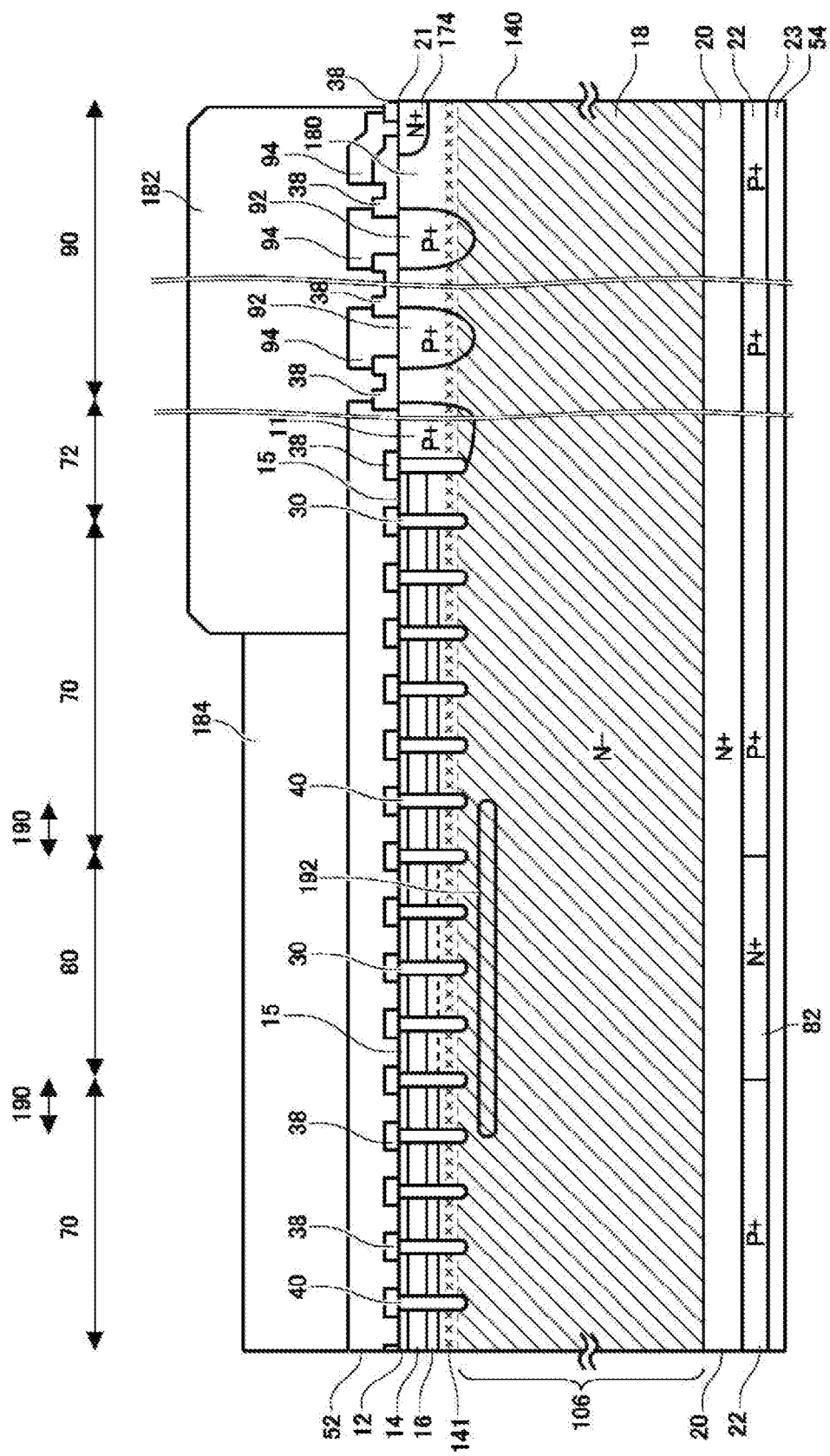
FIG. 12 illustrates a cross sectional view of an example along c-c' of FIG. 11.

FIG. 12 illustrates a cross sectional view of an example along c-c' of FIG. 11. In FIG. 12, an exemplary placement in the cross section of the passage region 106 described with respect to FIGS. 1 to 10 is shown. In FIG. 12, the passage region 106 is hatched. Note that the passage region 106 only in the drift region 18 is shown in FIG. 12 and the passage region 106 in the buffer region 20, the collector region 22 and the cathode region 82 is omitted.

The cross section shown in FIG. 12 is an X-Z plane including the edge termination structure section 90, the transistor section 70 and the diode section 80. Note that although the gate metal layer 50 and the gate runner 48 are placed between the edge termination structure section 90 and the transistor section 70, they are omitted in FIG. 12. The arrangement of the transistor sections 70 are similar to the IGBT described with respect to FIGS. 6 to 10.

The diode section 80 comprises the base region 14, the drift region 18, the cathode region 82 and the dummy trench section 30 inside the semiconductor substrate 10. The base region 14 and the drift region 18 are the same as the base region 14 and the drift region 18 in the transistor section 70.

In the diode section 80, in areas in contact with the upper surface 21 of the semiconductor substrate 10, the base region 14 may be provided, or a contact region 15 may be provided. The contact region 15 is a P+ type area whose doping concentration is higher than the base region 14. The emitter region 12 is not provided in the diode section 80 of this example. Moreover, the accumulation region 16 may or may not be provided in the diode section 80.

The dummy trench section 30 comprises the same arrangement as the gate trench section 40. However, the dummy trench section 30 is electrically connected to the emitter electrode 52. The dummy trench section 30 is provided such that it passes from the upper surface 21 of the semiconductor substrate 10 through the base region 14 to the drift region 18. The dummy trench section 30 may also be provided in the transistor section 70. In the transistor section 70, the dummy trench sections 30 and the gate trench sections 40 may be placed in a predetermined cycle.

There may be a middle boundary region 190 between the transistor section 70 and the diode section 80. The middle boundary region 190 is an area in which neither action by the transistor section 70 or by the diode section 80 is directly performed. As one example, an area of the middle boundary region 190 which is contact with the upper surface 21 may comprise the same arrangement as that of the diode section 80 on the upper surface 21. Also, in a top view, within the middle boundary region 190, in an area which is contact with the lower surface 23, the collector region may be provided by extending the collector region of the transistor section 70. In FIG. 12, only an exemplary range of the middle boundary region 190 is indicated by an arrow. In FIG. 12, the exemplary range as the middle boundary region 190 also has the same arrangement as the transistor section 70.

In the drift region 18 of the diode section 80, a lifetime control region 192 may be provided closer to the upper surface 21 than the middle in the depth direction. The lifetime control region 192 is an area in which a recombination center of a carrier (an electron or a hole) is provided in a higher concentration than the surroundings. The recombination center may be vacancy type defects such as a vacancy, a divacancy or the like, transitions, interstitial atoms, or transition metal, etc. The lifetime control region 192 may be extended from the diode section 80 to the middle boundary region 190.

A plurality of guard rings 92, a plurality of field plates 94 and a channel stopper 174 are provided in the edge termination structure section 90. Within the edge termination structure section 90, in an area which is contact with the lower surface 23, the collector region 22 may be provided. Each of the guard rings 92 may be provided such that it encloses the active section 120 in the upper surface 21. The plurality of guard rings 92 may have a function to extend outwardly from the semiconductor substrate 10 the depletion layer generated in the active section 120. This can prevent electric field concentration inside the semiconductor substrate 10 and enhance breakdown voltage of the semiconductor device 100.

The guard ring 92 of this example is a P+ type semiconductor region formed by implanting ions near the upper surface 21. A depth of a bottom of the guard ring 92 may be deeper than a depth of a bottom of the gate trench section 40 and the dummy trench section 30.

An upper surface of the guard ring 92 is covered with the interlayer dielectric film 38. The field plate 94 is formed of a conductive material such as metal or polysilicon, etc. The field plate 94 may be formed of the same material as that of the gate metal layer 50 or the emitter electrode 52. The field plate 94 is provided on the interlayer dielectric film 38. The field plate 94 is connected to the guard ring 92 through a through-hole provided on the interlayer dielectric film 38.

At a side of the upper surface 21 of the semiconductor substrate 10, a protective film 182 is provided. The protective film 182 may cover the edge termination structure section 90, the gate metal layer 50, the boundary section 72 and a portion of the active section which is in contact with the boundary section 72. The protective film 182 may be an insulating film, an organic thin film. The protective film 182 of this example is polyimide. A plating layer 184 may be provided on the entire surface of an exposed portion of the emitter electrode 52 in which the protective film 182 is not formed. A surface of the plating layer 184 may be positioned closer to the upper surface 21 than a surface of the protective film 182. The plating layer 184 is connected to an electrode terminal of a power module in which the semiconductor device 100 is mounted.

The channel stopper 174 is provided such that it is exposed on the upper surface 21 and a side surface in the outer edge 140. The channel stopper 174 is an N type area whose doping concentration is higher than the drift region 18. The channel stopper 174 has a function to terminate the depletion layer generated in the active section 120 in the outer edge 140 of the semiconductor substrate 10.

Also, the boundary section 72 may be provided between the transistor section 70 and the edge termination structure section 90. The boundary section 72 may comprise the contact region 15, the base region 14 and the dummy trench section 30 in the upper surface 21 of the semiconductor substrate 10. The boundary section 72 may comprise a P+ type well region 11 whose doping concentration is higher than the base region 14. The well region 11 is provided in contact with the upper surface 21 of the semiconductor substrate 10. The gate metal layer 50 and the gate runner 48 may be provided above the well region 11. A depth of a bottom of the well region 11 may be the same as a depth of a bottom of the guard ring 92. A portion of the trench sections in the boundary section 72 may be formed in the well region 11. Within the boundary section 72, in an area which is in contact with the lower surface 23, the collector region 22 may be provided.

In this example, the second hydrogen concentration peak 141 is placed between the bottom of the gate trench section 40 in the z-axis direction and the upper surface 21 of the semiconductor substrate 10. While the second hydrogen concentration peak 141 is placed more deeply than the accumulation region 16 in the example of FIG. 12, the second hydrogen concentration peak 141 may be placed at the same depth as the accumulation region 16, or may be placed at the same depth as the base region 14, or may be placed at the same depth as the emitter region 12. It should be noted that as shown in dotted lines in FIG. 12, the accumulation region 16 may also be formed in the diode section 80.

The passage region 106 is formed within a range from the lower surface 23 of the semiconductor substrate 10 to the second hydrogen concentration peak 141. In each figure, although the second hydrogen concentration peak 141 and the passage region 106 do not overlap each other, the passage region 106 is formed to reach the depth of the second hydrogen concentration peak 141.

Moreover, the passage region 106 of this example is provided for each of the transistor section 70, the diode section 80, the boundary section 72 and the edge termination structure section 90. In each of the transistor section 70, the diode section 80, the boundary section 72 and the edge termination structure section 90, a depth of the passage region 106 may be the same. In a top view, the passage region 106 may also be provided entirely in the semiconductor substrate 10. According to this example, the donor concentration can be tuned substantially entirely over the depth direction of the semiconductor substrate 10. Furthermore, in a top view, the donor concentration can be tuned substantially entirely the semiconductor substrate 10.

In this example, an area in which the passage region 106 is not formed is provided, especially in a portion in contact with the upper surface 21 within the edge termination structure section 90. A donor concentration in the area in which the passage region 106 is not formed is the same as the base doping concentration Db. The area in which the passage region 106 is not formed is closer to the upper surface 21 than the depth of the second hydrogen concentration peak 141. In other words, the area in which the passage region 106 is not formed may be an area whose doping concentration is substantially the base doping concentration Db. The area whose doping concentration is the base doping concentration Db is referred to as a base doped region 180. In this example, the base doped region 180 is provided in contact with the upper surface 21 and at a portion shallower than the well region 11.

Figure 13:
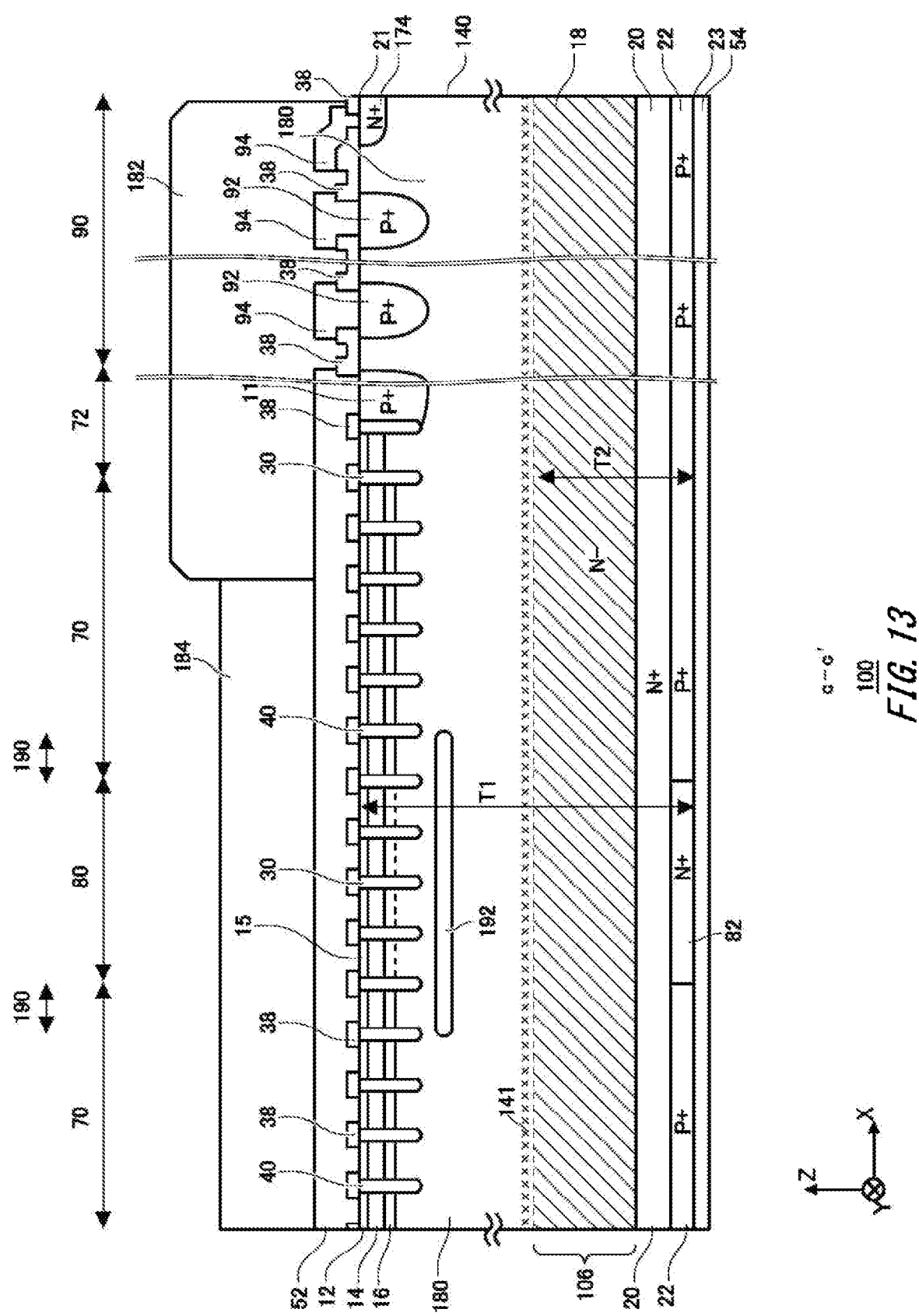
FIG. 13 shows other examples of a placement of a passage region 106.

FIG. 13 is other examples of a placement of a passage region 106. The passage region 106 of this example differs from the passage region 106 of FIG. 12 in a width in the depth direction. A placement in a top view is the same as that of the passage region 106 of FIG. 12.

The second hydrogen concentration peak 141 of this example is placed between the bottom of the gate trench section 40 and the lower surface 23 of the semiconductor substrate 10. A thickness of the semiconductor substrate 10 in the depth direction is referred to as T1, a distance between the second hydrogen concentration peak 141 and the lower surface 23 of the semiconductor substrate 10 is referred to as T2. The distance T2 corresponds to a thickness of the passage region 106 in the depth direction. The distance T2 may be at least 40% and at most 60% of the thickness T1. In other words, the passage region 106 may be provided from the lower surface 23 of the semiconductor substrate 10 to substantially the middle in the depth direction of the semiconductor substrate 10. However, the distance T2 can be changed as appropriate.

As described above, the base doped region 180 is provided closer to the upper surface 21 than the second hydrogen concentration peak 141. The base doped region 180 of this example is an area from the bottom surface of the trench section to the second hydrogen concentration peak 141 and has a depth of substantially T1-T2. In a top view, the base doped region 180 of this example is provided over the entire surface of the semiconductor substrate 10.

Figure 14:
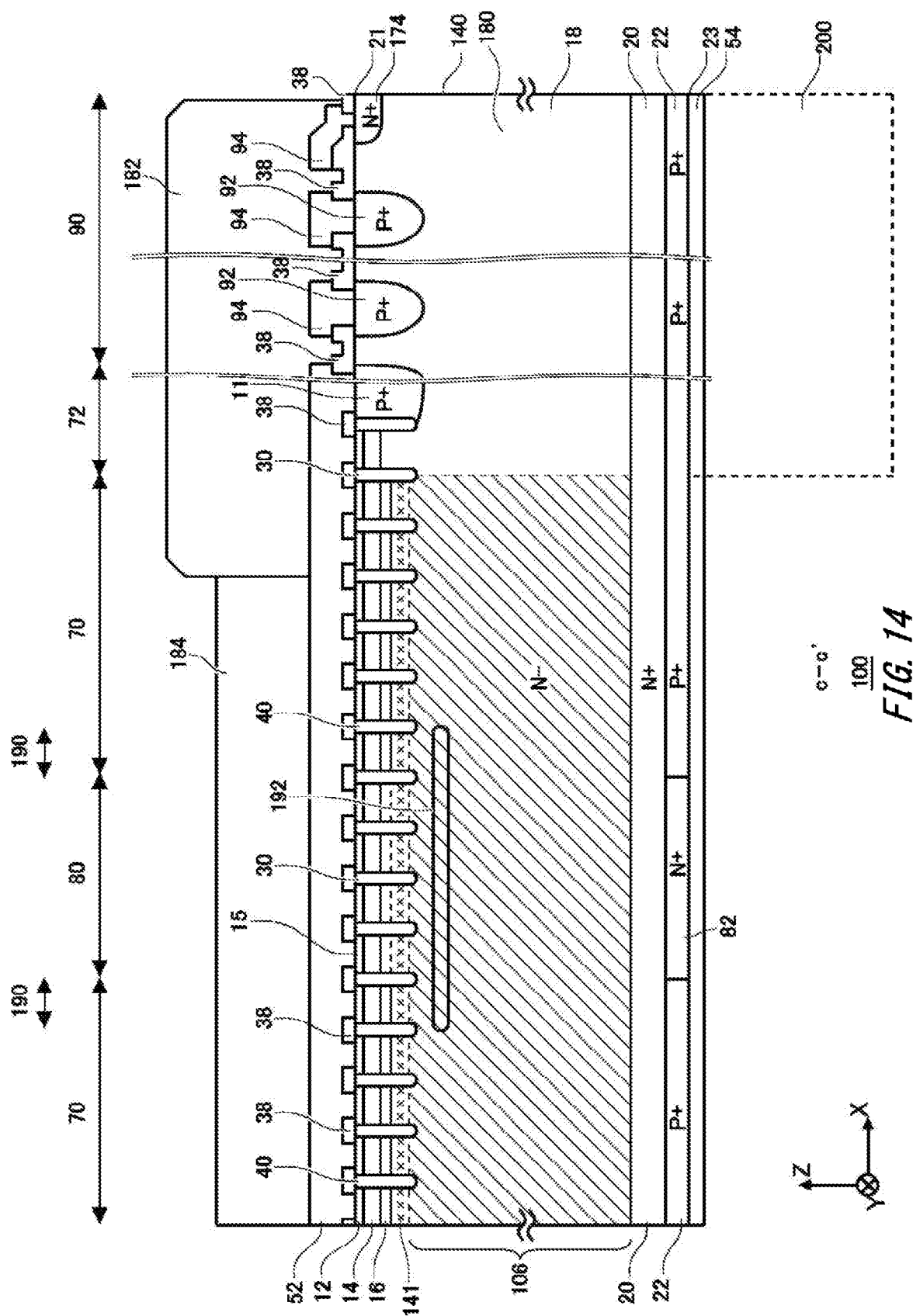
FIG. 14 shows other examples of a placement of a passage region 106.

FIG. 14 is other examples of a placement of a passage region 106. The passage region 106 of this example differs from the passage region 106 of FIG. 12 in a placement in a top view. A placement in the depth direction may be the same as that of the passage region 106 of FIG. 12.

In this example, in a top view, the passage region 106 and the second hydrogen concentration peak 141 are not provided in at least a portion of the edge termination structure section 90. FIG. 14 shows an example in which the passage region 106 and the second hydrogen concentration peak 141 are not provided for the whole edge termination structure section 90 in a top view. In other examples, the passage region 106 and the second hydrogen concentration peak 141 may be provided at an end closer to the active section 120 of the edge termination structure section 90. In other words, the passage region 106 and the second hydrogen concentration peak 141 are not provided in an area in contact with the outer edge 140 of the semiconductor substrate 10. In this example, since the second hydrogen concentration peak 141 is not provided near the outer edge 140, this can suppress defects to be formed near the outer edge 140. This can suppress leakage increase at the outer edge 140.

That is, the base doped region 180 of this example is provided in an area in contact with the outer edge 140 of the semiconductor substrate 10. In a top view, the base doped region 180 of this example is provided in at least a portion of the edge termination structure section 90. Furthermore, in a top view, the base doped region 180 may be provided in the entire edge termination structure section 90 and the boundary section 72.

Note that a placement of the passage region 106 in the boundary section 72 may be the same as that in the edge termination structure section 90, may be the same as that in the transistor section 70, or may be the same as that in the diode section 80. FIG. 14 shows an example in which the passage region 106 is not provided in the boundary section 72.

Figure 15:
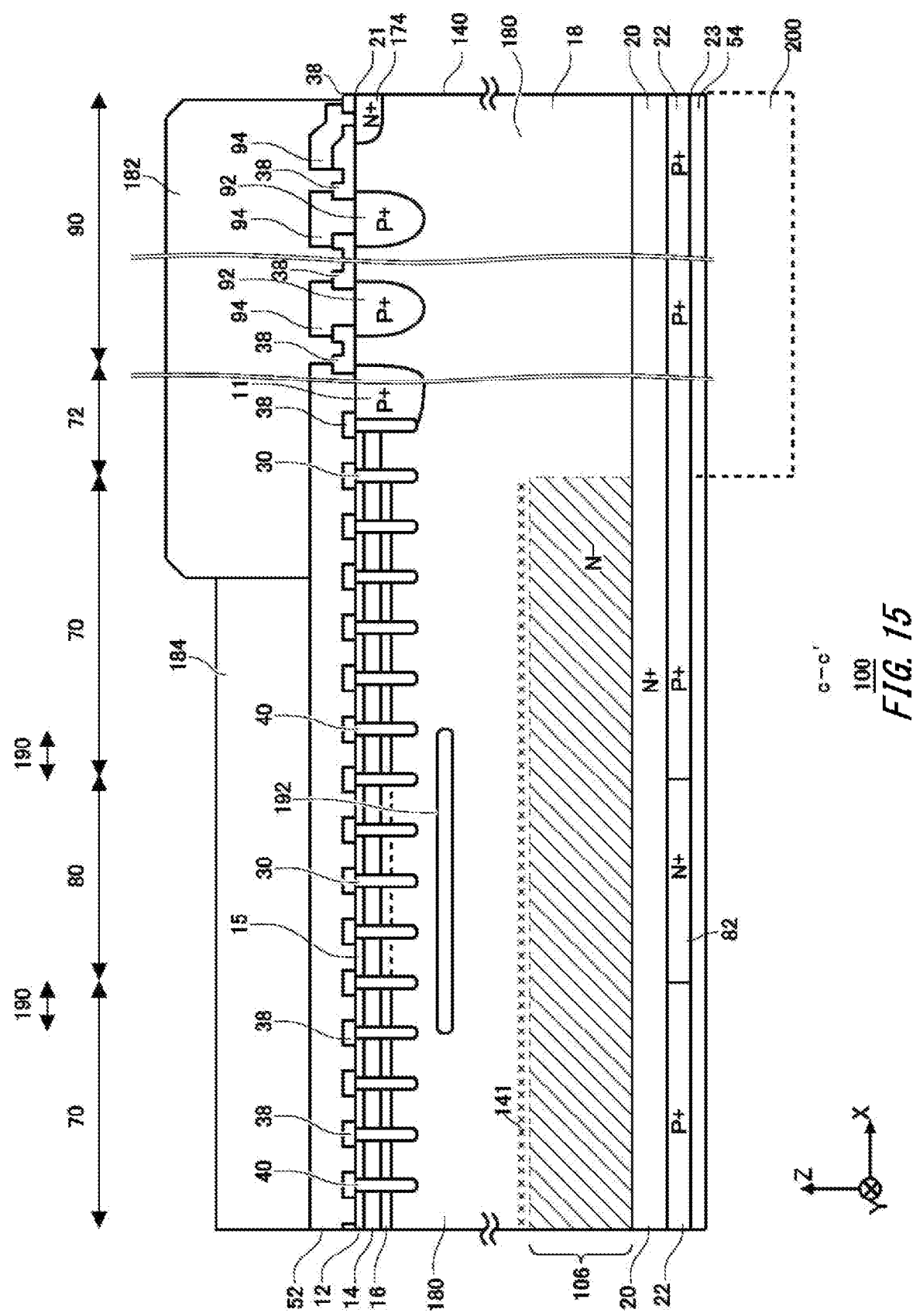
FIG. 15 shows other examples of a placement of a passage region 106.

FIG. 15 is other examples of a placement of a passage region 106. A placement in the depth direction of the passage region 106 of this example is the same as that of the passage region 106 shown in FIG. 13 and a placement in a top view of the passage region 106 of this example is the same as that of the passage region 106 shown in FIG. 14. That is, the passage region 106 is not provided in the edge termination structure section 90. Moreover, the passage region 106 is provided in the transistor section 70 and the diode section 80 from the lower surface 23 of the semiconductor substrate 10 to near the middle of the semiconductor substrate 10 in the depth direction.

The base doped region 180 of this example is formed in the boundary section 72 and the edge termination structure section 90 from the upper surface 21 to the buffer region 20. Moreover, in the active section, the base doped region 180 is formed in the drift region 18 closer to the upper surface 21 than the second hydrogen concentration peak 141. In a top view, at a side closer to the upper surface 21 than the second hydrogen concentration peak 141, the base doped region 180 of this example is provided over the entire surface of the semiconductor substrate 10.

Figure 16A:
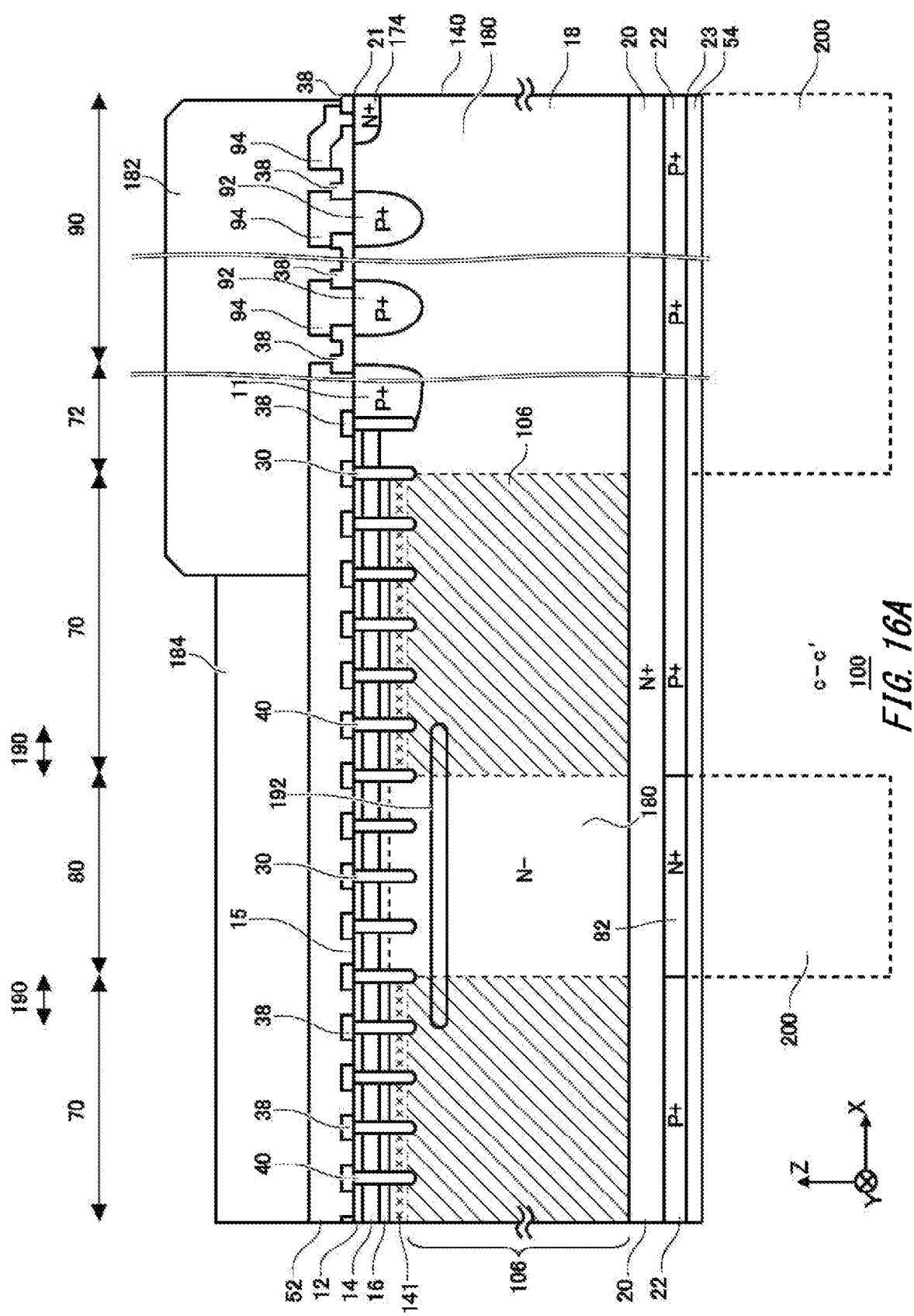
FIG. 16A shows other examples of a placement of a passage region 106.

FIG. 16A is other examples of a placement of a passage region 106. This example differs from the examples of FIGS. 12 to 15 in that the passage region 106 and the second hydrogen concentration peak 141 are not provided in at least portion of the diode section 80 in a top view. The other arrangements are the same as those of the examples described with respect to FIGS. 12 to 15.

FIG. 16A shows an example in which the passage region 106 and the second hydrogen concentration peak 141 are not provided for the whole diode section 80 in a top view. In other words, the base doped region 180 is provided for the whole diode section 80 in a top view. Moreover, the base doped region 180 is also provided entirely for the boundary section 72 and the edge termination structure section 90. In other examples, the passage region 106 and the second hydrogen concentration peak 141 may be provided at an end of the diode section 80 in contact with the transistor section 70. Different placement of the passage region 106 between the transistor section 70 and the diode section 80 can make a doping concentration distribution in the diode section 80 and the transistor section 70 be varied as appropriate.

Figure 16B:
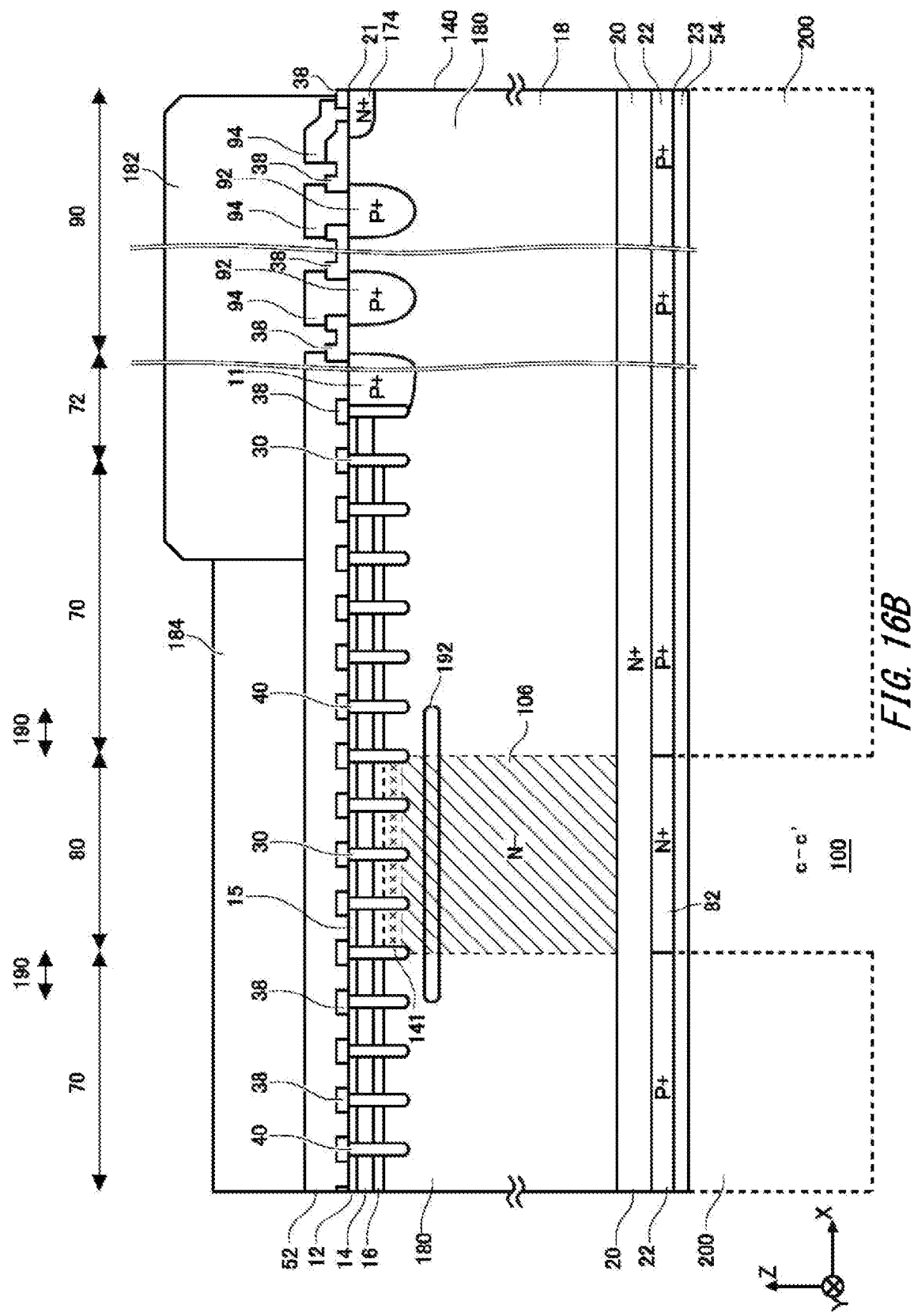
FIG. 16B shows other examples of placement of a passage region 106.

FIG. 16B is an opposite arrangement of a passage region 106 and a base doped region 180 formed in an active section to FIG. 16A. Forming the passage region 106 in the diode section 80 suppresses extension of space charge region during reverse recovery and suppresses waveform vibration during reverse recovery. On the other hand, making the transistor section 70 as the base doped region 180, for example, boosts extension of space charge region during occurrence of short circuit to enhance hole injection and suppresses short circuit breakdown.

Figure 17A:
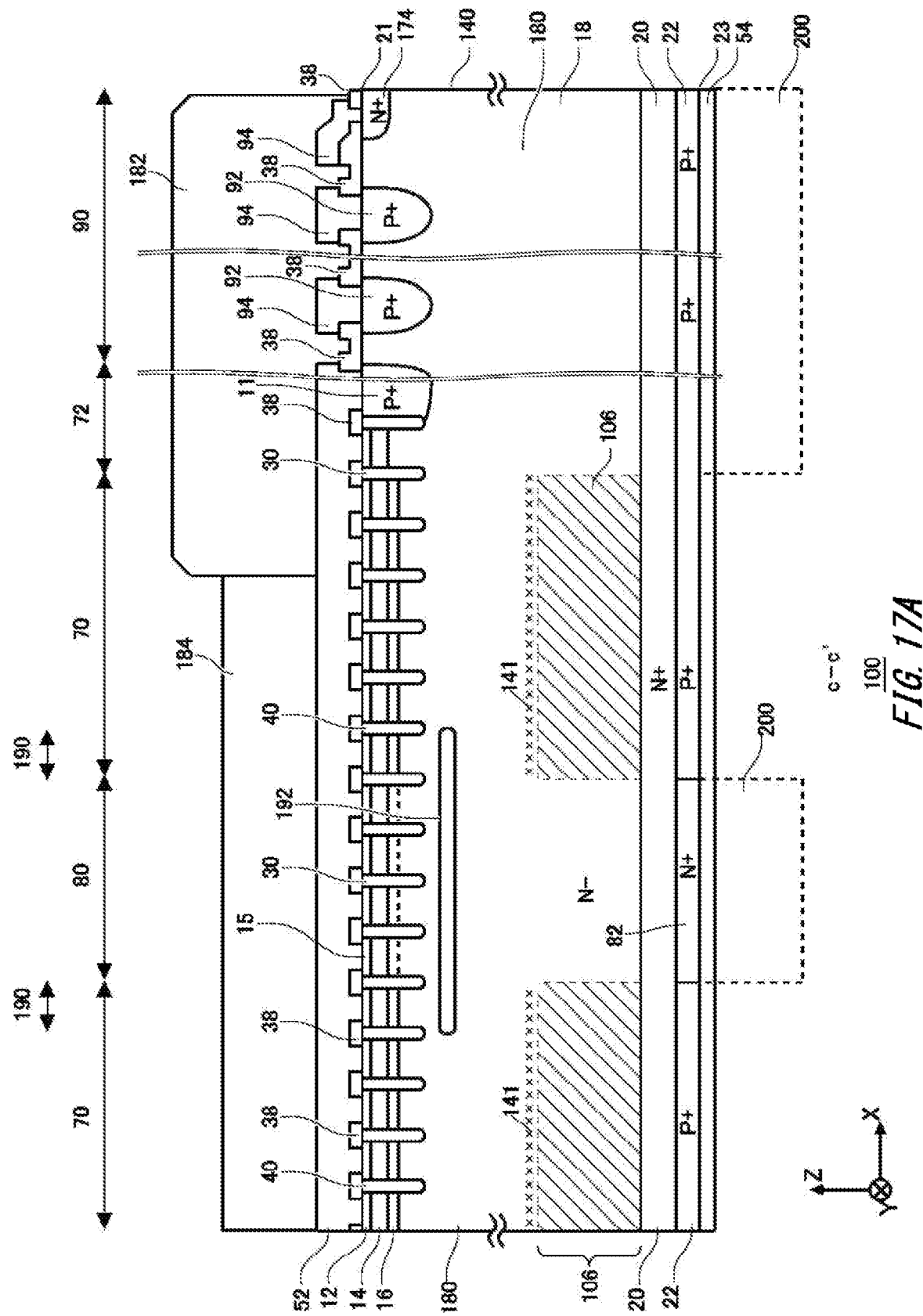
FIG. 17A shows other examples of a placement of a passage region 106.

FIG. 17A is other examples of a placement of a passage region 106. A placement in the depth direction of the passage region 106 of this example is the same as that of the passage region 106 shown in FIG. 13 and a placement in a top view of the passage region 106 of this example is the same as that of the passage region 106 shown in FIG. 16A. That is, the passage region 106 is not provided in the diode section 80.

The passage region 106 is provided in the transistor section 70 from the lower surface 23 of the semiconductor substrate 10 to near the middle of the semiconductor substrate 10 in the depth direction. Moreover, in the example of FIG. 17A, the second hydrogen concentration peak 141 is retreated closer to the lower surface 23 from the bottom surface of the trench section, and at a side closer to the upper surface 21 than the second hydrogen concentration peak 141, the base doped region 180 is formed in the entire surface in a top view.

Figure 17B:
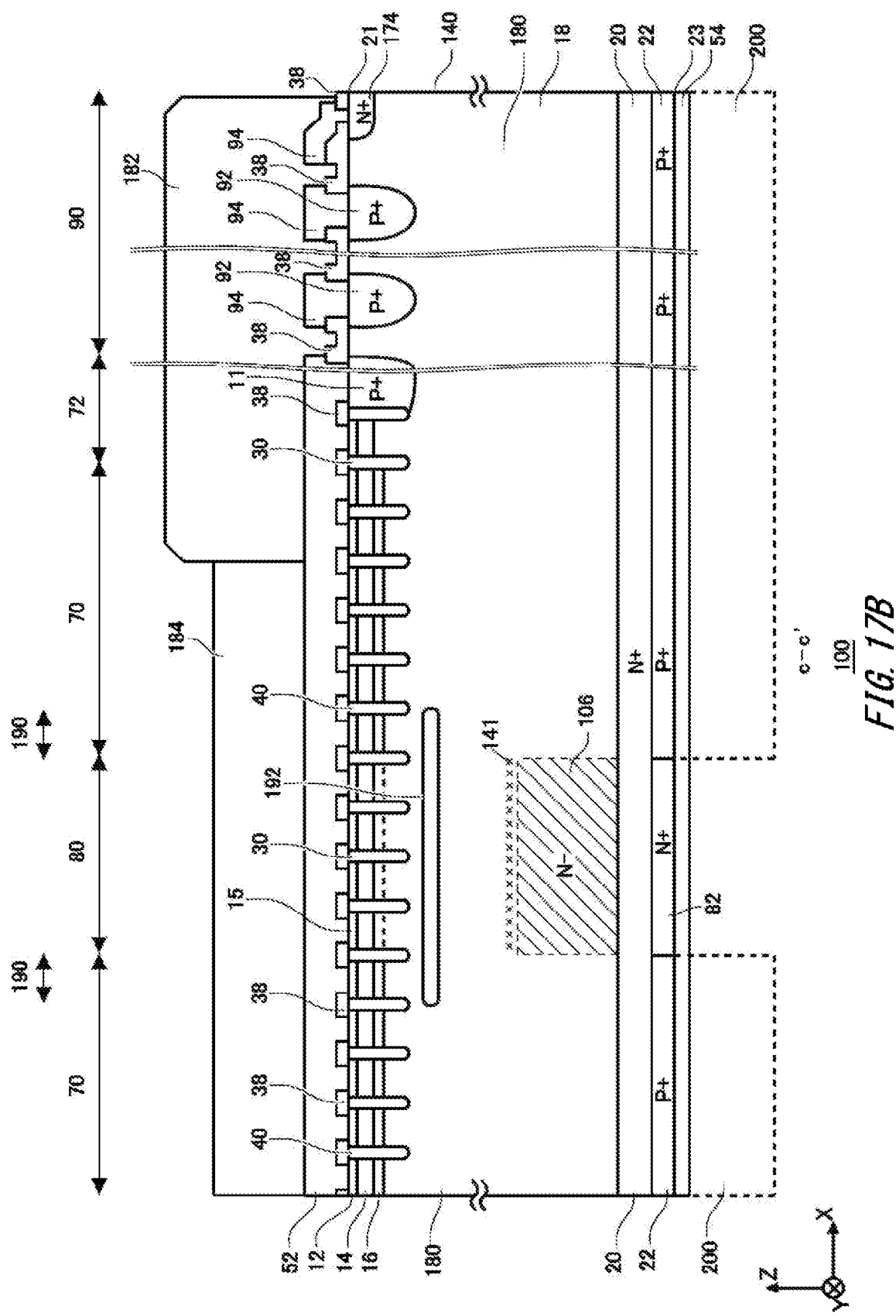
FIG. 17B shows other examples of a placement of a passage region 106.

FIG. 17B is other examples of a placement of a passage region 106. FIG. 17B is an opposite arrangement of the passage region 106 and the base doped region 180 formed in the active section to FIG. 17A. The example of FIG. 17B also achieves similar effects as in FIG. 16B.

In order to form the passage region 106 described with respect to FIGS. 14 to 17B, in a top view, selectively implanting hydrogen ions at a second implanting step S1902 as discussed in later is performed. For example, hydrogen ions can be selectively implanted by using the photoresist film 200 shown in FIGS. 14 to 17B.

In this case, prior to the second implanting step S1902, the photoresist film 200 having a predetermined thickness is selectively formed in a portion of the lower surface 23 of the semiconductor substrate 10. The thickness of the photoresist film 200 is a thickness which can shield hydrogen ions.

After the photoresist film 200 is formed, the second implanting step S1902 is conducted. In an area in which the photoresist film 200 is formed, the photoresist film 200 can shield hydrogen ions. As such, hydrogen ions do not penetrate in the area covered with the photoresist film 200 in the semiconductor substrate 10. In areas in which the photoresist film 200 is not formed, hydrogen ions are implanted to the second depth position Z2 depending on acceleration energies. Note that the photoresist film 200 is formed in contact with the lower surface 23 of the semiconductor substrate 10 in each example of FIGS. 14, 15, 16A, 16B, 17A and 17B. At a step of forming the photoresist film 200, the collector electrode 54 is not yet provided on the lower surface 23.

Figure 17C:
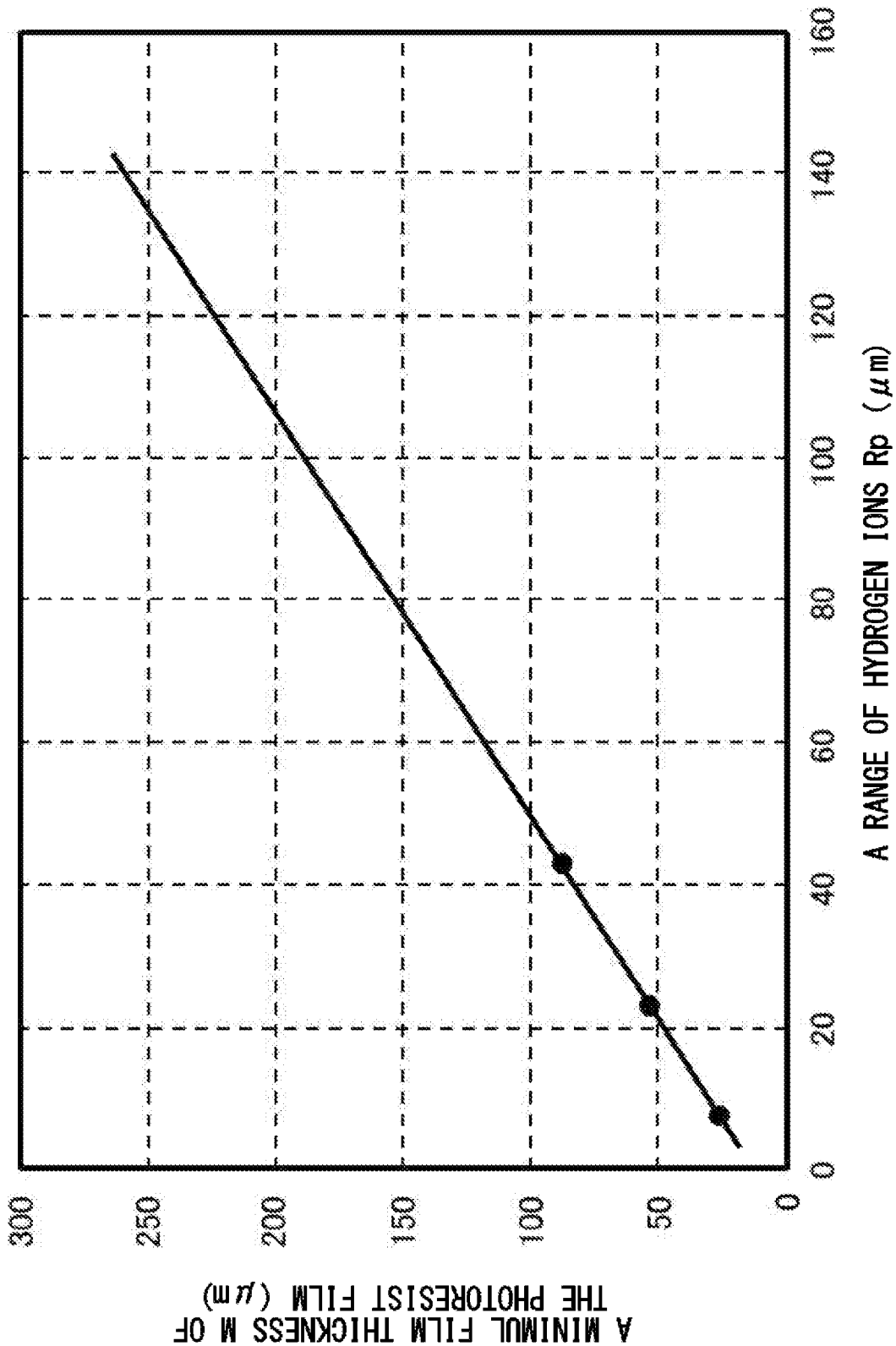
FIG. 17C is a diagram explaining a minimum film thickness M of a photoresist film 200 to prevent hydrogen ions from penetrating in a semiconductor substrate 10.

FIG. 17C is a diagram explaining a minimum film thickness M of a photoresist film 200 to prevent hydrogen ions from penetrating in a semiconductor substrate 10. FIG. 17C shows a film thickness M relative to the range Rp of hydrogen ions.

The hydrogen ions of this example are implanted to the semiconductor substrate 10 from an accelerator not via any absorbers other than the photoresist film 200. The range Rp of the hydrogen ions is uniquely determined by acceleration energy in the accelerator.

Also, the minimum film thickness M of the photoresist film 200 which can shield the hydrogen ions is determined by acceleration energy of the hydrogen ions. Accordingly, the minimum film thickness M of the photoresist film 200 can be represented by the range Rp of the hydrogen ions. FIG. 17C is a diagram showing an approximate straight line connecting three measured points, each of which represents a relation between the range Rp of the hydrogen ions and the film thickness M. The relation between the film thickness M (μm) and the range Rp (μm) can be expressed as follows.

$$M = 1.76 \times Rp + 12.32$$

The thickness of the photoresist film 200 is preferably the same as or greater than the minimum film thickness M expressed by the above expression.

Figure 18A:
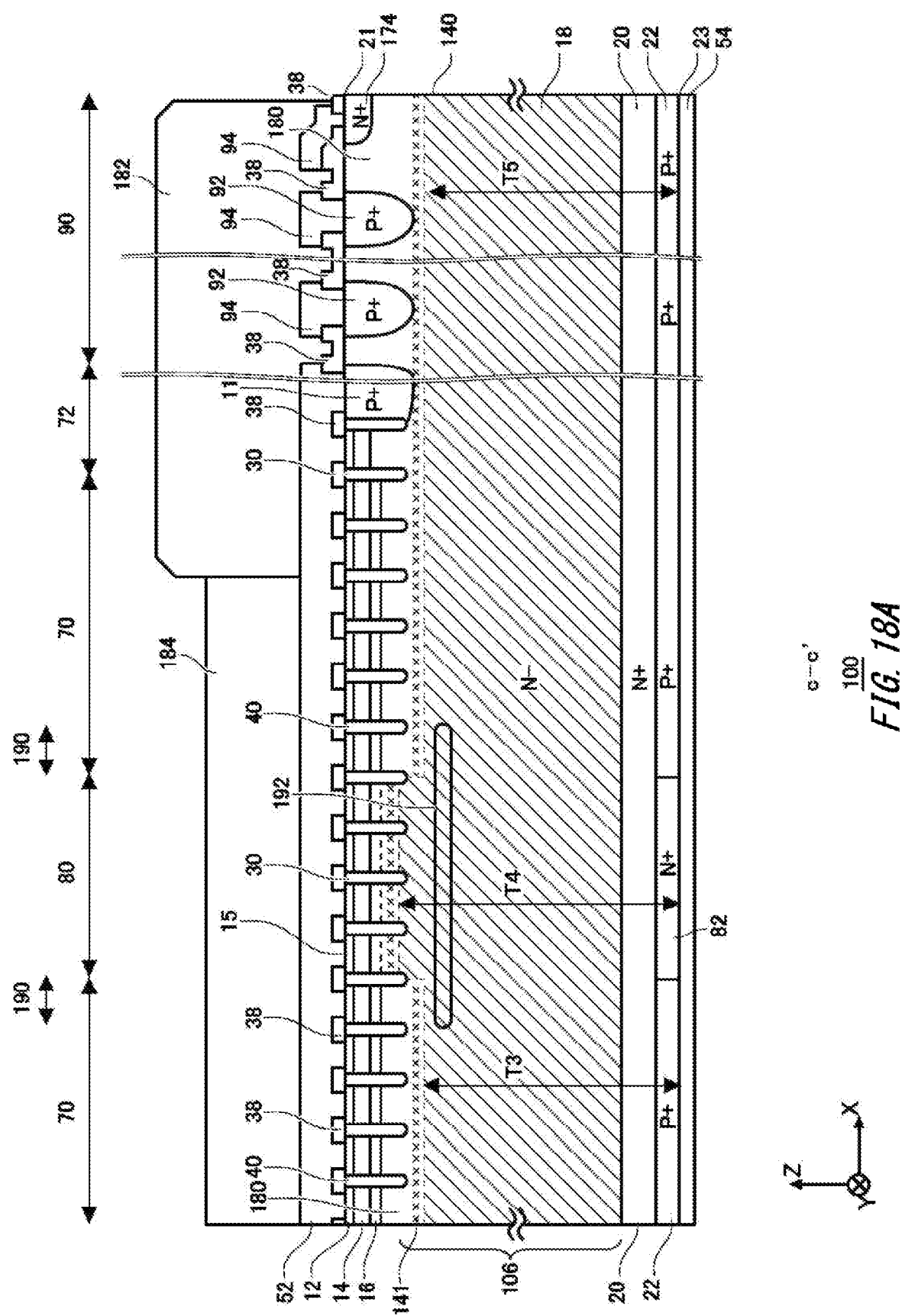
FIG. 18A shows other examples of a placement of a passage region 106.

FIG. 18A is other examples of a placement of a passage region 106. In this example, a width T5 in the depth direction of the passage region 106 provided in the edge termination structure section 90 is smaller than a width T4 in the depth direction of the passage region 106 provided in the active section 120 (the diode section 80 in this example).

In the diode section 80, the second hydrogen concentration peak 141 may be placed between the bottom of the dummy trench section 30 and the upper surface 21 of the semiconductor substrate 10. In the edge termination structure section 90, the second hydrogen concentration peak 141 may be placed between the guard ring 92 and the lower surface 23 of the semiconductor substrate 10. The width T5 of the passage region 106 in the edge termination structure section 90 may be larger than half the thickness T of the semiconductor substrate 10.

Moreover, a width T3 in the depth direction of the passage region 106 provided in the transistor section 70 may be smaller than a width T4 in the depth direction of the passage region 106 provided in the diode section 80. In other words, the base doped region 180 in the transistor section 70 is formed more deeply than the depth of the trench section. That is, the second hydrogen concentration peak 141 in the transistor section 70 is positioned closer to the lower surface 23 than the bottom surface of the trench section. In the transistor section 70, the second hydrogen concentration peak 141 may be placed between the bottom of the gate trench section 40 and the lower surface 23 of the semiconductor substrate 10. The width T3 may be the same as, larger than or smaller than the width T5. The width T3 of the passage region 106 in the transistor section 70 may be larger than half the thickness T of the semiconductor substrate 10. This enables the base region 14 in which a channel is formed to be spaced apart from the second hydrogen concentration peak 141 in the transistor section 70. In this way, increase of the defects near the channel can be suppressed.

The passage region 106 in the boundary section 72 may have the same arrangement as that of the passage region 106 in the edge termination structure section 90, the same arrangement as that of the passage region 106 in the transistor section 70, or the same arrangement as that of the passage region 106 in the diode section 80. Also, in the example of FIG. 18A, the passage region 106 may not be provided in the transistor section 70. The passage region 106 may not be provided in the diode section 80. The passage region 106 may not be provided in the edge termination structure section 90. The passage region 106 may not be provided in the boundary section 72.

Figure 18B:
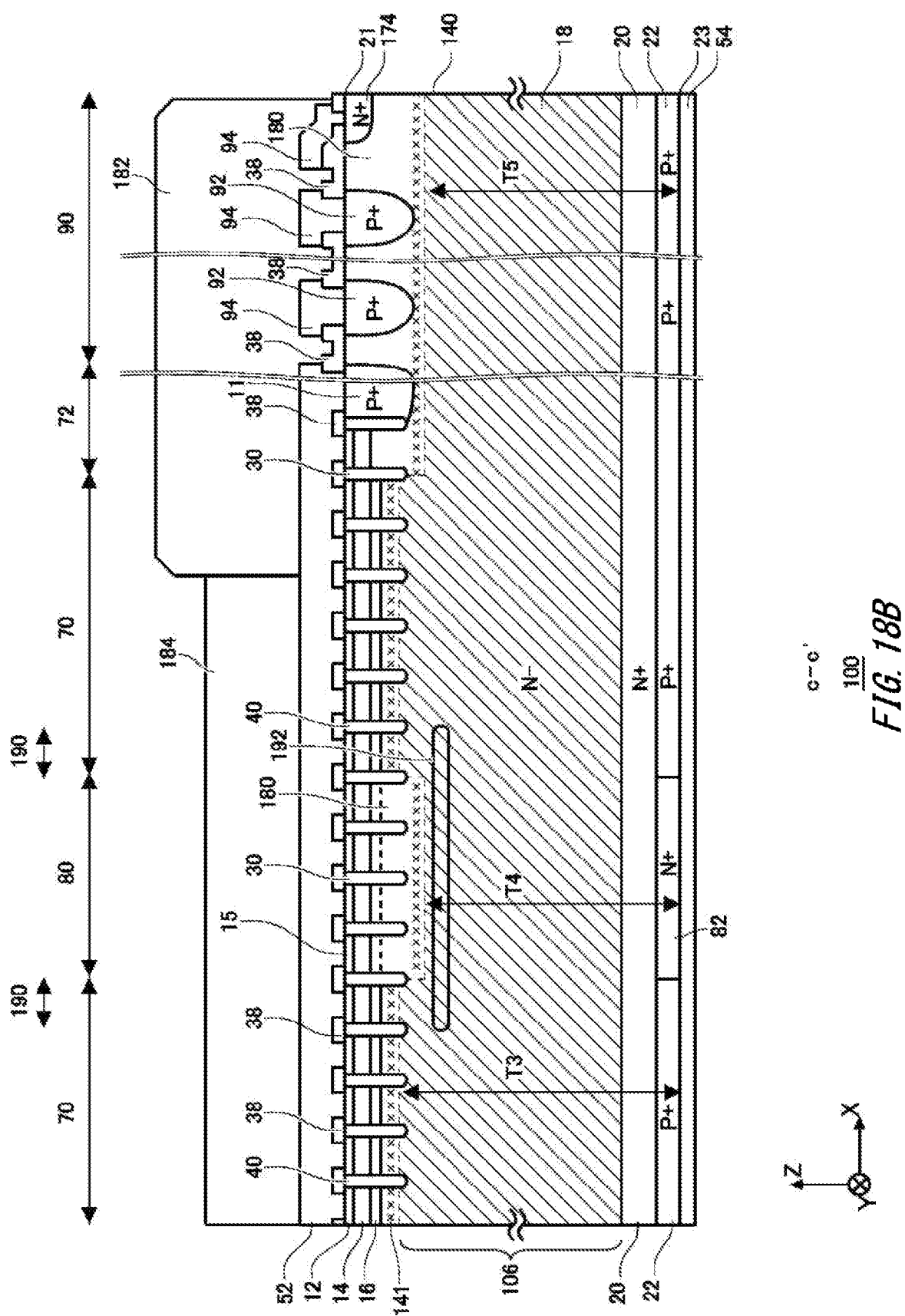
FIG. 18B shows other examples of a placement of a passage region 106.

FIG. 18B is other examples of a placement of a passage region 106. In this example, a width T5 in the depth direction of the passage region 106 provided in the edge termination structure section 90 is smaller than a width T3 in the depth direction of the passage region 106 provided in the active section 120 (the transistor section 70 in this example).

In the transistor section 70, the second hydrogen concentration peak 141 may be placed between the bottom of the gate trench section 40 and the upper surface 21 of the semiconductor substrate 10. Arrangements of the passage region 106 and the second hydrogen concentration peak 141 in the edge termination structure section 90 is similar to the example of FIG. 18A.

A width T4 in the depth direction of the passage region 106 provided in the diode section 80 may be smaller than a width T3 in the depth direction of the passage region 106 provided in the transistor section 70. In other words, the base doped region 180 in the diode section 80 is formed more deeply than the depth of the trench section. That is, the second hydrogen concentration peak 141 in the diode section 80 is positioned closer to the lower surface 23 than the bottom surface of the trench section. In the diode section 80, the second hydrogen concentration peak 141 may be placed between the bottom of the dummy trench section 30 and the lower surface 23 of the semiconductor substrate 10. The width T4 may be the same as, larger than or smaller than the width T5. The width T4 of the passage region 106 in the diode section 80 may be larger than half the thickness T of the semiconductor substrate 10.

The passage region 106 in the boundary section 72 may have the same arrangement as that of the passage region 106 in the edge termination structure section 90, the same arrangement as that of the passage region 106 in the transistor section 70, or the same arrangement as that of the passage region 106 in the diode section 80. Also, in the example of FIG. 18B, the passage region 106 may not be provided in the transistor section 70. The passage region 106 may not be provided in the diode section 80. The passage region 106 may not be provided in the edge termination structure section 90. The passage region 106 may not be provided in the boundary section 72.

As shown in FIGS. 12 to 18B, adjusting an arrangement of the passage region 106 can easily adjust a donor concentration distribution in the transistor section 70, the diode section 80 and the edge termination structure section 90. An arrangement of the passage region 106 is not limited to the examples shown in FIGS. 12 to 18B.

Figure 19:
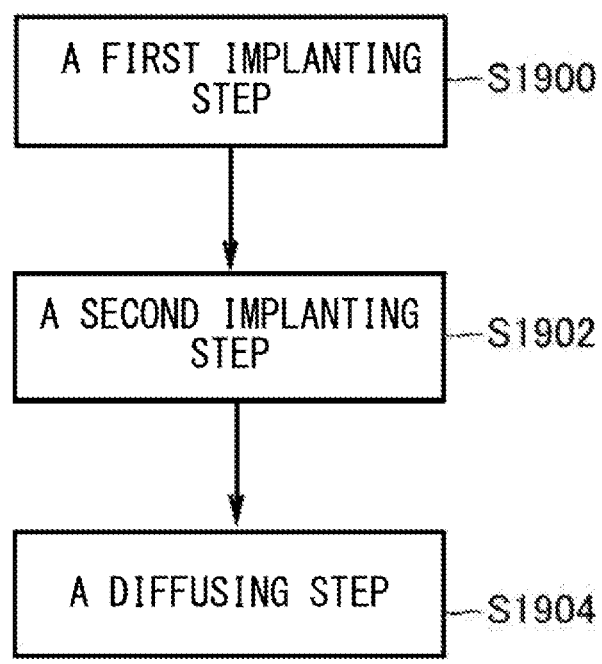
FIG. 19 is a flow diagram for forming a passage region 106 in a method of manufacturing a semiconductor device 100.

FIG. 19 shows a flow diagram for forming a passage region 106 in a method of manufacturing a semiconductor device 100. When the passage region 106 is formed, at the first implanting step S1900, hydrogen ions are implanted to the first depth Z1 from the lower surface 23 of the semiconductor substrate 10. Furthermore, at the second implanting step S1902, the passage region 106 is formed by implanting hydrogen ions to the second depth Z2 from the lower surface 23 of the semiconductor substrate 10. Either the first implanting step S1900 or the second implanting step S1902 may be performed first.

Note that when the first implanting step S1900 is performed first, if a thermal treatment is performed between the first implanting step S1900 and the second implanting step S1902, in some cases, a donor concentration in the passage region 106 could not be increased. In other words, in some cases, if a thermal treatment is performed prior to the forming of the passage region 106, hydrogen implanted at the first implanting step S1900 could not be bonded with the crystal defects in the passage region 106 and could go out of the semiconductor substrate 10. As such, preferably, the thermal treatment is not performed between the first implanting step S1900 and the second implanting step 1902. The thermal treatment is a process of heating the semiconductor substrate 10 at, for example, 300 degrees Celsius or higher.

After the first implanting step S1900 and the second implanting step 1902, a diffusing step S1904 is performed. At the diffusing step S1904, the semiconductor substrate 10 is applied heat treatment to diffuse the hydrogen implanted to the first depth Z1 into the passage region 106. At the diffusing step S1904, the semiconductor substrate 10 may be heated to 300 degrees Celsius or higher. Heating temperature may be 350 degrees Celsius or higher. At the diffusing step S1904, the semiconductor substrate 10 may be heated for one hour or longer, or three hours or longer.

At the diffusing step S1904, the hydrogen is diffused to result in bonding of a crystal defect and hydrogen in the passage region 106 then to be a donor. In this way, a donor concentration in the passage region 106 can be increased. At the diffusing step S1904, a minimum value of a donor concentration in the passage region 106 is preferably higher than the donor concentration (the base doping concentration) of the semiconductor substrate 10 prior to the first and second implanting steps S1900, S1902. In other words, the donor concentration is preferably higher than the base doping concentration in the entire passage region 106.

In order to increase the donor concentration in the entire passage region 106, it is preferable to diffuse the hydrogen implanted to the first depth position Z1 into near the second depth position Z2. At the first implanting step S1900, a sufficient amount of hydrogen can be diffused into near the second depth position Z2 by tuning a dose of hydrogen implanted to the first depth position Z1. At the first implanting step S1900, it is preferable to determine a dose of hydrogen such that a minimum value of the donor concentration in the passage region 106 is higher than the base doping concentration.

When multiple hydrogen donor peaks 24 shown in FIG. 9, etc are formed in the buffer region 20, hydrogen ion implantation may be performed several times in addition to the hydrogen ion implantation at the first implanting step S1900 and the second implanting step S1902. Several hydrogen ion implantations to form the peaks 24 may be performed at the first implanting step S1900 or the second implanting step S1902. In other words, the first implanting step S1900 may be performed several times, or the second implanting step S1902 may be performed several times. Moreover, the first implanting step S1900 and the second implanting step S1902 may be performed several times, respectively.

If hydrogen ion implantation is performed several times at the second implanting step S1902, the photoresist film 200 having a thickness depending on the respective ranges Rp of the hydrogen ions (see FIG. 14, etc.) may be formed. Alternatively, the photoresist film 200 having a thickness sufficiently thicker than a minimum film thickness M corresponding to the deepest range Rpmax (see FIG. 17C) in the hydrogen ion implantations at several times may be formed. Hydrogen ion implantation may be performed by using the photoresist film 200 having a film thickness M at an acceleration energy corresponding to each of the ranges Rps. The thickness of the photoresist film 200 may be twice or more the minimum film thickness M corresponding to the deepest range Rpmax. In this way, it can reduce the number of times the photoresist film 200 is formed while ensuring durability of the photoresist film 200 against the hydrogen ion implantations at several times.

FIGS. 20 to 26 are diagrams explaining how to determine a dose of hydrogen ions to be implanted to the first depth Z1 (referred to as a first dose). At the first implanting step S1900 of this example, a dose of hydrogen greater than or equal to a minimum dose determined by a diffusion coefficient of hydrogen in the semiconductor substrate 10 and a position of the second depth Z2 (i.e., a distance for the hydrogen implanted to the first depth position Z1 be diffused) is implanted.

Figure 20:
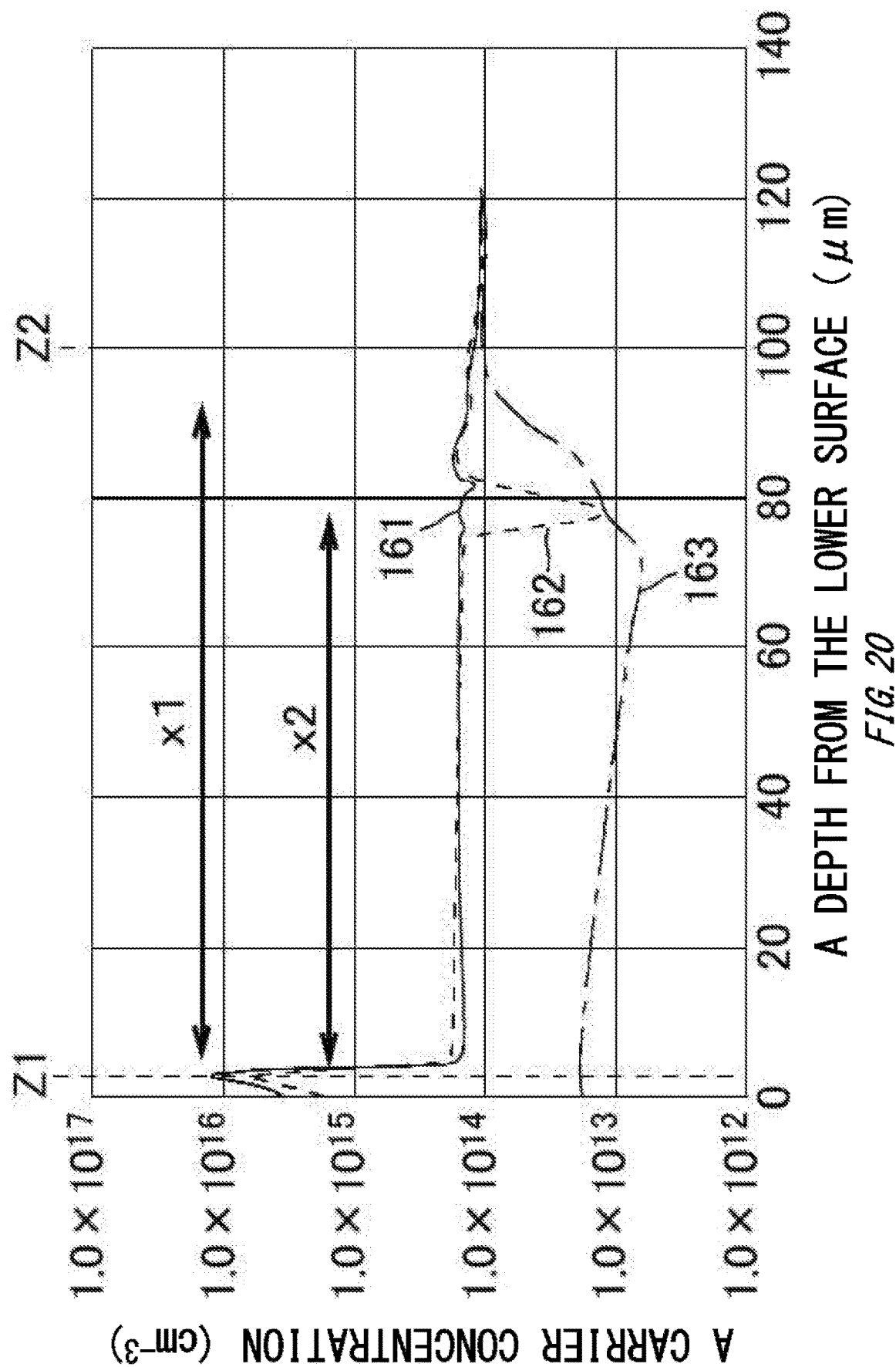
FIG. 20 shows an example of a carrier concentration distribution in a semiconductor substrate 10 after a diffusing step S1904.

FIG. 20 shows an example of a carrier concentration distribution in a semiconductor substrate 10 after a diffusing step S1904. The carrier concentration distribution in FIG. 20 can be obtained by, for example, Spread Resistance Profiling. In each of FIGS. 20 to 26, the lower surface 23 of the semiconductor substrate 10 shall be a reference position (0 μm) in the depth (m). Moreover, the first depth Z1 is at most 10 μm. Or, the first depth Z1 may be treated as 0 μm.

In FIG. 20, carrier concentrations of three types of semiconductor substrates 10 are shown. A first example 161 and a second example 162 are examples in which hydrogen ions are implanted to the first depth Z1 and the second depth Z2 and a third example 163 is an example in which hydrogen ions are implanted only to the second depth Z2. In each example, a dose of hydrogen ions to the second depth Z2 (referred to as a second dose) was $1\times10^{13}/cm^2$. Also, a range of hydrogen ions to the second depth Z2 was 100 μm and acceleration energy was 3.1 Mev. The range of hydrogen ions may be tuned by acceleration energy, or may be tuned by an aluminum absorber and the like.

In the first example 161 and the second example 162, acceleration energy of hydrogen ions to the first depth Z1 was 400 keV. In the first example 161, the first dose was $1\times10^{15}/cm^2$. In the second example 162, the first dose was $3\times14/cm^2$.

After the hydrogen ions are implanted, the semiconductor substrates 10 of the respective examples were annealed for five hours at 370 degrees Celsius in the same annealing furnace. FIG. 20 shows carrier concentration distributions after annealing. In each example, crystal defects are formed in the passage region 106 (within the range of the lower surface 23 of the semiconductor substrate 10 to the second depth position Z2) before annealing. As such, the carrier concentrations in the passage region 106 are reduced.

After annealing, the carrier concentrations increase due to a donor formation produced by bonding of hydrogen and the crystal defects. However, in the third example 163, because hydrogen is not implanted to the first depth Z1, the carrier concentration barely increases. As shown in the first example 161 and the second example 162, the more the first dose increases, the more the carrier concentrations in the passage region 106 rise.

It should be noted that in the second example 162, a valley of the carrier concentration is generated at a position (near 80 μm of depth) shallower than the second depth Z2. This can be understood due to that when the hydrogen implanted to the first depth Z1 was diffused in the depth direction, a concentration of the diffusing hydrogen was not enough and a sufficient concentration of hydrogen was not diffused into a position deeper than x2. On the other hand, in the first example 161, the carrier concentration is higher than the base doping concentration ($1.0\times10^{14}/cm^3$ in this example) in the entire range of the passage region 106 from the depth 0 μm to the second depth Z2. This can be understood due to that when the hydrogen implanted to the first depth Z1 was diffused in the depth direction, the concentration of the diffusing hydrogen was enough and a sufficient concentration of hydrogen was diffused into a position deeper than x1.

Assuming that the first dose being Q, a diffusing depth of hydrogen from the first depth Z1 being x (x1, x2) (cm), a diffusion coefficient of hydrogen being D ($cm^2/s$), a diffusing time being t (s), and the base doping concentration of the semiconductor substrate 10 being $C_0$ (atoms/$cm^3$), these relations can be expressed by the following expression (1).

$$x = \sqrt{4Dt \ln\left(\frac{Q}{C_0\sqrt{\pi Dt}}\right)} \quad (1)$$

The expression (1) is a value calculated from a solution of a diffusion equation. A solution in which the diffusion equation is solved under a boundary condition in which a total amount of hydrogen is constant becomes a Gaussian distribution. In the solution of the Gaussian distribution obtained, x when a concentration C (x, t) matches the base doping concentration $C_0$ is the equation (1).

The diffusion coefficient D of hydrogen in the semiconductor substrate 10 can be numerically calculated by the equation (1). The diffusion depth x in the second example 162 can be determined according to a profile shape of FIG. 20. For example, for the diffusion depth x, a distance from the first depth positon Z1 to the first inflection point at a valley of the carrier concentration can be used. Alternatively, for the diffusion depth x, a distance from the first depth positon Z1 to a position where the carrier concentration falls below the base doping concentration for the first time can be used. For the first example 161 in FIG. 20, $Q=1\times10^{15}/cm^2$, t=5 h ($=1.8\times10^3$s), x1=85 μm ($=8.5\times10^{-3}$ cm), and $C_0=1\times10^{14}/cm^3$. For the second example 162, $Q=3\times10^{14}/cm^2$, t=5 h ($=1.8\times10^3$s), x2=75 μm ($=7.5\times10^{-3}$ cm), and $C_0=1\times10^{14}/cm^3$.

The crystal defects formed when the hydrogen ions are implanted to the second depth Z2 are various types of defects such as a point defect, transition and the like. Among point defects, vacancy type defects including a vacancy and a divacancy are formed. In this case, a concentration of the crystal defects has a peak at a position slightly closer to an ion implantation surface (the lower surface 23 of the semiconductor substrate 10) from the second depth Z2. Because the hydrogen ions implanted to the first depth Z1 are bonded with the crystal defects, the diffusion depth x1 of hydrogen of the first example 161 has a value (85 μm in this example) slightly smaller than the second depth Z2 (100 μm).

Figure 21:
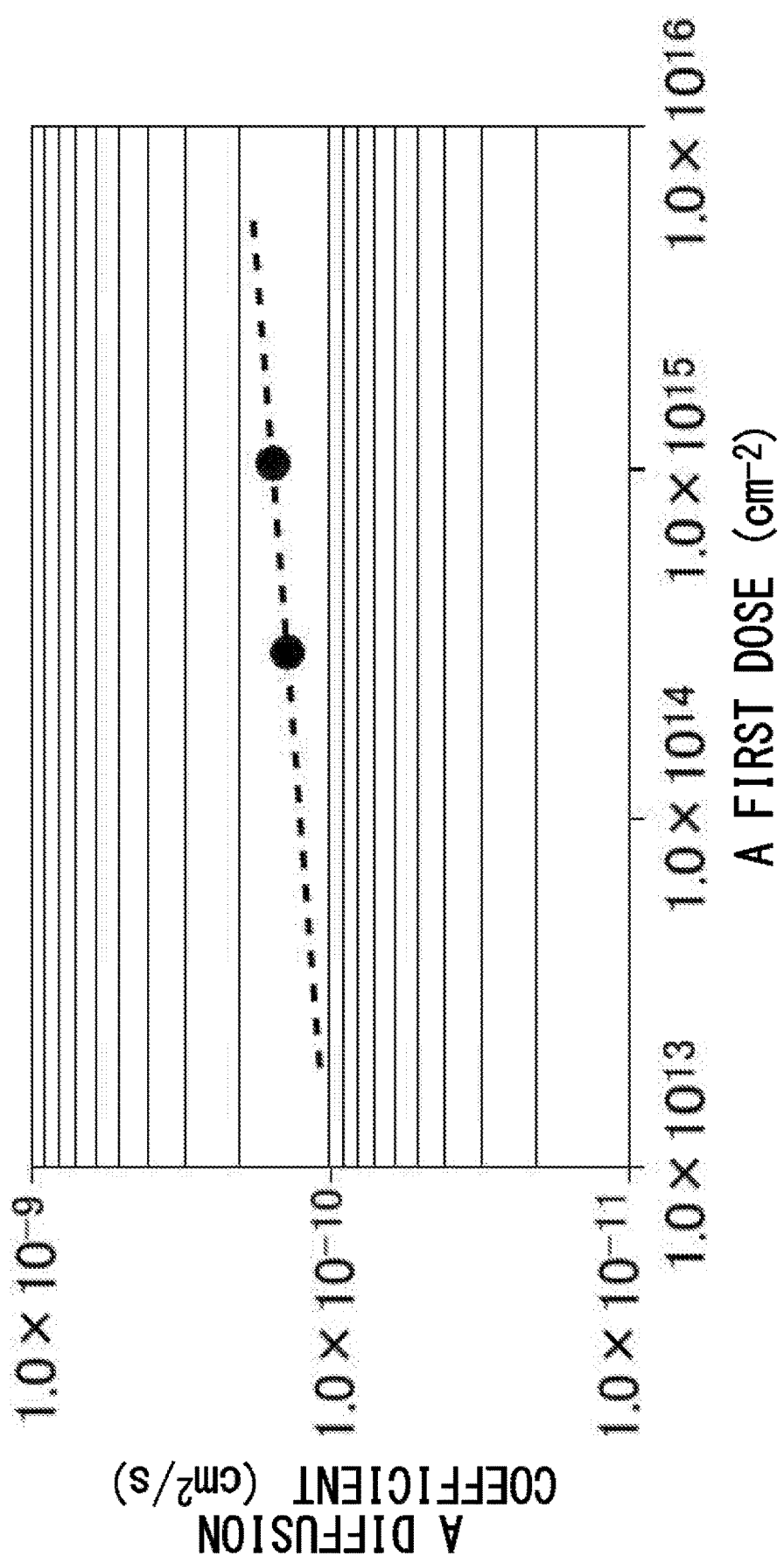
FIG. 21 shows a relation between a diffusion coefficient D of hydrogen and a first dose Q.

FIG. 21 shows a relation between a diffusion coefficient D of hydrogen and a first dose Q. In FIG. 21, the first example 161 and the second example 162 shown in FIG. 20 are respectively plotted. Dependency of the diffusion coefficient D on the first dose Q is not relatively strong. On the other hand, the more the first dose Q increases, the slightly more the diffusion coefficient D increases. The hydrogen implanted to the first depth Z1 is diffused toward the second depth Z2 while terminating dangling bonds in the passage region 106. It can be understood that the hydrogen easily diffuses since as the first dose Q increases, the more ratio of the hydrogen diffusing in areas where the dangling bonds are terminated increases. It should be noted that a value of the diffusion coefficient D can vary depending on experimental conditions, etc. For the diffusion coefficient D shown in FIG. 21, at least ±50% of error can be permitted. At least ±100% of error can also be permitted.

Figure 22:
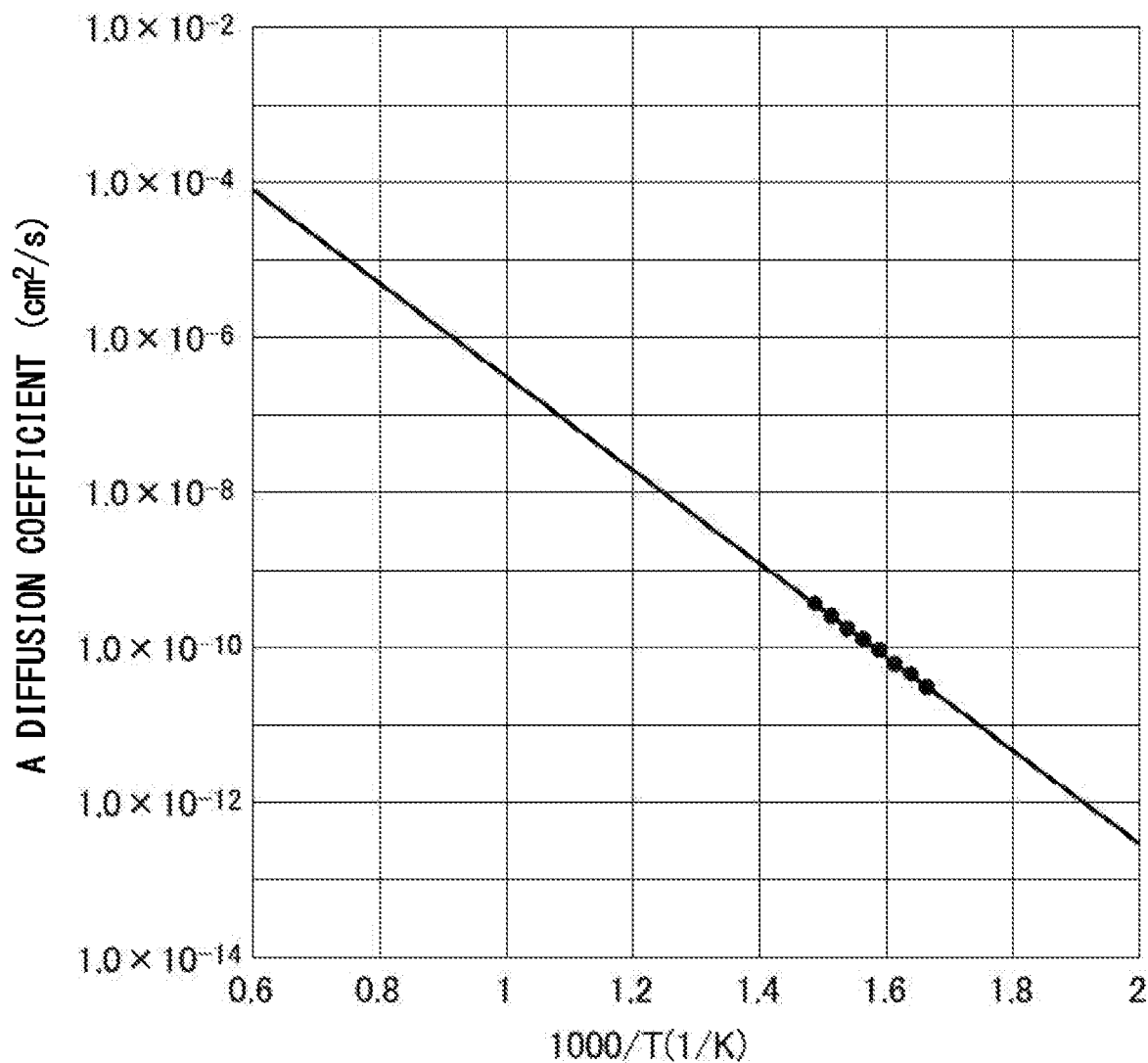
FIG. 22 shows a relation between a diffusion coefficient D and an annealing temperature T.

FIG. 22 shows a relation between a diffusion coefficient D and an annealing temperature T. FIG. 22 shows a chart in which the diffusion coefficients described in FIGS. 20 and 21 are obtained relative to several annealing temperatures T and they are arrhenius plotted. In this example, the first dose is $Q=1\times10^{15}/cm^2$.

The diffusion coefficient D is expressed by $D=D_0 \exp(-Ea/k_BT)$. $D_0$ is a constant, Ea is activation energy, and $k_B$ is a Boltzmann constant. According to the chart of FIG. 22, $D_0=0.33237$ ($cm^2/s$), Ea=1.204 (eV). According to this, the diffusion coefficient of hydrogen in the semiconductor substrate 10 can be calculated.

Figure 23:
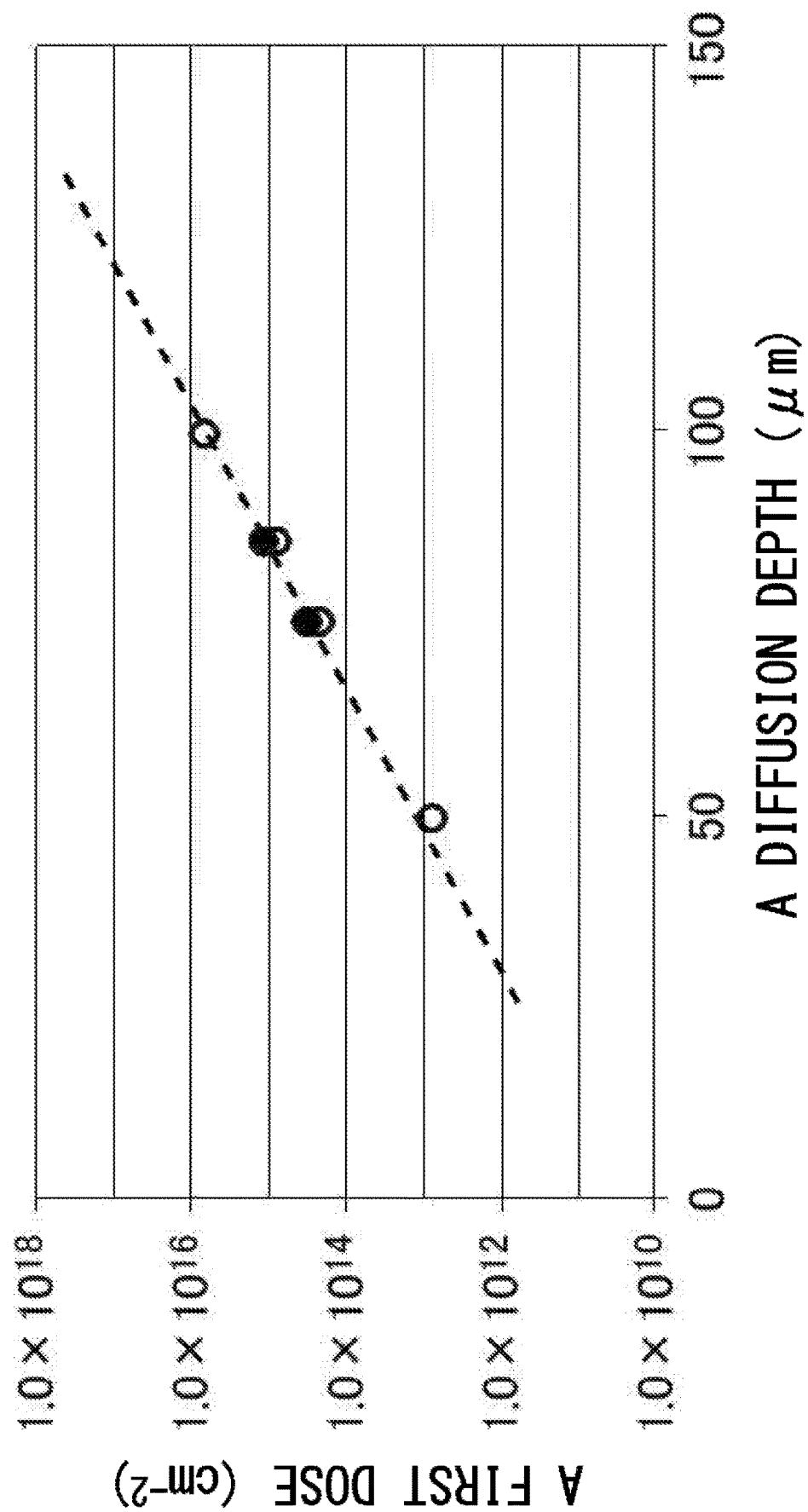
FIG. 23 shows a relation between a diffusion depth of hydrogen and a first dose.

FIG. 23 shows a relation between a diffusion depth of hydrogen and a first dose. In FIG. 23, the first example 161 and the second example 162 shown in FIG. 20 are plotted with black bullets. As described with respect to FIG. 20, for the first example 161, the first dose is $Q=1\times10^{15}/cm^2$ and the diffusion depth is x1=85 μm. Also, for the second example 162, the first dose is $Q=3\times10^{14}/cm^2$ and the diffusion depth is x2=75 μm.

As shown in FIG. 23, connecting the plot of the first example 161 and the plot of the second example 162 with a straight line can determine a first dose for respective diffusion depths x. In other words, the straight line indicates a minimum first dose for respective diffusion depths x. At the first implanting step S1900, setting a first dose greater than this straight line enables the entire donor concentration in the passage region 106 to be higher than the base doping concentration. As one example, a first dose Q (ions/cm$^2$) may meet the following equation when the second depth Z2 is a diffusion depth x (μm).

$$Q \geq 2.6186 \times 10^{10} \times e^{0.12412x}$$

It should be noted that in this example, unit for x is (μm).

As described above, when hydrogen ions are implanted to the second depth Z2, a peak of a crystal defect concentration is provided at a position slightly shallower than the second depth Z2. The horizontal axis in FIG. 23 corresponds to peak positions of a crystal defect concentration. As such, when forming the passage region 106 having a length X0 corresponding to the horizontal axis of FIG. 23, hydrogen ions are implanted to the second depth Z2 according to a range Rp in the following equation taken a straggling ΔRp during ion implantation into consideration.

$$Rp \geq X0 + \Delta Rp$$

The passage region 106 can be formed substantially entirely in the depth direction of the semiconductor substrate 10 by setting a peak position of a crystal defect concentration (a positon of a length X0 from the lower surface 23) closer to the upper surface 21 than the bottom of the trench section provided on the upper surface 21 of the semiconductor substrate 10.

A minimum dose can be calculated based on the following equation (2) which is a variation of the equation (1).

$$Q = C_0 \sqrt{\pi D t} \, e^{\frac{x^2}{4Dt}} \quad (2)$$

The diffusion coefficient D is calculated according to the method described in FIG. 22. In FIG. 23, the minimum doses calculated from the equation (2) are potted with white bullets. It should be noted that because the diffusion coefficient D has a squared dimension of distance, the diffusion coefficient D can be expressed by a function of the diffusion depth x of hydrogen.

Figure 24:
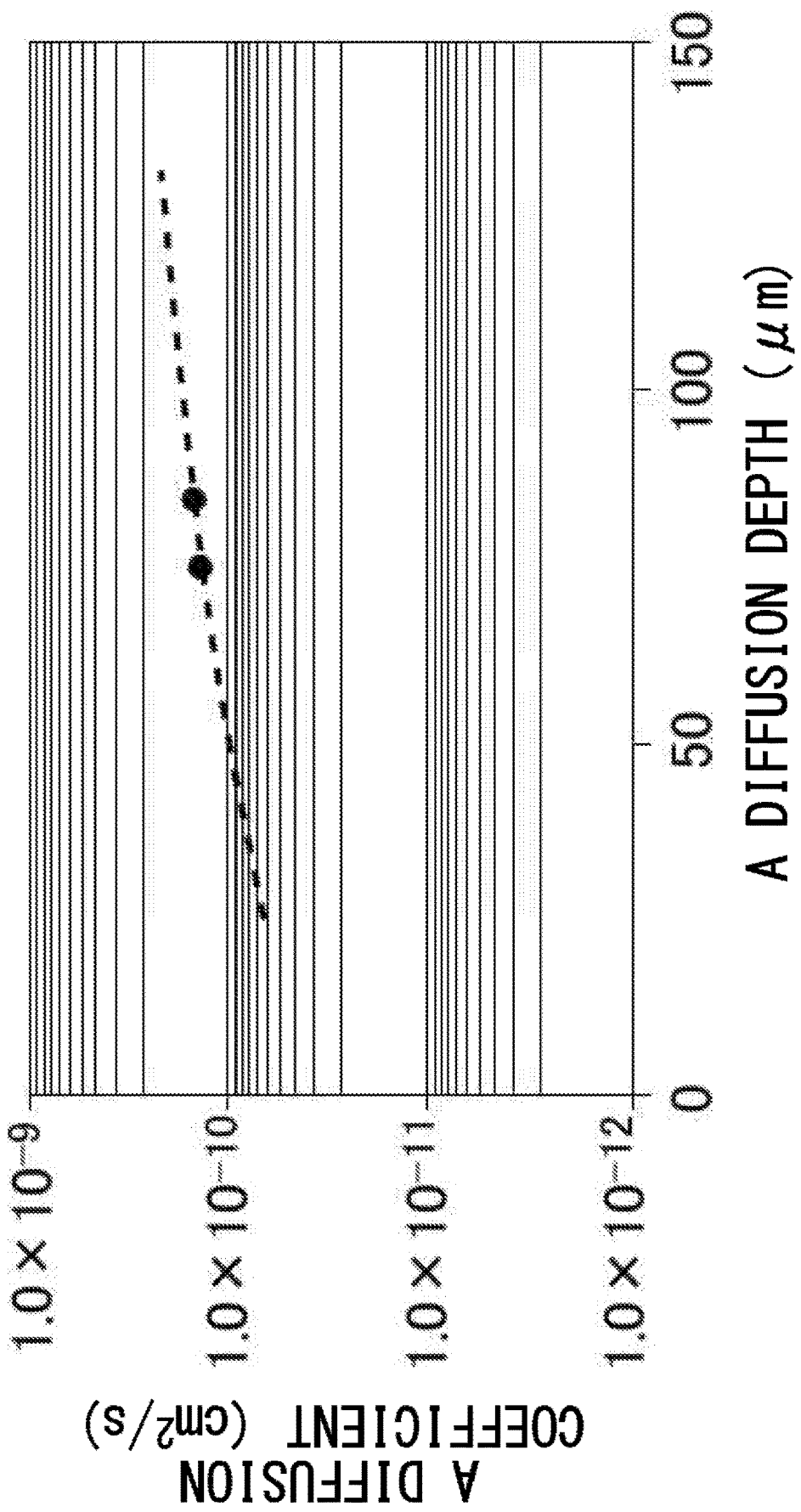
FIG. 24 shows a relation between a diffusion coefficient D and a diffusion depth x.

FIG. 24 shows a relation between a diffusion coefficient D and a diffusion depth x. In FIG. 24, the first example 161 and the second example 162 shown in FIG. 20 are plotted. As shown in FIG. 24, the more the diffusion depth x increases, the more the diffusion coefficient D increases.

As the diffusion depth x increases, a distance from the first depth Z1 to a peak of a crystal defect concentration increases. As such, a ratio of areas in which the crystal defects are relatively few in the passage region 106 increases. Since the larger the diffusion coefficient is, the fewer the crystal defects are, as the diffusion depth x increases, the average diffusion coefficient in the passage region 106 is larger.

Note that the second dose is $1 \times 10^{13}$/cm$^2$ in FIGS. 20 to 24. However, if the second dose is changed, a minimum dose of the first dose can be determined according to the similar way. Also, a donor concentration in the passage region 106 can be tuned by tuning the second dose. A concentration of the crystal defects formed in the passage region 106 can be tuned by tuning the second dose. Also, although the annealing temperature is set to 370 degrees Celsius, if the annealing temperature is changed, a minimum dose can be determined according to the equation (2).

Figure 25:
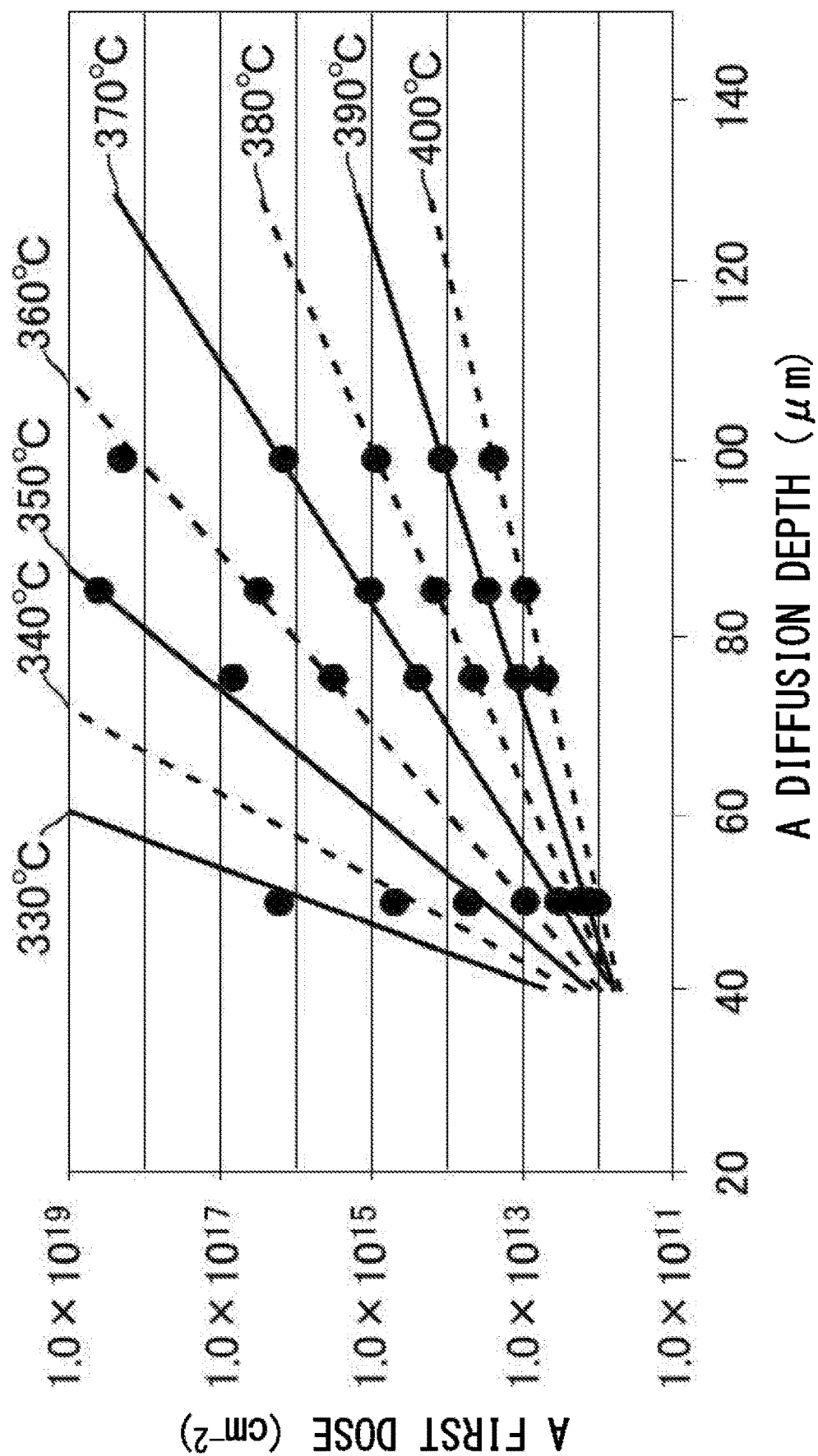
FIG. 25 shows straight lines defining a minimum dose for each annealing temperature.

FIG. 25 shows straight lines defining a minimum dose for each annealing temperature. In this example, the diffusion coefficient D is constant irrespective of the diffusion depth. At the first implanting step S1900, a dose of hydrogen ions higher than the minimum doses indicated by the respective straight lines of FIG. 25 may be implanted to the first depth Z1.

Figure 26:
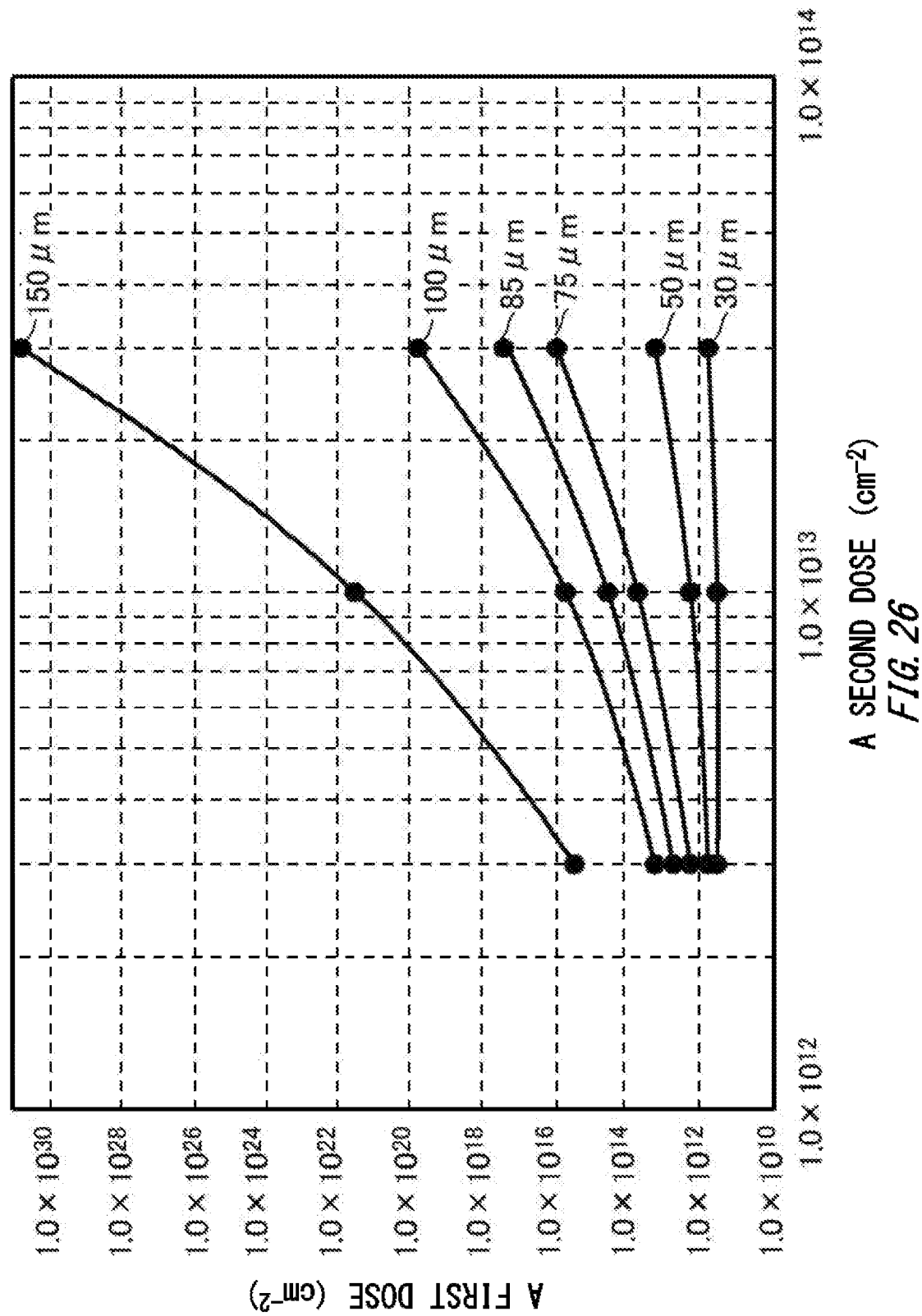
FIG. 26 shows a relation between a second dose and a minimum dose of a first dose.

FIG. 26 shows a relation between a second dose and a minimum dose of a first dose. In this example, the relation is indicated for each of the diffusion depths x. At the first implanting step S1900, a dose of hydrogen ions higher than the minimum doses indicated by the respective curve lines of FIG. 26 may be implanted to the first depth Z1.

Figure 27:
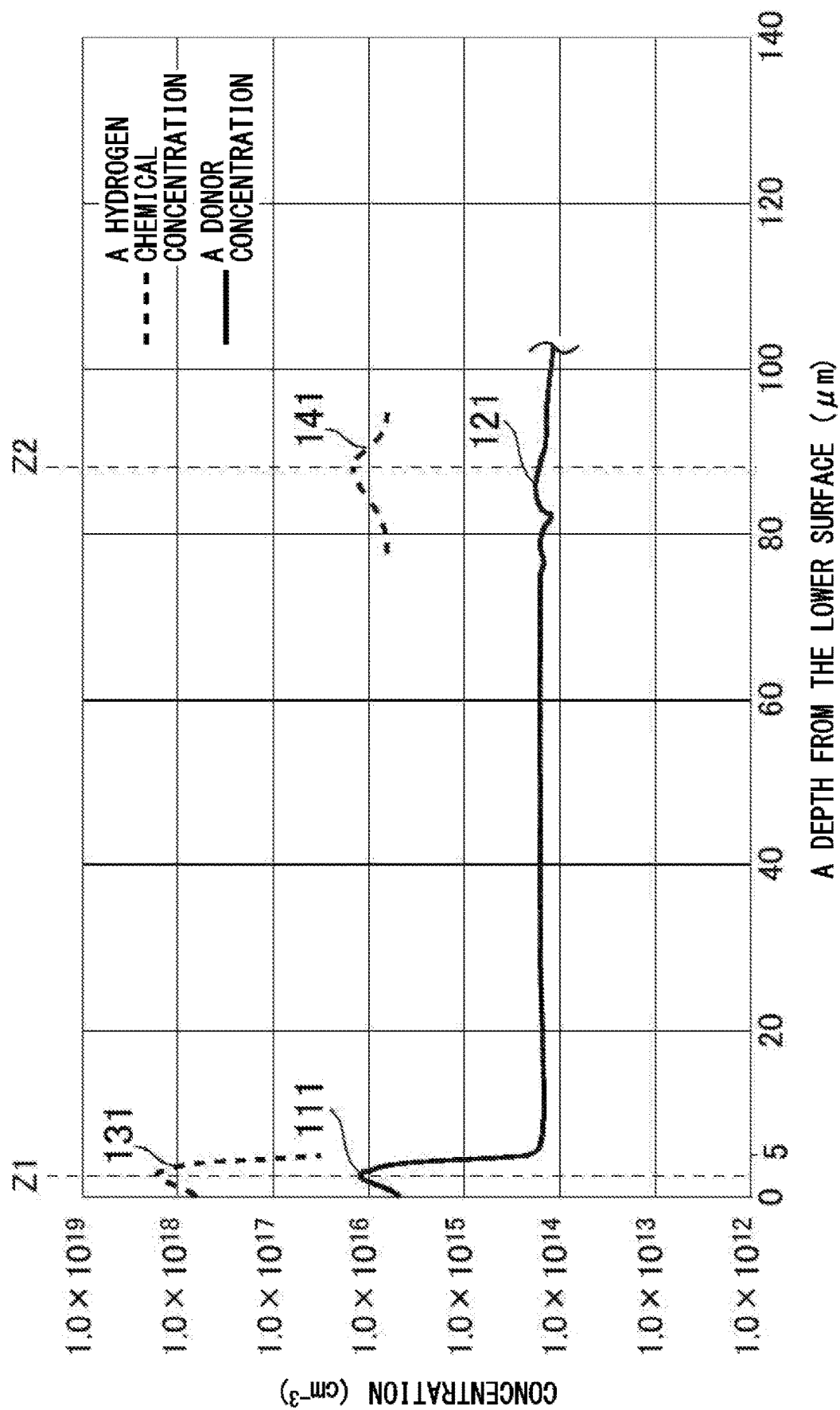
FIG. 27 is a diagram explaining an example of a first depth Z1.

FIG. 27 is a diagram explaining an example of a first depth Z1. In FIG. 27, a donor concentration distribution and a hydrogen chemical concentration distribution in the depth direction of a semiconductor substrate 10 are shown. For the hydrogen chemical concentration distribution, only the distribution near the peaks is schematically indicated. In FIG. 27, the distributions near the upper surface 21 of the semiconductor substrate 10 (an area of a distance of 100 μm or more from the lower surface 23) are omitted. Moreover, a carrier concentration distribution in an N type region of the semiconductor substrate 10 may be used as the donor concentration distribution.

In this example, the first depth Z1 of the first hydrogen concentration peak 131 is included within the range of 5 μm or less from the lower surface 23 of the semiconductor substrate 10 in the depth direction. In the semiconductor device 100, arrangements other than the first depth Z1 are the same as any aspects described with respect to FIGS. 1 to 26. The donor concentration distribution of the semiconductor device 100 of this example is similar to that of the example of FIG. 10.

Placing the first depth Z1 near the lower surface 23 can widen a distance from the first depth Z1 to the second depth Z2. As such, in a wider range in the semiconductor substrate 10, the donor concentration can be tuned accurately. The first depth Z1 may be included in the range of 4 μm or less from the lower surface 23, or the range of 3 μm or less from the lower surface 23.

In order to diffuse hydrogen into a wider range, it is preferable to increase a dose of hydrogen implanted to the first depth Z1. In this example, a dose of hydrogen to be implanted to the first depth Z1 may be at least $1 \times 10^{15}$ atoms/cm$^2$, at least $1 \times 10^{16}$ atoms/cm$^2$, at least $1 \times 10^{17}$ atoms/cm$^2$, or at least $1 \times 10^{18}$ atoms/cm$^2$. At the first depth Z1, the first donor concentration peak 111 by a hydrogen donor may be formed. The donor concentration of the first donor concentration peak 111 may be at least $1 \times 10^{15}$/cm$^3$, or at least $1 \times 10^{16}$/cm$^3$. The donor concentration of the first donor concentration peak 111 may be at most $1 \times 10^{17}$/cm$^3$.

Hydrogen implantation to the first depth Z1 may be performed by plasma doping. In the plasma doping, a gas for plasma excitation and a raw material gas including hydrogen are to be supplied in a container containing the semiconductor substrate 10. The gas for plasma excitation may include inert elements such as argon. For the raw material gas, for example, phosphine (PH$_3$) may be used. By producing plasma by using these gases in the container and then exposing the lower surface 23 of the semiconductor substrate 10 in the plasma, a high concentration of hydrogen can be easily implanted to a shallow position from the lower surface 23. Moreover, implanting the hydrogen to the shallow position near the lower surface 23 by using the plasma doping can suppress crystal defects to be generated in the semiconductor substrate 10. Furthermore, an annealing temperature can be reduced due to few crystal defects, so a throughput can be improved for manufacturing the semiconductor device 100. However, a way of implanting hydrogen to the first depth Z1 is not limited to the plasma doping.

Hydrogen implantation to the second depth Z2 of the second hydrogen concentration peak 141 may be performed by other ways other than the plasma doping. Hydrogen may be implanted to the second depth Z2 by accelerating the hydrogen ions by electric field and the like. The second depth position Z2 may be 80 µm or more away from the lower surface 23 in the depth direction. The second depth position Z2 may be 90 µm or more or 100 µm or more away from the lower surface 23. A distance between the first depth position and the second depth position in the depth direction may be 50% or more, 65% or more, or 80% or more of the thickness of the semiconductor substrate 10 in the depth direction.

Figure 28:
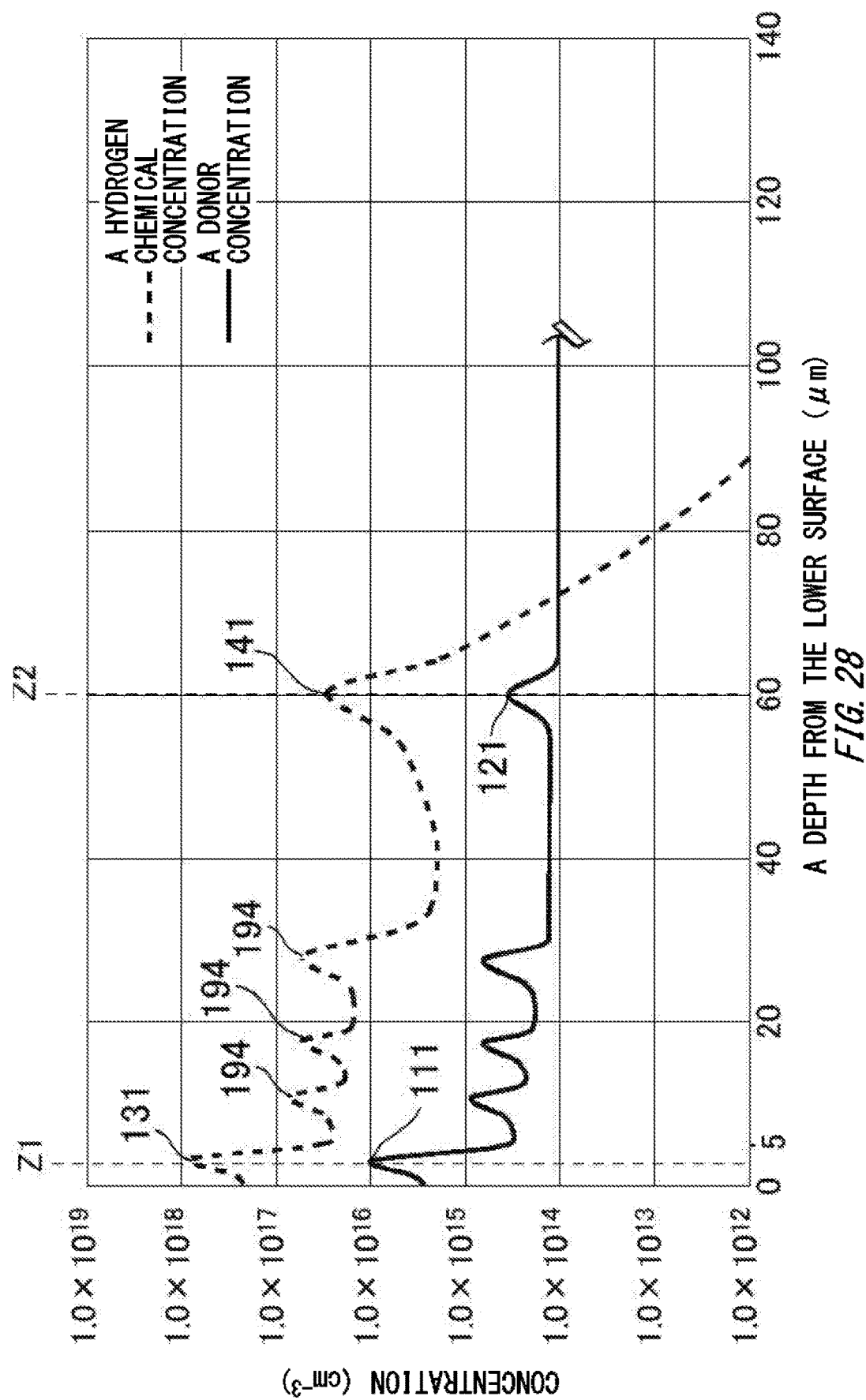
FIG. 28 shows another example of a donor concentration distribution and a hydrogen chemical concentration distribution in the depth direction of a semiconductor substrate 10.

FIG. 28 shows another example of a donor concentration distribution and a hydrogen chemical concentration distribution in the depth direction of a semiconductor substrate 10. The first depth Z1 of this example is the same as in the example of FIG. 27. Moreover, the second depth Z2 may be placed closer to the upper surface 21 of the semiconductor substrate 10. "Closer to the upper surface 2" refers to an area from the middle in the depth direction to the upper surface 21 of the semiconductor substrate 10.

In either example of FIG. 27 or 28, the hydrogen chemical concentration distribution may have one or more hydrogen concentration peaks 194 between the first depth Z1 and the second depth Z2. The hydrogen concentration peaks 194 may be placed in the buffer region 20 as described in FIG. 6, etc. The first hydrogen concentration peak 131 may be placed in the buffer region 20, or may be placed between the buffer region 20 and the lower surface 23.

Figure 29:
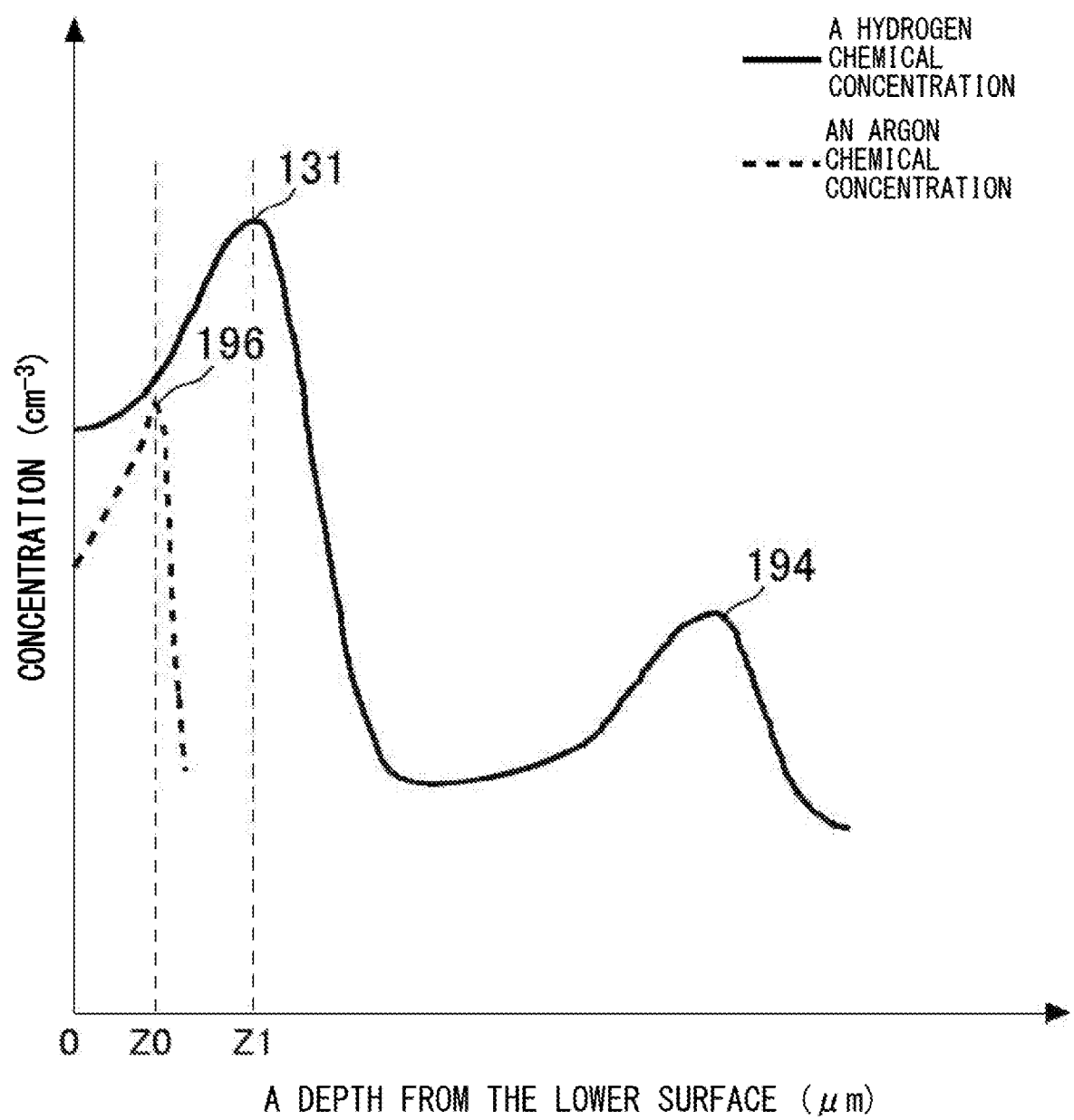
FIG. 29 shows an example of a hydrogen chemical concentration distribution and an argon chemical concentration distribution near a first hydrogen concentration peak 131.

FIG. 29 shows an example of a hydrogen chemical concentration distribution and an argon chemical concentration distribution near a first hydrogen concentration peak 131. In this example, the first hydrogen concentration peak 131 is a peak corresponding to the hydrogen implanted by plasma doping, and the hydrogen concentration peak 194 is a peak corresponding to the hydrogen implanted by other ways rather than the plasma doping.

In some cases, when hydrogen is implanted to the first depth position Z1 by plasma doping, impurities other than hydrogen may be implanted in the vicinity of the first depth position Z1. For example, in some cases, when argon gas is used for plasma excitation, argon may be implanted in the vicinity of the first depth position Z1. In FIG. 29, an argon concentration peak 196 is shown at a depth position Z0.

The depth position Z0 may be placed between the lower surface 23 and the first depth position Z1. Because argon is a heavier element than hydrogen, the argon concentration peak 196 tends to be formed at a position shallower than the first hydrogen concentration peak 131.

In this example, a peak of the argon chemical concentration is not provided between the first depth position Z1 and the second depth position Z2. Because the hydrogen concentration peak 194 at the second depth position Z2 is formed by a way other than the plasma doping, argon is not implanted in the vicinity of the hydrogen concentration peak 194. The argon chemical concentration between the first depth position Z1 and the second depth position Z2 is lower than the argon concentration peak 196. A maximum value of the argon chemical concentration between the first depth position Z1 and the second depth position Z2 may be smaller than or equal to a minimum value of the argon chemical concentration between the lower surface 23 and the first depth position Z1.

Depending on a composition of gas used for the plasma doping, other impurities instead of argon may be implanted to the semiconductor substrate 10. When $PH_3$ gas is used for the plasma doping, a phosphorous concentration peak may be provided between the lower surface 23 and the first depth position Z1. When $BF_3$ gas is used for the plasma doping, a fluorine concentration peak may be provided between the lower surface 23 and the first depth position Z1, or a boron concentration peak may be provided between the lower surface 23 and the first depth position Z1. A concentration value of a concentration peak of argon, phosphorous, fluorine or boron may be smaller than a concentration value of the first hydrogen concentration peak 131. A concentration value of the concentration peak of argon, phosphorous, fluorine or boron may be smaller than or equal to half a concentration value of the first hydrogen concentration peak 131, or may be smaller than or equal to one-tenth a concentration value of the first hydrogen concentration peak 131.

Figure 30:
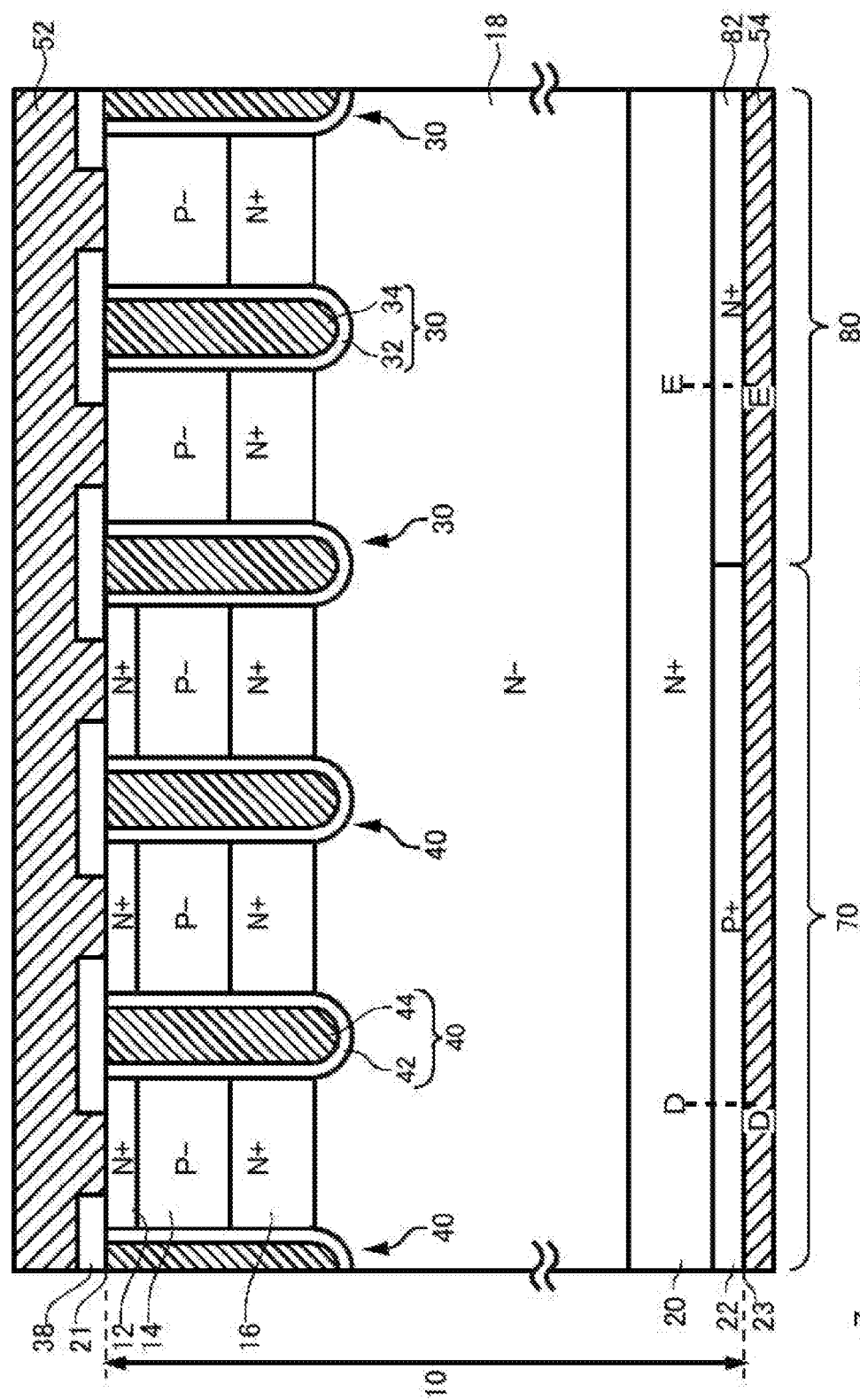
FIG. 30 is a diagram illustrating other examples of arrangement of a semiconductor device 100.

FIG. 30 is a diagram illustrating other examples of arrangement of a semiconductor device 100. The semiconductor device 100 of this example comprises the transistor section 70 and the diode section 80 as in the example shown in FIG. 11. Arrangement of the transistor section 70 is the same as that of the example shown in FIG. 6. The transistor section 70 and the diode section 80 are provided side by side in the x axis direction.

The diode section 80 of this example differs from a configuration of the transistor section 70 in that diode section 80 comprises the dummy trench sections 30 instead of the gate trench sections 40, the cathode region 82 instead of the collector region 22 and does not comprise the emitter regions 12. The other arrangement is similar to that of the transistor section 70.

The dummy trench section 30 may comprise the same arrangement as the gate trench section 40. The dummy trench section 30 comprises a dummy dielectric film 32 and a dummy conductive section 34. The dummy dielectric film 32 and the dummy conductive section 34 may comprise the same arrangement and the same material as those of the gate dielectric film 42 and the gate conductive section 44. However, it should be noted that the gate conductive section 44 is electrically connected to the gate electrode, but the dummy conductive section 34 is electrically connected to the emitter electrode 52. It should be noted that the dummy trench section 30 may also be provided in the transistor section 70. That is, a part of the gate trench section 40 in the transistor section 70 may be replaced by the dummy trench section 30.

The cathode region 82 is exposed on the lower surface 23 of the semiconductor substrate 10 as in the case for the collector region 22. The cathode region 82 is connected to the collector electrode 54 in the lower surface 23. The cathode region 82 is an N+ type region in which an N type impurity such as phosphorous is doped. The buffer region 20 may be provided between the cathode region 82 and the drift region 18.

Moreover, the base region 14 may be exposed on the upper surface 21 in the diode section 80. The base region 14 in the diode section 80 is electrically connected to the emitter electrode 52. According to such a configuration, the diode section 80 functions as a diode.

In this example, hydrogen is also implanted to the first depth position Z1 and the second depth position Z2 in the diode section 80. Moreover, the passage region similar to that in the transistor section 70 is also formed in the diode section 80. Each concentration distribution in the transistor section 70 may be the same as any of the aspects described with respect to FIGS. 1 to 29. A hydrogen chemical concentration distribution in the depth direction of the diode section 80 may be the same as the hydrogen chemical concentration distribution in the depth direction of the transistor section 70.

Figure 31:
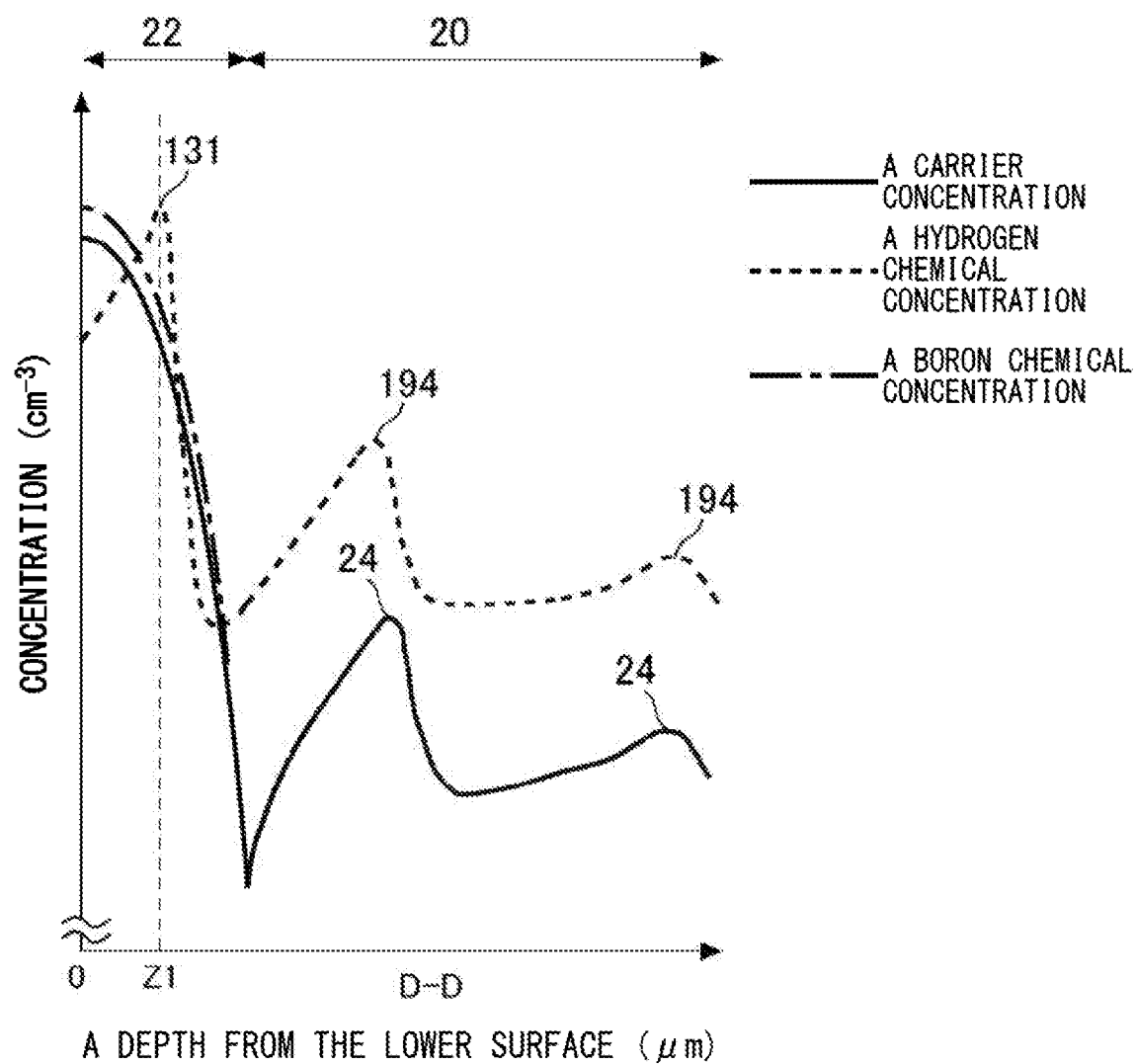
FIG. 31 shows an example of a carrier concentration distribution, a hydrogen chemical concentration distribution and a boron chemical concentration distribution along D-D line of FIG. 30.

FIG. 31 shows an example of a carrier concentration distribution, a hydrogen chemical concentration distribution and a boron chemical concentration distribution along D-D line of FIG. 30. The D-D line passes through the collector region 22 and part of the buffer region 20 in the transistor section 70. The collector region 22 of this example is formed by implanting boron. The boron of this example in the collector region 22 is implanted at a separate step from the hydrogen of the first hydrogen concentration peak 131. At least a portion of the boron in the collector region 22 may also be implanted by the plasma doping for implanting the hydrogen of the first hydrogen concentration peak 131.

The first hydrogen concentration peak 131 is placed in the buffer region 20 in the example of FIG. 7, etc. The first hydrogen concentration peak 131 of this example is placed in the cathode region 82 and the collector region 22. Because a doping concentration in the cathode region 82 and the collector region 22 is very high, changes in a shape of a carrier concentration distribution can be suppressed even when a high concentration of hydrogen donors are produced by providing the first hydrogen concentration peak 131 in the cathode region 82 and the collector region 22. This allows for easier suppression of impacts on characteristics of the semiconductor device 100.

A concentration of the first hydrogen concentration peak 131 is set such that the hydrogen donor concentration is amply lower than the carrier concentration at the first depth positon Z1. An activation ratio of hydrogen is substantially 1%. 1% of the hydrogen chemical concentration may be lower than the boron chemical concentration at the first depth position Z1.

Moreover, a peak position of the carrier concentration distribution in the collector region 22 is placed closer to a peak of the boron chemical concentration than the first hydrogen concentration peak 131. In the example of FIG. 31, the peak of the boron chemical concentration is placed at the lower surface 23. The peak position of the carrier concentration distribution in the collector region 22 may be the same as the peak position of the boron chemical concentration. The first hydrogen concentration peak 131 may be placed between the peak of the carrier concentration distribution in the collector region 22 and the buffer region 20. In this example, the peak position of the carrier concentration distribution in the collector region 22 matches to the lower surface 23. Note that in the buffer region 20, the depth position of the hydrogen concentration peak(s) 194 and the depth position of the peak(s) 24 of the carrier concentration distribution may match.

Figure 32:
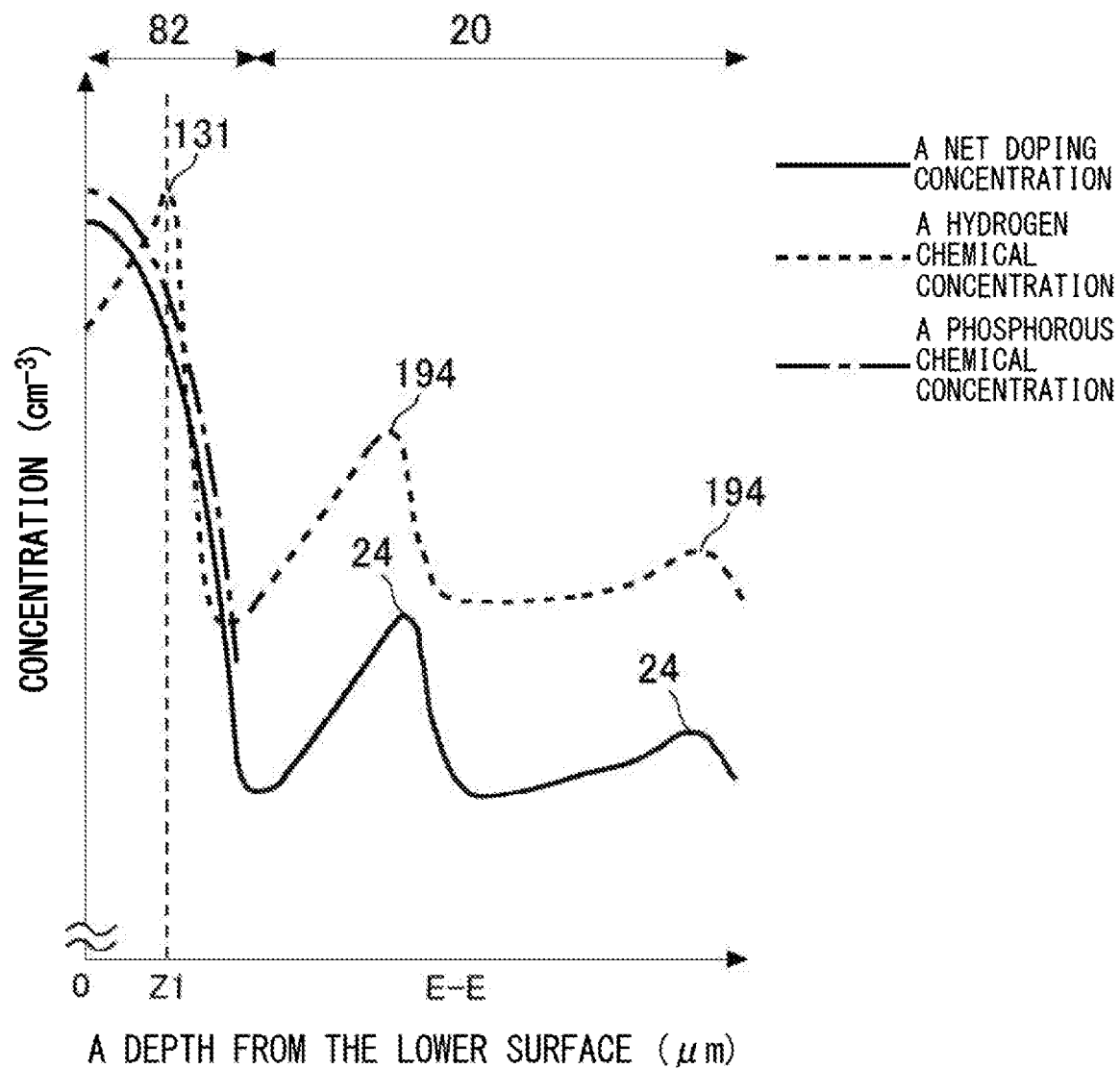
FIG. 32 shows an example of a carrier concentration distribution, a hydrogen chemical concentration distribution and a phosphorous chemical concentration distribution along E-E line of FIG. 30.

FIG. 32 shows an example of a carrier concentration distribution, a hydrogen chemical concentration distribution and a phosphorous chemical concentration distribution along E-E line of FIG. 30. The E-E line passes through the cathode region 82 and part of the buffer region 20 in the diode section 80. The cathode region 82 of this example is formed by implanting phosphorous. The phosphorous in the cathode region 82 is implanted at a separate step from the hydrogen of the first hydrogen concentration peak 131. At least a portion of the phosphorous in the cathode region 82 may be implanted by the plasma doping for implanting the hydrogen of the first hydrogen concentration peak 131.

The first hydrogen concentration peak 131 of this example is placed in the cathode region 82 and the collector region 22. A concentration of the first hydrogen concentration peak 131 is set such that the hydrogen donor concentration is amply lower than the carrier concentration at the first depth Z1. An activation ratio of hydrogen is substantially 1%. 1% of the hydrogen chemical concentration may be lower than the phosphorous chemical concentration at the first depth Z1.

Moreover, a peak position of the carrier concentration distribution in the cathode region 82 is placed closer to a peak of the phosphorous chemical concentration than the first hydrogen concentration peak 131. In the example of FIG. 32, the peak of the phosphorous chemical concentration is placed at the lower surface 23. The peak position of the carrier concentration distribution in the cathode region 82 may be the same as the peak position of the phosphorous chemical concentration. The first hydrogen concentration peak 131 may be placed between the peak of the carrier concentration distribution in the cathode region 82 and the buffer region 20. In this example, the peak position of the carrier concentration distribution in the cathode region 82 matches to the lower surface 23. Note that in the buffer region 20, the depth position of the hydrogen concentration peak(s) 194 and the depth position of the peak(s) 24 of the carrier concentration distribution may match.

Figure 33:
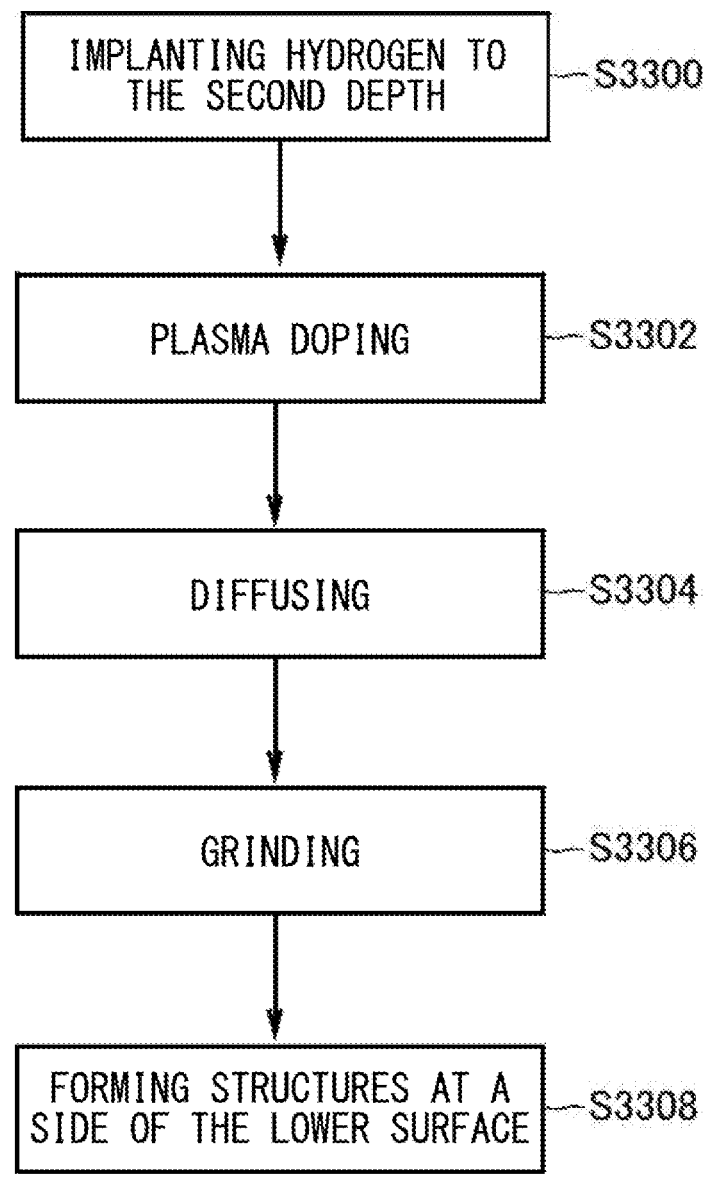
FIG. 33 is a flow diagram illustrating part of a method of manufacturing a semiconductor device 100.

FIG. 33 is a flow diagram illustrating part of a method of manufacturing a semiconductor device 100. Prior to steps shown in FIG. 33, structures such as the respective trench sections, the emitter regions 12, the base regions 14, and the accumulation region 16 at a side of the upper surface 21 may be formed.

In this example, at an implanting step S3300, hydrogen ions are implanted to the second depth Z2 from the lower surface 23 of the semiconductor substrate 10. The implanting step S3300 may be the same as the second implanting step S1902 in the example of FIG. 19.

In addition, at an implanting step S3302, hydrogen ions are implanted to the first depth Z1 from the lower surface 23 of the semiconductor substrate 10. At the implanting step S3302, hydrogen ions are implanted by the plasma doping. A dose of hydrogen at the implanting step S3302 may be the same as the dose of hydrogen at the first implanting step S1900 in the example of FIG. 19. Either the implanting step S3300 or the implanting step S3302 may be performed first.

After the implanting step S3300 and the implanting step S3302, a diffusing step S3304 is performed. The diffusing step S3304 is similar to the diffusing step S1904 in the example of FIG. 19. At the diffusing step S3304, the hydrogen is diffused to result in bonding of a crystal defect and hydrogen in the passage region 106 then to be a donor. In this way, a donor concentration in the passage region 106 can be increased.

After the diffusing step S3304, a grinding step S3306 is performed. At the grinding step S3306, a side of the lower surface 23 of the semiconductor substrate 10 is ground by chemical mechanical polishing (CMP), etc. At the grinding step S3306, a range shallower than the first depth Z1 may be ground, or a range deeper than the first depth Z1 may be ground. This can grind areas in which a high concentration of hydrogen is distributed, thus an amount of hydrogen near the lower surface 23 can be reduced.

After the grinding step S3306, structures such as the collector region 22, the cathode region 82 and the buffer region 20 at a side of the lower surface 23 are formed at a step of forming structures at a side of a lower surface S3308. At the step of forming structures at a side of a lower surface S3308, laser annealing may be performed in the vicinity of the lower surface 23 after implanting dopants to the cathode region 82 and the buffer region 20. This can perform a thermal treatment locally in the vicinity of the lower surface 23 of the semiconductor substrate 10 at a high temperature. Also, dopants such as hydrogen may be implanted to the buffer region 20 after the laser annealing. After implanting the dopants to the buffer region 20, the whole semiconductor substrate 10 may be applied heat treatment in an annealing furnace.

Figure 34:
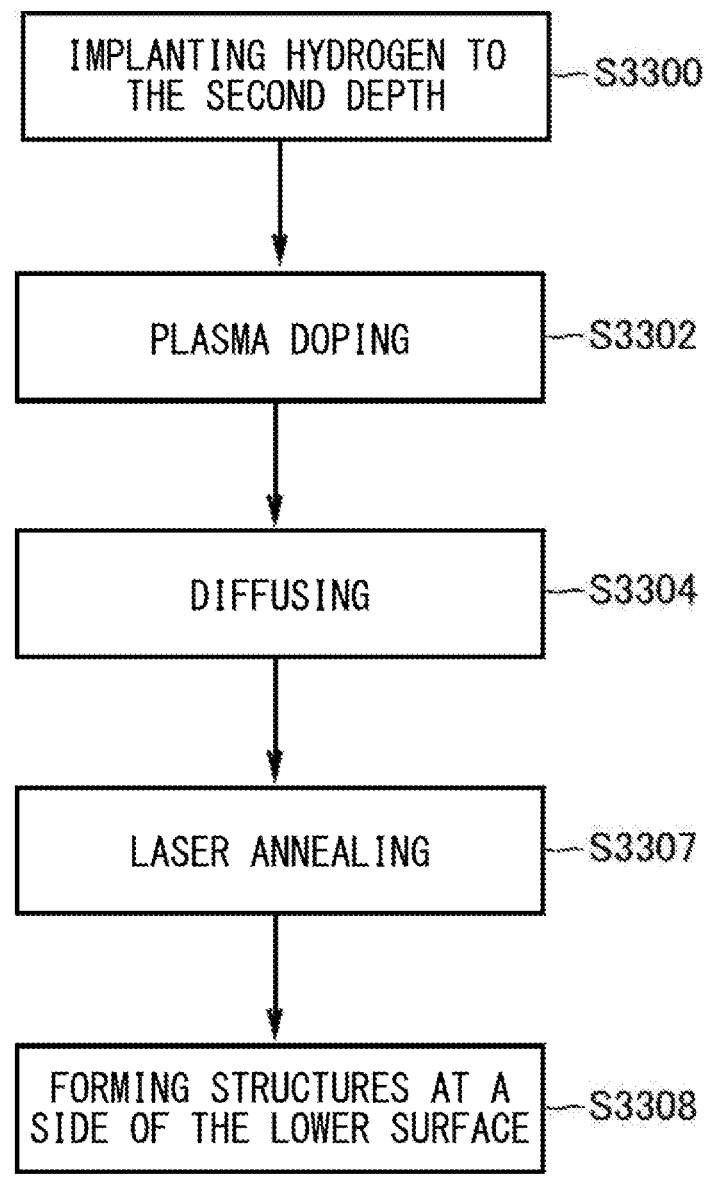
FIG. 34 is a flow diagram illustrating part of a method of manufacturing a semiconductor device 100.

FIG. 34 is a flow diagram illustrating part of a method of manufacturing a semiconductor device 100. The method of manufacturing of this example differs in that the method comprises a laser annealing step S3307 instead of the grinding step S3306 of FIG. 33. The other steps are the same as those of the example of FIG. 33.

At the laser annealing step S3307, the lower surface 23 of the semiconductor substrate 10 is laser annealed. At the laser annealing step S3307, laser may be irradiated near at the first depth Z1. This can emit at least a portion of the hydrogen near at the first depth Z1 out of the semiconductor substrate 10. This can reduce the hydrogen chemical concentration at near the first depth Z1. At the laser annealing step S3307, laser may be irradiated such that the first hydrogen concentration peak 131 remains or laser may be irradiated such that the first hydrogen concentration peak 131 does not remain. Note that heavy elements such as argon tend to remain in the semiconductor substrate 10 compared to hydrogen even if laser is irradiated. As such, in some cases, even if the laser annealing step S3307 is performed, a concentration peak of an impurity such as argon shown in FIG. 29 may be present in the semiconductor substrate 10.

Furthermore, at the laser annealing step S3307, laser may be irradiated to the transistor section 70 and may not be irradiated to the diode section 80. If a high concentration of hydrogen donors remains at the lower surface 23 of the diode section 80, its impact on characteristics is relatively small. In this case, a hydrogen chemical concentration at the first depth Z1 in the diode section 80 is higher than a hydrogen chemical concentration at the first depth Z1 in the transistor section 70.

In the examples shown in FIGS. 19, 33, and 34, the hydrogen ion implantation to the first depth Z1 and the second depth Z2 and the thermal treatment may be performed before, after, or during forming the structures at a side of the lower surface.

Figure 35:
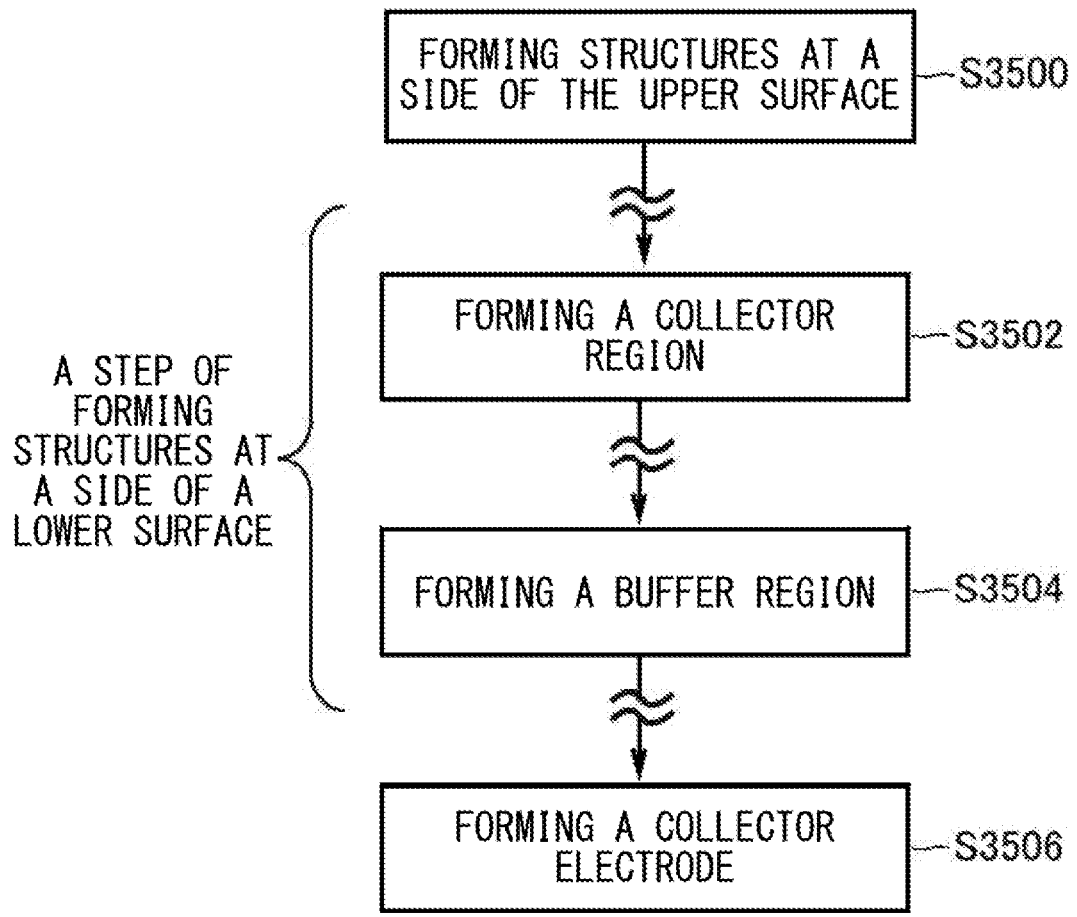
FIG. 35 shows an example flow of implanting hydrogen ions to a first depth Z1 and a second depth Z2 at a step of forming structures at a side of a lower surface.

FIG. 35 shows an example flow of implanting hydrogen ions to a first depth Z1 and a second depth Z2 at a step of forming structures at a side of a lower surface. In this example, the hydrogen ion implantation to the first depth Z1 and the second depth Z2 and the thermal treatment are performed at a step of forming a buffer region S3504 for forming the buffer region 20.

The step of forming structures at a side of a lower surface may be performed after a step of forming structures at a side of an upper surface S3500 such as the trench section. The step of forming structures at a side of a lower surface comprises a step of forming a collector region S3502 and a step of forming a buffer region S3504. In FIG. 35, the other steps are omitted in the step of forming structures at a side of a lower surface. In this example, at the step of forming a buffer region S3504, hydrogen ions are implanted to a plurality of positions including the first depth Z1 and the second depth Z2. At S3504, the semiconductor substrate 10 is applied heat treatment to diffuse the hydrogen ions after implanting the hydrogen ions. After the step of forming structures at a side of a lower surface, a step of forming a collector electrode S3506 may be performed.

Figure 36:
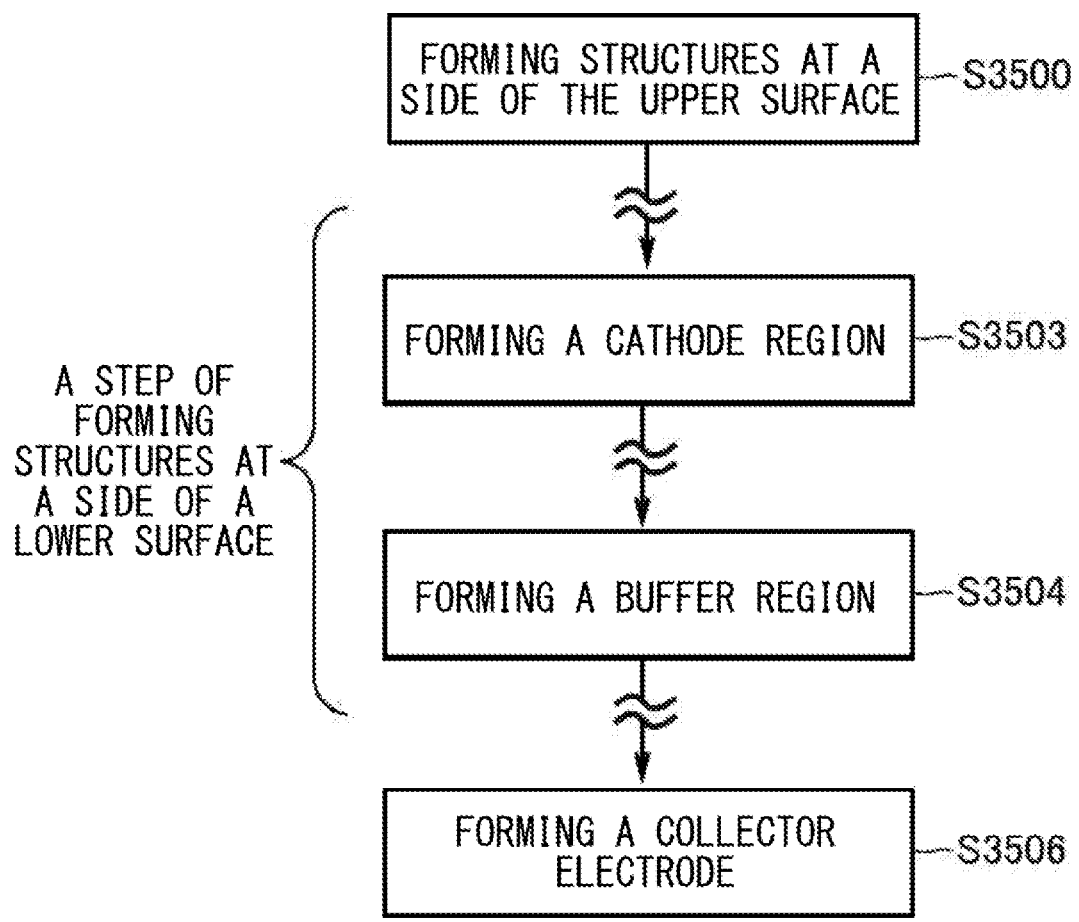
FIG. 36 shows another example flow of implanting hydrogen ions to a first depth Z1 and a second depth Z2 at a step of forming structures at a side of a lower surface.

FIG. 36 shows another example flow of implanting hydrogen ions to a first depth Z1 and a second depth Z2 at the step of forming structures at a side of a lower surface. In this example, the hydrogen ion implantation to the first depth Z1 and the thermal treatment are performed at a step of forming a cathode region S3503. Also, the hydrogen ion implantation to the second depth Z2 and the thermal treatment is performed at the step of forming a buffer region S3506.

The step of forming structures at a side of a lower surface may be performed after the step of forming structures at a side of an upper surface S3500 such as the trench section. The step of forming structures at a side of a lower surface of this example comprises the step of forming a cathode region S3503 and the step of forming a buffer region S3504. In FIG. 36, the other steps are omitted in the step of forming structures at a side of a lower surface.

The semiconductor device 100 of this example may comprise the transistor section 70 and the diode section 80. In this case, after forming the cathode region 82 on the entire lower surface 23, P type collector regions 22 may be formed in portions of the cathode regions 82*by* selectively implanting P type dopants. At the step of forming a cathode region S3503, raw material gas such as $PH_3$ including N type dopants such as phosphorous may be used. At the step of forming a cathode region S3503, in the entire lower surface 23, hydrogen ions are implanted to the first depth Z1.

Also, after selectively forming the collector regions 22 on the lower surface 23, the cathode regions 82 may be formed by implanting N type dopants and hydrogen ions to the entire lower surface 23. In this case, in order for a conductivity type not to invert to an N type, a high concentration of P type dopants may be implanted in the collector region 22 in advance. According to such a flow, the first depth Z1 is placed in the collector region 22 and the cathode region 82.

Note that when the semiconductor device 100 comprises not the transistor section 70 but the diode section 80, the step of forming the collector region 22 can be omitted. Also, the hydrogen implantation to the second depth Z2 may be performed at the step of forming the buffer region 20. After the step of forming structures at a side of a lower surface, a step of forming a collector electrode S3506 may be performed.

While the present invention has been described through the embodiments, the technical scope of the invention is not limited to the scope of the above described embodiments. It is apparent to those skilled in the art that various alterations or improvements can be added to the above-described embodiments. It is also apparent from the claims that such alternations or improvements shall fall in the technical scope of the invention.

It should be noted that the operations, procedures, steps, and stages of each process performed by an apparatus, system, program, and method shown in the claims, embodiments, or drawings can be performed in any order as long as the order is not indicated by "prior to," "before," or the like and as long as the output from a previous process is not used in a later process. Even if process flows are described using phrases such as "first" or "next" in the claims, embodiments, or drawings for convenience, it does not necessarily mean that they must be performed in this order.

EXPLANATION OF REFERENCES

10: A Semiconductor Substrate, 11: A Well Region, 12: An Emitter Region, 14: A Base Region, 15: A Contact Region, 16: An Accumulation Region, 18: A Drift Region, 20: A Buffer Region, 21: An Upper Surface, 22: A Collector Region, 23: A Lower Surface, 24, 25: Peaks, 30: A Dummy Trench Section, 32: A Dummy Dielectric Film, 34: A Dummy Conductive Section, 38: An Interlayer Dielectric Film, 40: A Gate Trench Section, 42: A Gate Dielectric Film, 44: A Gate Conductive Section, 48: A Gate Runner, 50: A Gate Metal Layer, 52: An Emitter Electrode, 54: A Collector Electrode, 70: A Transistor Section, 72: A Boundary Section, 80: A Diode Section, 82: A Cathode Region, 90: An Edge Termination Structure Section, 92: A Guard Ring, 94: A Field Plate, 100: A Semiconductor Device, 106: A Passage Region, 111: A First Donor Concentration Peak, 112, 122, 132, 142, 172: An Upward Slope, 113, 123, 133, 143, 173: A Downward Slope, 114, 124, 125, 134, 144, 145: A Gradient, 116: A Gate Pad, 118: An Emitter Pad, 120: An Active Section, 121: A Second Donor Concentration Peak, 131: A First Hydrogen Concentration Peak, 140: An Outer Edge, 141: A Second Hydrogen Concentration Peak, 150: A Flat Region, 151: A Valley, 161: A First Example, 162: A Second Example, 163: A Third Example, 171: A Vacancy Concentration Peak, 174: A Channel Stopper, 175: A Vacancy Defect Concentration Distribution, 180: A Base Doped Region, 181: A Non-Doped Region, 182: A Protective Film, 184: A Plating Layer, 190: A Middle Boundary Region, 192: A Lifetime Control Region, 194: A Hydrogen Concentration Peak, 196: An Argon Concentration Peak, 200: A Photoresist Film

What is claimed is:

1. A semiconductor device comprising a semiconductor substrate including an upper surface and a lower surface,
wherein a hydrogen concentration distribution has a first hydrogen concentration peak and a second hydrogen concentration peak and a donor concentration distribution has a first donor concentration peak and a second donor concentration peak in a depth direction of the semiconductor substrate connecting the upper surface and the lower surface,
wherein the first hydrogen concentration peak and the first donor concentration peak are placed at a first depth and the second hydrogen concentration peak and the second donor concentration peak are placed at a second depth deeper than the first depth relative to the lower surface,
wherein each concentration peak comprises an upward slope in which a concentration value increases from the lower surface in the direction of the upper surface,
wherein a value in which a gradient of the upward slope of the second donor concentration peak is standardized by a gradient of the upward slope of the second hydrogen concentration peak is smaller than a value in which a gradient of the upward slope of the first donor concentration peak is standardized by a gradient of the upward slope of the first hydrogen concentration peak.

2. The semiconductor device of claim 1, wherein each concentration peak comprises a downward slope in which a concentration value decreases from the lower surface in the direction of the upper surface,
wherein at the second hydrogen concentration peak, a gradient of the upward slope is smaller than a gradient of the downward slope.

3. The semiconductor device of claim 1, wherein each concentration peak comprises a downward slope in which a concentration value decreases from the lower surface in the direction of the upper surface,
wherein at the second donor concentration peak, a gradient of the upward slope is smaller than a gradient of the downward slope.

4. The semiconductor device of claim 1, wherein the donor concentration distribution between the first depth and the second depth comprises a flat region in which a donor concentration is substantially constant,
wherein a length of the flat region in the depth direction is 10% or more of a thickness of the semiconductor substrate in the depth direction.

5. The semiconductor device of claim 4, wherein a minimum value of the donor concentration in the flat region is larger a donor concentration of the semiconductor substrate.

6. The semiconductor device of claim 5, wherein a minimum value of a donor concentration between the first depth and the second depth is larger than a donor concentration of the semiconductor substrate.

7. The semiconductor device of claim 1, wherein the donor concentration distribution between the first depth and the second depth comprises a flat region in which a donor concentration is substantially constant,
wherein a length of the flat region in the depth direction is 10 pin or more.

8. The semiconductor device of claim 1, wherein a concentration value of the second hydrogen concentration peak is smaller than a concentration value of the first hydrogen concentration peak.

9. The semiconductor device of claim 1, further comprising:
a drift region of N type conductivity provided on the semiconductor substrate;
an emitter region of N type conductivity provided in contact with the upper surface in the semiconductor substrate, wherein the emitter region includes a higher donor concentration than the drift region;
a base region of P type conductivity provided between the emitter region and the drift region;
a collector region of P type conductivity provided in contact with the lower surface in the semiconductor substrate; and
a buffer region of N type conductivity provided between the collector region and the drift region, wherein the buffer region has one or more donor concentration peaks whose donor concentration is higher than the drift region,
wherein the first donor concentration peak is the donor concentration peak in the buffer region.

10. The semiconductor device of claim 9, further comprising an accumulation region provided between the base region and the drift region, wherein the accumulation region has one or more donor concentration peaks whose donor concentration is higher than the drift region,
wherein the second donor concentration peak is the donor concentration peak in the accumulation region.

11. The semiconductor device of claim 10, wherein the accumulation region has the donor concentration peak of a donor other than hydrogen in addition to the second donor concentration peak.

12. The semiconductor device of claim 9, further comprising an accumulation region provided between the base region and the drift region, wherein the accumulation region has one or more donor concentration peaks whose donor concentration is higher than the drift region,
wherein the second donor concentration peak is placed between the buffer region and the accumulation region.

13. The semiconductor device of claim 1, further comprising a gate trench section provided on the upper surface of the semiconductor substrate, wherein the second donor concentration peak is placed between a bottom of the gate trench section and the upper surface of the semiconductor substrate.

14. The semiconductor device of claim 1, further comprising:
an active section provided in the semiconductor substrate; and
an edge termination structure section provided such that it encloses the active section in a top view of the semiconductor substrate;
wherein the semiconductor substrate comprises a passage region in which hydrogen implanted to a position of the second hydrogen concentration peak passed through,
wherein the passage region provided in the edge termination structure section is shorter in the depth direction than the passage region provided in the active section, or the passage region is not provided in the edge termination structure section.

15. The semiconductor device of claim 1, further comprising a transistor section and a diode section provided on the semiconductor substrate,
wherein the semiconductor substrate comprises a passage region in which hydrogen implanted to a position of the second hydrogen concentration peak passed through,
wherein the passage region provided in the diode section is shorter in the depth direction than the passage region provided in the transistor section, or the passage region is not provided in the diode section.

16. The semiconductor device of claim 1, further comprising a transistor section and a diode section provided on the semiconductor substrate,
wherein the semiconductor substrate comprises a passage region in which hydrogen implanted to a position of the second hydrogen concentration peak passed through,
wherein the passage region provided in the transistor section is shorter in the depth direction than the passage region provided in the diode section, or the passage region is not provided in the transistor section.

17. The semiconductor device of claim 1, wherein the first depth is included within a range of 5 μm or less from the lower surface in the depth direction.

18. The semiconductor device of claim 17, wherein a donor concentration at the first hydrogen concentration peak is between $1\times10^{15}$/cm$^3$ and $1\times10^{17}$ cm$^3$.

19. A method of manufacturing the semiconductor device of claim 1, comprising:
firstly implanting hydrogen to the first depth from the lower surface of the semiconductor substrate;
secondly implanting hydrogen to the second depth from the lower surface of the semiconductor substrate to form a passage region in which the hydrogen passes through; and
diffusing the hydrogen implanted to the first depth into the passage region by applying heat treatment of the semiconductor substrate,
wherein a dose of hydrogen at the firstly implanting is determined such that in the semiconductor substrate which is applied heat treatment at the diffusing, a minimum value of a donor concentration in the passage region is larger than a donor concentration of the semiconductor substrate before the hydrogen is implanted.

20. The method of claim 19, wherein at the firstly implanting, at least a minimum dose of hydrogen which is determined by a diffusion coefficient of hydrogen in the semiconductor substrate and the second depth is implanted.

21. The method of claim 19, wherein the semiconductor substrate is a silicon substrate,
wherein assuming the second depth from the lower surface being x (μm), a dose of hydrogen Q (ions/cm$^2$) at the firstly implanting meets $Q \geq 2.6186\times10^{10}\times e^{0.12412x}$.

22. The method of claim 19, wherein at the firstly implanting, hydrogen is implanted to the first depth by plasma doping.

23. The method of claim 22, wherein the lower surface of the semiconductor substrate is ground after the plasma doping.

24. The method of claim 22, wherein the lower surface of the semiconductor substrate is laser annealed after the plasma doping.

25. A semiconductor device comprising a semiconductor substrate including an upper surface and a lower surface,
wherein a hydrogen concentration distribution in a depth direction connecting the upper surface and the lower surface of the semiconductor substrate has a first hydrogen concentration peak placed within a range of 5 μm or less from the lower surface in the depth direction and a second hydrogen concentration peak placed closer to the upper surface than the first hydrogen concentration peak.

26. The semiconductor device of claim 25, wherein the semiconductor substrate has an impurity concentration peak between the lower surface and the first hydrogen concentration peak,
wherein an impurity of the impurity concentration peak is argon or fluorine.

* * * * *